United States Patent
Baum et al.

(10) Patent No.: US 11,461,615 B2
(45) Date of Patent: Oct. 4, 2022

(54) SYSTEM AND METHOD OF MEMORY ACCESS OF MULTI-DIMENSIONAL DATA

(71) Applicant: Hailo Technologies Ltd., Tel-Aviv (IL)

(72) Inventors: Avi Baum, Givat Shmuel (IL); Or Danon, Kiryat Ono (IL)

(73) Assignee: Hailo Technologies Ltd.

( * ) Notice: Subject to any disclaimer, the term of this patent is extended or adjusted under 35 U.S.C. 154(b) by 1220 days.

(21) Appl. No.: 15/943,992

(22) Filed: Apr. 3, 2018

(65) Prior Publication Data

US 2018/0285254 A1 Oct. 4, 2018

Related U.S. Application Data

(60) Provisional application No. 62/531,372, filed on Jul. 12, 2017, provisional application No. 62/481,492, filed on Apr. 4, 2017.

(51) Int. Cl.
*G06F 12/00* (2006.01)
*G06N 3/04* (2006.01)
(Continued)

(52) U.S. Cl.
CPC .......... *G06N 3/04* (2013.01); *G06F 5/01* (2013.01); *G06F 7/501* (2013.01); *G06F 7/523* (2013.01);
(Continued)

(58) Field of Classification Search
None
See application file for complete search history.

(56) References Cited

U.S. PATENT DOCUMENTS

| 4,450,533 A | 5/1984 | Petit |
| 4,943,931 A | 7/1990 | Allen |

(Continued)

FOREIGN PATENT DOCUMENTS

| CA | 2019099 A1 | 12/1990 |
| CA | 2002681 A1 | 5/1991 |

(Continued)

OTHER PUBLICATIONS

Zhu et al., "Flow-Guided Feature Aggregation for Video Object Detection", Arxiv Technology Report, arXiv:1703.10025v2 [cs.CV], Aug. 2017.

(Continued)

*Primary Examiner* — Midys Rojas
(74) *Attorney, Agent, or Firm* — Zaretsky Group PC; Howard Zaretsky

(57) ABSTRACT

A novel and useful system and method of accessing multi-dimensional data in memory. The invention is applicable to neural network (NN) processing engines adapted to implement artificial neural networks (ANNs). The NN processor is constructed from self-contained computational units organized in a hierarchical architecture. The homogeneity enables simpler management and control of similar computational units, aggregated in multiple levels of hierarchy. Computational units are designed with minimal overhead as possible, where additional features and capabilities are aggregated at higher levels in the hierarchy. On-chip memory provides storage for content inherently required for basic operation at a particular hierarchy and is coupled with the computational resources in an optimal ratio. Lean control provides just enough signaling to manage only the operations required at a particular hierarchical level. Dynamic resource assignment agility is provided which can (Continued)

be adjusted as required depending on resource availability and capacity of the device.

18 Claims, 32 Drawing Sheets

(51) Int. Cl.

| | |
|---|---|
| *G06F 12/02* | (2006.01) |
| *G06N 3/063* | (2006.01) |
| *G06F 12/06* | (2006.01) |
| *G06N 20/00* | (2019.01) |
| *G06F 30/30* | (2020.01) |
| *G06F 30/27* | (2020.01) |
| *G06V 10/40* | (2022.01) |
| *G06F 7/501* | (2006.01) |
| *G06F 7/523* | (2006.01) |
| *G06F 9/50* | (2006.01) |
| *G06F 17/10* | (2006.01) |
| *G06F 5/01* | (2006.01) |
| *G06N 3/08* | (2006.01) |
| *G06F 13/16* | (2006.01) |
| *G06F 9/30* | (2018.01) |
| *G06K 9/62* | (2022.01) |
| *G06N 3/02* | (2006.01) |

(52) U.S. Cl.
CPC ........ *G06F 9/30054* (2013.01); *G06F 9/5016* (2013.01); *G06F 9/5027* (2013.01); *G06F 12/02* (2013.01); *G06F 12/0207* (2013.01); *G06F 12/0646* (2013.01); *G06F 12/0692* (2013.01); *G06F 13/1663* (2013.01); *G06F 17/10* (2013.01); *G06F 30/27* (2020.01); *G06F 30/30* (2020.01); *G06K 9/62* (2013.01); *G06N 3/02* (2013.01); *G06N 3/0454* (2013.01); *G06N 3/063* (2013.01); *G06N 3/08* (2013.01); *G06N 3/084* (2013.01); *G06N 20/00* (2019.01); *G06V 10/40* (2022.01); *G06N 3/082* (2013.01); *Y02D 10/00* (2018.01)

(56) References Cited

U.S. PATENT DOCUMENTS

| | | | |
|---|---|---|---|
| 4,979,124 | A | 12/1990 | Sachse et al. |
| 4,994,982 | A | 2/1991 | Duranton et al. |
| 5,003,490 | A | 3/1991 | Castelaz et al. |
| 5,008,833 | A | 4/1991 | Agranat et al. |
| 5,014,235 | A | 5/1991 | Morton |
| 5,056,037 | A | 10/1991 | Eberhardt |
| 5,080,464 | A | 1/1992 | Toyoda |
| 5,091,864 | A | 2/1992 | Baji et al. |
| 5,148,515 | A | 9/1992 | Vassiliadis et al. |
| 5,195,169 | A | 3/1993 | Kamiya et al. |
| 5,195,170 | A | 3/1993 | Eberhardt |
| 5,257,358 | A | 10/1993 | Cohen |
| 5,274,743 | A | 12/1993 | Imondi et al. |
| 5,278,945 | A | 1/1994 | Basehore et al. |
| 5,293,456 | A | 3/1994 | Guez et al. |
| 5,293,459 | A | 3/1994 | Duranton et al. |
| 5,297,232 | A | 3/1994 | Murphy |
| 5,365,460 | A | 11/1994 | Chung |
| 5,367,612 | A | 11/1994 | Bozich et al. |
| 5,408,645 | A | 4/1995 | Ikeda et al. |
| 5,423,001 | A | 6/1995 | Ueda |
| 5,430,830 | A | 7/1995 | Frank et al. |
| 5,444,822 | A | 8/1995 | Shinohara |
| 5,448,681 | A | 9/1995 | Khan |
| 5,450,315 | A | 9/1995 | Stefanski |
| 5,465,204 | A | 11/1995 | Sekine et al. |
| 5,479,579 | A | 12/1995 | Duong et al. |
| 5,485,545 | A | 1/1996 | Kojima et al. |
| 5,486,996 | A | 1/1996 | Samad et al. |
| 5,493,631 | A | 2/1996 | Huang et al. |
| 5,504,839 | A | 4/1996 | Mobus |
| 5,519,811 | A | 5/1996 | Yoneda et al. |
| 5,521,985 | A | 5/1996 | Camp, Jr. et al. |
| 5,533,383 | A | 7/1996 | Greene et al. |
| 5,537,513 | A | 7/1996 | DeVille |
| 5,583,771 | A | 12/1996 | Lynch et al. |
| 5,615,305 | A | 3/1997 | Nunally |
| 5,627,943 | A | 5/1997 | Yoneda et al. |
| 5,689,622 | A | 11/1997 | Higashino et al. |
| 5,704,016 | A | 12/1997 | Shigematsu et al. |
| 5,705,956 | A | 1/1998 | Neely |
| 5,717,832 | A | 2/1998 | Steimle et al. |
| 5,740,325 | A | 4/1998 | Wang |
| 5,745,652 | A | 4/1998 | Bigus |
| 5,748,849 | A | 5/1998 | Gobert |
| 5,796,925 | A | 8/1998 | Deville |
| 5,944,841 | A | 8/1999 | Christie |
| 5,956,703 | A | 9/1999 | Turner et al. |
| 5,978,782 | A | 11/1999 | Neely |
| 6,267,298 | B1 | 7/2001 | Campbell |
| 6,317,658 | B1 | 11/2001 | Vian |
| 6,326,912 | B1 | 12/2001 | Fujimori |
| 6,366,236 | B1 | 4/2002 | Farmer et al. |
| 6,421,359 | B1 | 7/2002 | Bennett et al. |
| 6,434,541 | B1 | 8/2002 | Tawel et al. |
| 6,446,238 | B1 | 9/2002 | Canestaro et al. |
| 6,493,689 | B2 | 12/2002 | Kotoulas et al. |
| 6,523,018 | B1 | 2/2003 | Louis et al. |
| 6,529,614 | B1 | 3/2003 | Chao et al. |
| 6,539,368 | B1 | 3/2003 | Chernikov et al. |
| 6,542,985 | B1 | 4/2003 | Johnson et al. |
| 6,567,953 | B1 | 5/2003 | Pomerantz |
| 6,578,020 | B1 | 6/2003 | Nguyen |
| 6,622,125 | B1 | 9/2003 | Cragun et al. |
| 6,629,089 | B1 | 9/2003 | Supino |
| 6,665,813 | B1 | 12/2003 | Forsman et al. |
| 6,671,832 | B1 | 12/2003 | Apisdorf |
| 6,751,529 | B1 | 6/2004 | Fouche |
| 6,836,767 | B2 | 12/2004 | McBride |
| 6,882,992 | B1 | 4/2005 | Werbos |
| 7,069,256 | B1 | 6/2006 | Campos |
| 7,082,419 | B1 | 7/2006 | Lightowler |
| 7,113,970 | B2 | 9/2006 | Chiueh |
| 7,117,045 | B2 | 10/2006 | Hittie et al. |
| 7,174,325 | B1 | 2/2007 | Ascoli |
| 7,302,619 | B1 | 11/2007 | Tompkins et al. |
| 7,308,322 | B1 | 12/2007 | Discenzo et al. |
| 7,647,284 | B2 | 1/2010 | Prokhorov |
| 8,081,816 | B1 | 12/2011 | Irick et al. |
| 8,126,828 | B2 | 2/2012 | Snook et al. |
| 8,131,659 | B2 | 3/2012 | Xu et al. |
| 8,145,983 | B1 | 3/2012 | Chaichanavong |
| 8,321,769 | B1 | 11/2012 | Yeo |
| 8,326,782 | B2 | 12/2012 | Snook et al. |
| 8,391,306 | B2 | 3/2013 | Ito et al. |
| 8,745,466 | B2 | 6/2014 | Kaynak |
| 8,892,485 | B2 | 11/2014 | Aparin et al. |
| 8,996,350 | B1 | 3/2015 | Dub |
| 8,996,967 | B2 | 3/2015 | Kaynak |
| 9,014,181 | B2 | 4/2015 | Lakshman et al. |
| 9,077,491 | B2 | 7/2015 | Mar et al. |
| 9,129,220 | B2 | 9/2015 | Aparin et al. |
| 9,129,222 | B2 | 9/2015 | Aparin |
| 9,153,230 | B2 | 10/2015 | Maaninen |
| 9,159,020 | B2 | 10/2015 | Rivera et al. |
| 9,195,656 | B2 | 11/2015 | Fructuoso et al. |
| 9,306,965 | B1 | 4/2016 | Grossman et al. |
| 9,400,954 | B2 | 7/2016 | Modha |
| 9,466,022 | B2 | 10/2016 | Rivera et al. |
| 9,477,925 | B2 | 10/2016 | Seide et al. |
| 9,530,092 | B2 | 12/2016 | Chatterjee et al. |
| 9,542,642 | B2 | 1/2017 | Wood |
| 9,542,643 | B2 | 1/2017 | Levin et al. |
| 9,558,444 | B2 | 1/2017 | Palmer et al. |
| 960,721 | A1 | 3/2017 | Cetintas et al. |
| 9,607,217 | B2 | 3/2017 | Cetintas et al. |
| 10,019,470 | B2 | 7/2018 | Birdwell et al. |

(56) References Cited

U.S. PATENT DOCUMENTS

| | | |
|---|---|---|
| 10,073,816 B1 | 9/2018 | Lu et al. |
| 10,417,089 B2 | 9/2019 | Oboukhov |
| 10,430,706 B2 | 10/2019 | Henry et al. |
| 10,699,189 B2 | 6/2020 | Lie et al. |
| 10,789,734 B2 | 9/2020 | Pan et al. |
| 10,936,569 B1 | 3/2021 | Baskaran et al. |
| 2002/0112204 A1 | 8/2002 | Biskup et al. |
| 2002/0184556 A1 | 12/2002 | Hashemi |
| 2003/0069516 A1 | 4/2003 | Becker et al. |
| 2003/0115537 A1 | 6/2003 | Boyer et al. |
| 2004/0167418 A1 | 8/2004 | Nguyen et al. |
| 2005/0193357 A1 | 9/2005 | Honary et al. |
| 2005/0256420 A1 | 11/2005 | Noman et al. |
| 2006/0015703 A1 | 1/2006 | Ramchandran |
| 2006/0085558 A1 | 4/2006 | Solomon |
| 2006/0167784 A1 | 7/2006 | Hoffberg |
| 2007/0266277 A1 | 11/2007 | Oyamada |
| 2008/0117220 A1 | 5/2008 | Gorchetchnikov et al. |
| 2009/0276666 A1 | 11/2009 | Haley et al. |
| 2010/0100514 A1 | 4/2010 | Raymond et al. |
| 2010/0205399 A1 | 8/2010 | Bean et al. |
| 2010/0235686 A1* | 9/2010 | Sato .................. G06F 11/3636 714/45 |
| 2010/0313104 A1 | 12/2010 | Bommena et al. |
| 2010/0317420 A1 | 12/2010 | Hoffberg |
| 2011/0041013 A1 | 2/2011 | Ingimundarson |
| 2012/0179898 A1 | 7/2012 | Betouin et al. |
| 2013/0079842 A1 | 3/2013 | Mokelke et al. |
| 2013/0254892 A1 | 9/2013 | Kaufman |
| 2014/0032457 A1 | 1/2014 | Palmer et al. |
| 2014/0156576 A1 | 6/2014 | Nugent |
| 2014/0344203 A1 | 11/2014 | Ahn |
| 2015/0026104 A1 | 1/2015 | Tambos |
| 2015/0081753 A1 | 3/2015 | Srinivasan |
| 2015/0106311 A1 | 4/2015 | Birdwell et al. |
| 2015/0106317 A1 | 4/2015 | Rangan et al. |
| 2015/0134580 A1 | 5/2015 | Wilson |
| 2015/0170021 A1 | 6/2015 | Lupon et al. |
| 2015/0212861 A1 | 7/2015 | Canoy et al. |
| 2015/0269480 A1 | 9/2015 | Levin et al. |
| 2015/0324690 A1 | 11/2015 | Chilimbi et al. |
| 2015/0324691 A1 | 11/2015 | Dropps et al. |
| 2015/0324692 A1 | 11/2015 | Ritchey et al. |
| 2016/0086077 A1 | 3/2016 | Akopyan et al. |
| 2016/0179434 A1 | 6/2016 | Herrero et al. |
| 2016/0232442 A1 | 8/2016 | Fan et al. |
| 2016/0275398 A1 | 9/2016 | Corvinelli et al. |
| 2016/0321537 A1 | 11/2016 | Akopyan et al. |
| 2016/0335119 A1 | 11/2016 | Merill et al. |
| 2016/0335534 A1 | 11/2016 | Nere et al. |
| 2017/0011288 A1 | 1/2017 | Brothers et al. |
| 2017/0017876 A1 | 1/2017 | Modha |
| 2017/0024644 A1 | 1/2017 | Van Der Made et al. |
| 2017/0090929 A1 | 3/2017 | Muttik et al. |
| 2017/0091614 A1 | 3/2017 | Amir et al. |
| 2017/0093526 A1 | 3/2017 | Mula et al. |
| 2017/0103313 A1 | 4/2017 | Ross et al. |
| 2017/0110093 A1 | 4/2017 | Stein et al. |
| 2017/0206437 A1 | 7/2017 | Hachiya et al. |
| 2017/0330509 A1 | 11/2017 | Cok et al. |
| 2017/0345181 A1 | 11/2017 | Yu et al. |
| 2018/0018558 A1 | 1/2018 | Lee et al. |
| 2018/0189231 A1 | 7/2018 | Fleming |
| 2018/0232617 A1 | 8/2018 | Rozen et al. |
| 2018/0260220 A1 | 9/2018 | Lacy et al. |
| 2018/0322382 A1 | 11/2018 | Mellempudi et al. |
| 2018/0336462 A1 | 11/2018 | Brothers |
| 2018/0375729 A1 | 12/2018 | Tzoreff et al. |
| 2019/0079729 A1 | 3/2019 | Aimone |
| 2019/0158223 A1 | 5/2019 | Carlough et al. |
| 2019/0197350 A1 | 6/2019 | Park |
| 2019/0373588 A1 | 12/2019 | Bae |
| 2020/0154482 A1 | 5/2020 | Ahn |
| 2020/0193297 A1 | 6/2020 | Verhoef |
| 2020/0202198 A1 | 6/2020 | Lee et al. |
| 2020/0024496 A1 | 7/2020 | Bhorkar |
| 2020/0285950 A1 | 9/2020 | Baum et al. |
| 2020/0285997 A1 | 9/2020 | Bhattacharyya |
| 2020/0322135 A1 | 10/2020 | Kupwade Patil |
| 2020/0379841 A1 | 12/2020 | Cassidy et al. |
| 2021/0053574 A1 | 2/2021 | Bielby et al. |
| 2021/0073127 A1 | 3/2021 | Bielby et al. |
| 2021/0132678 A1 | 5/2021 | An |
| 2021/0158169 A1 | 5/2021 | Kim |

FOREIGN PATENT DOCUMENTS

| | | |
|---|---|---|
| CA | 2383318 A1 | 10/2003 |
| CA | 2927171 A1 | 7/2016 |
| CN | 101452258 | 6/2009 |
| CN | 101493677 | 7/2009 |
| CN | 101809597 | 8/2010 |
| CN | 201927073 | 8/2011 |
| CN | 101882238 | 2/2012 |
| CN | 102490120 | 6/2012 |
| CN | 103778468 | 5/2014 |
| CN | 104107507 | 10/2014 |
| CN | 104459064 | 3/2015 |
| CN | 104493826 | 4/2015 |
| CN | 104899641 | 9/2015 |
| CN | 105184366 | 12/2015 |
| CN | 105260776 | 1/2016 |
| CN | 105311750 | 2/2016 |
| CN | 105653790 | 6/2016 |
| CN | 105676649 | 6/2016 |
| CN | 105678379 | 6/2016 |
| CN | 105844330 | 8/2016 |
| CN | 105930902 | 9/2016 |
| CN | 106022468 | 10/2016 |
| CN | 106355246 | 1/2017 |
| CN | 106447034 | 2/2017 |
| CN | 106503796 | 3/2017 |
| CN | 106529670 | 3/2017 |
| DE | 4310279 A1 | 10/1993 |
| DE | 19718224 A1 | 11/1997 |
| EP | 388806 A2 | 9/1990 |
| EP | 575716 A1 | 12/1993 |
| EP | 411761 B1 | 4/1996 |
| EP | 370543 B1 | 1/1997 |
| EP | 568146 B1 | 11/1997 |
| EP | 465241 B1 | 11/1998 |
| EP | 525543 B1 | 1/1999 |
| EP | 2825974 A1 | 1/2015 |
| EP | 3035249 | 6/2016 |
| EP | 3276540 | 1/2018 |
| FR | 2724029 B1 | 12/1997 |
| FR | 2780919 B1 | 5/2002 |
| GB | 2245401 | 1/1992 |
| GB | 2351885 | 1/2001 |
| JP | 2157832 | 6/1990 |
| JP | 2206867 | 8/1990 |
| JP | 2207369 | 8/1990 |
| JP | 2267660 | 11/1990 |
| JP | 2292602 | 12/1990 |
| JP | 3100857 | 4/1991 |
| JP | 3276137 | 12/1991 |
| JP | 4040581 | 2/1992 |
| JP | 4113481 | 4/1992 |
| JP | 4148212 | 5/1992 |
| JP | 4182769 | 6/1992 |
| JP | 4237388 | 8/1992 |
| JP | 4264664 | 9/1992 |
| JP | 4328691 | 11/1992 |
| JP | 4336370 | 11/1992 |
| JP | 4344970 | 12/1992 |
| JP | 5020294 | 1/1993 |
| JP | 5067064 | 3/1993 |
| JP | 5081227 | 4/1993 |
| JP | 5128284 | 5/1993 |
| JP | 5128285 | 5/1993 |
| JP | 5159087 | 6/1993 |
| JP | 5165800 | 7/1993 |
| JP | 5165987 | 7/1993 |
| JP | 5181547 | 7/1993 |

(56) References Cited

FOREIGN PATENT DOCUMENTS

| | | |
|---|---|---|
| JP | 5197701 | 8/1993 |
| JP | 5282272 | 10/1993 |
| JP | 5334278 | 12/1993 |
| JP | 5346914 | 12/1993 |
| JP | 6019868 | 1/1994 |
| JP | 6076092 | 3/1994 |
| JP | 6161586 | 6/1994 |
| JP | 7005904 | 1/1995 |
| JP | 7105165 | 4/1995 |
| JP | 7160796 | 6/1995 |
| JP | H07191951 | 7/1995 |
| JP | 7302292 | 11/1995 |
| JP | 8161282 | 6/1996 |
| JP | 9026948 | 1/1997 |
| JP | 2000322400 | 11/2000 |
| JP | 2001034735 | 2/2001 |
| JP | 03177996 B2 | 6/2001 |
| JP | 2006154992 | 6/2006 |
| JP | 2009288908 | 12/2009 |
| JP | 2015195011 | 11/2015 |
| JP | 2016153984 | 8/2016 |
| JP | 2016219011 | 12/2016 |
| KR | 2001095960 | 11/2001 |
| KR | 367715 B1 | 1/2003 |
| KR | 2005042871 | 5/2005 |
| KR | 919572 B1 | 10/2009 |
| RU | 2057363 C1 | 3/1996 |
| RU | 2473126 C1 | 1/2013 |
| RU | 2602973 C1 | 11/2016 |
| UA | 96148 C2 | 10/2011 |
| WO | WO 1991019267 A1 | 12/1991 |
| WO | WO 1993/023814 A1 | 11/1993 |
| WO | WO 1996041277 A1 | 12/1996 |
| WO | WO 2005/051189 A2 | 6/2005 |
| WO | WO 2007/033101 A2 | 3/2007 |
| WO | WO 2012/006468 A1 | 1/2012 |
| WO | WO 2015/157013 A1 | 10/2015 |
| WO | WO 2015/193531 A1 | 12/2015 |
| WO | WO 2016/099779 A1 | 6/2016 |
| WO | WO 2016/186811 A1 | 11/2016 |
| WO | 2018/126270 A1 | 7/2018 |

OTHER PUBLICATIONS

Shuchang Zhou et al., "Balanced Quantization: An Effective and Efficient Approach to Quantized Neural Networks", arXiv, Jun. 2017 (Year: 2017).

Lin, "Fixed Point Quantization of Deep Convolutional Networks", Proceedings of the 33rd International Conference on Machine Learning, New York, NY, JMLR: W&CP vol. 48, arXiv, Jun. 2016 (Year: 2016).

Amir et al., "Cognitive Computing Programming Paradigm: A Corelet Language for Composing Networks ofNeurosynaptic Cores", Aug. 4-9, 2013, The 2013 International Joint Conference on Neural Networks (IJCNN), IEEE (Rear 2013).

George et al.,MicroPython 1.14 [Online}, Aug. 2015 [retrived on Mar. 16, 2021], Retrieved from the Internet:,URL: http://docs.micropython.org/en/latest/pyboard/tutorial/assembler.html. (Year: 2015).

Pattnaik et al., "Scheduling Techniques for GPU Architectures with Processing-In Memory Capabilities", Sep. 11-15, 2016, IEEE, p. 31-44 (Year: 2016).

M'zah et al., "Deterministic Microcode Machine Generation", 2017 IEEE Conference on Dependable and Secure Computing, 2017, pp. 370-376, doi: 10.1109/DESEC.2017.8073858. (Year: 2017).

Yihua Liao: Neural Networks in Hardware: A Survey (undated).

Campolucci et al., "On-Line Learning Algorithms for Locally Recurrent Neural Networks", IEEE Transactions on Neura Networks, vol. 1 , No. 2, pp. 253-271, Mar. 1999.

Kumpati S. Narendra et al., "Identification and Control of Dynamical Systyems Using Neural Networks", IEEE Transactions on Neural Networks, vol. 1, No. 1, pp. 4-27, Mar. 1990.

Principe et al., "An Analysis of the Gamma Memory in Dynamic Neural Networks", IEEE Transactions on Neural Networks, vol. 5, No. 2, pp. 331-337, Mar. 1994.

ISR/WO dated Jun. 24, 2018; issued in connection with PCT/IL2018/050392.

ISR/WO dated Jul. 10, 2018; issued in connection with PCT/IL2018/050393.

ISR/WO dated Jul. 12, 2018; issued in connection with PCT/IL2018/050394.

ISR/WO dated Jul. 11, 2018; issued in connection with PCT/IL2018/050395.

ISR/WO dated Jul. 15, 2018; issued in connection with PCT/IL2018/050396.

Khan M et al, SpiNNaker: Mapping neural networks onto a massively-parallel chip multiprocessor, Neural Networks, 2008, pp. 2849-2856.

Carillo et al, Hierarchical network-on-chip and traffic ompression . . . , 2012 IEEE, p. 83-90.

\* cited by examiner

SYSTEM AND METHOD OF MEMORY ACCESS OF MULTI-DIMENSIONAL DATA

REFERENCE TO PRIORITY APPLICATIONS

This application claims the benefit of U.S. Provisional Application No. 62/481,492, filed Apr. 4, 2017, entitled "Multi-Layer Artificial Neural Network Computation Engine and Microarchitecture," and U.S. Provisional Application No. 62/531,372, filed Jul. 12, 2017, entitled "Multi-Layer Artificial Neural Network Computation Engine and Microarchitecture," both of which are incorporated herein by reference in their entirety.

FIELD OF THE DISCLOSURE

The subject matter disclosed herein relates to the field of digital memory circuits and more particularly relates to a system and method of accessing multi-dimensional data in memory.

BACKGROUND OF THE INVENTION

Artificial neural networks (ANNs) are computing systems inspired by the biological neural networks that constitute animal brains. Such systems learn, i.e. progressively improve performance, to do tasks by considering examples, generally without task-specific programming by extracting the critical features of those tasks and generalizing from large numbers of examples. For example, in image recognition, they might learn to identify images that contain cats by analyzing example images that have been manually labeled as "cat" or "not cat" and using the analytic results to identify cats in other images. They have found most use in applications difficult to express in a traditional computer algorithm using rule-based programming.

An ANN is based on a collection of connected units called artificial neurons, analogous to neurons in a biological brain. Each connection or synapse between neurons can transmit a signal to another neuron. The receiving or postsynaptic neuron is connected to another one or several neurons and can process the signals and then signal downstream neurons connected to it through a synapse also referred to as an axon. Neurons may have state, generally represented by real numbers, typically between 0 and 1. Neurons and synapses may also have a weight that varies as learning proceeds, which can increase or decrease the strength of the signal that it sends downstream. Further, they may have a threshold such that only if the aggregate signal is below or above that level is the downstream signal sent.

Typically, neurons are organized in layers. Different layers may perform different kinds of transformations on their inputs. Signals travel from the first, i.e. input, to the last, i.e. output, layer, possibly after traversing the layers multiple times.

The original goal of the neural network approach was to solve problems in the same way that a human brain would. Over time, attention focused on matching specific mental abilities, leading to deviations from biology such as backpropagation, or passing information in the reverse direction and adjusting the network to reflect that information.

The components of an artificial neural network include (1) neurons having an activation threshold; (2) connections and weights for transferring the output of a neuron; (3) a propagation function to compute the input to a neuron from the output of predecessor neurons; and (4) a learning rule which is an algorithm that modifies the parameters of the neural network in order for a given input to produce a desired outcome which typically amounts to modifying the weights and thresholds.

Given a specific task to solve, and a class of functions F, learning entails using a set of observations to find the function that which solves the task in some optimal sense. A cost function C is defined such that, for the optimal solution no other solution has a cost less than the cost of the optimal solution).

The cost function C is a measure of how far away a particular solution is from an optimal solution to the problem to be solved. Learning algorithms search through the solution space to find a function that has the smallest possible cost.

A neural network can be trained using backpropagation which is a method to calculate the gradient of the loss function with respect to the weights in an ANN. The weight updates of backpropagation can be done via well-known stochastic gradient descent techniques. Note that the choice of the cost function depends on factors such as the learning type (e.g., supervised, unsupervised, reinforcement) and the activation function.

There are three major learning paradigms and each corresponds to a particular learning task: supervised learning, unsupervised learning, and reinforcement learning. Supervised learning uses a set of example pairs and the goal is to find a function in the allowed class of functions that matches the examples. A commonly used cost is the mean-squared error, which tries to minimize the average squared error between the network's output and the target value over all example pairs. Minimizing this cost using gradient descent for the class of neural networks called multilayer perceptrons (MLP), produces the backpropagation algorithm for training neural networks. Examples of supervised learning include pattern recognition, i.e. classification, and regression, i.e. function approximation.

In unsupervised learning, some data is given and the cost function to be minimized, that can be any function of the data and the network's output. The cost function is dependent on the task (i.e. the model domain) and any a priori assumptions (i.e. the implicit properties of the model, its parameters, and the observed variables). Tasks that fall within the paradigm of unsupervised learning are in general estimation problems; the applications include clustering, the estimation of statistical distributions, compression, and filtering.

In reinforcement learning, data is usually not provided, but generated by an agent's interactions with the environment. At each point in time, the agent performs an action and the environment generates an observation and an instantaneous cost according to some typically unknown dynamics. The aim is to discover a policy for selecting actions that minimizes some measure of a long-term cost, e.g., the expected cumulative cost. The environment's dynamics and the long-term cost for each policy are usually unknown but can be estimated.

Today, a common application for neural networks is in the analysis of video streams, i.e. machine vision. Examples include industrial factories where machine vision is used on the assembly line in the manufacture of goods, autonomous vehicles where machine vision is used to detect objects in the path of and surrounding the vehicle, etc.

Artificial Neural Network (ANN) have an inherent structure that greatly relies on a set of parameters that are attributed to the so-called 'network model'. These parameters are often called 'weights' of the network due to their tendency to operate as a scaling factor for other intermediate values as they propagate along the network. The process for determining the values of the weights is called training as described supra. Once training is complete, the network settles into a steady state and can now be used with new (i.e. unknown) data to extract information. This stage is referred to as the 'inference' stage.

During inference, one can observe the resultant set of parameters, namely the weights, and manipulate them to yield better performance (i.e. representation). Methods for pruning and quantizing weights are known. These methods, however, are applied only on the trained model before moving to the inference stage. This approach does yield better execution performance. It does not, however, fully explore and exploit the potential of modifying the weights. In addition, existing solutions apply quantization of weights only after training once the weights of the ANN have converged to a satisfactory level.

SUMMARY OF THE INVENTION

The present invention is a system and method of accessing multi-dimensional data in memory. The invention is applicable to neural network (NN) processing engines adapted to implement artificial neural networks (ANNs). The granular nature of the NN processing engine or processor, also referred to as a neurocomputer or neurochip, enables the underpinnings of a neural network to be easily identified and a wide range of neural network models to be implemented in a very efficient manner. The NN processor provides some flexibility in selecting a balance between (1) over-generalizing the architecture regarding the computational aspect, and (2) aggregating computations in dedicated computationally capable units. The present invention provides an improved balance specific for neural networks and attempts to meet needed capabilities with appropriate capacity. The resulting architecture is thus more efficient and provides substantially higher computational unit density along with much lower power consumption per unit.

Several key features of the architecture of the NN processor of the present invention include the following: (1) computational units are self-contained and configured to be at full utilization to implement their target task; (2) a hierarchical architecture provides homogeneity and self-similarity thereby enabling simpler management and control of similar computational units, aggregated in multiple levels of hierarchy; (3) computational units are designed with minimal overhead as possible, where additional features and capabilities are placed at higher levels in the hierarchy (i.e. aggregation); (4) on-chip memory provides storage for content inherently required for basic operation at a particular hierarchy is coupled with the computational resources in an optimal ratio; (5) lean control provides just enough control to manage only the operations required at a particular hierarchical level; and (6) dynamic resource assignment agility can be adjusted as required depending on availability and capacity.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, a method of scanning tensor data stored in a memory, the method comprising providing a counter for each dimension of the tensor data stored in the memory, each dimension having a corresponding size, selecting one of the dimensions for memory access in accordance with an external trigger signal, triggering one of the counters corresponding to the selected dimension, and generating a memory access address in accordance with the contents of each counter and the size of each dimension.

There is also provided in accordance with the invention, a method of accessing multi-dimensional data stored in a memory, the method comprising providing a plurality of counters, each counter corresponding to a different dimension of the data stored in the memory, each dimension having a size, receiving a multidimensional next signal conveying target dimension information, decoding the multidimensional next signal to generate a trigger signal therefrom as well as a signal selecting one of the plurality of counters to receive the trigger signal in accordance with the target dimension information, applying the trigger signal to the selected counter, and generating an address offset to the memory in accordance with the contents of the plurality of counters and the respective sizes of each dimension of data stored in the memory.

There is further thus provided in accordance with the invention, a circuit for accessing multidimensional data stored in a memory, comprising a plurality of counters, each counter corresponding to a different dimension of the tensor data stored in the memory, each dimension having a corresponding size, a decoder circuit operative to generate a trigger for a selected one of the counters in accordance with a next signal input thereto, wherein the next signal indicates one of the dimensions for memory access, and an address generator circuit operative to generate a memory access address offset in accordance with the contents of each counter and each dimension size.

There is also provided in accordance with the invention, a circuit for scanning multi-dimensional data stored in a memory, comprising a plurality of counters, each counter corresponding to a different dimension of the data stored in the memory, a decoder circuit operative to receive a multi-dimensional next signal conveying target dimension information, the decoder circuit operative to generate a trigger signal directed to one of the plurality of counters in accordance with the target dimension information, and an address generator circuit coupled to the plurality of counters and operative to generate an address to the memory in accordance with the contents of the plurality of counters and the respective sizes of each dimension of data stored in the memory.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein.

DETAILED DESCRIPTION

Figure 1:
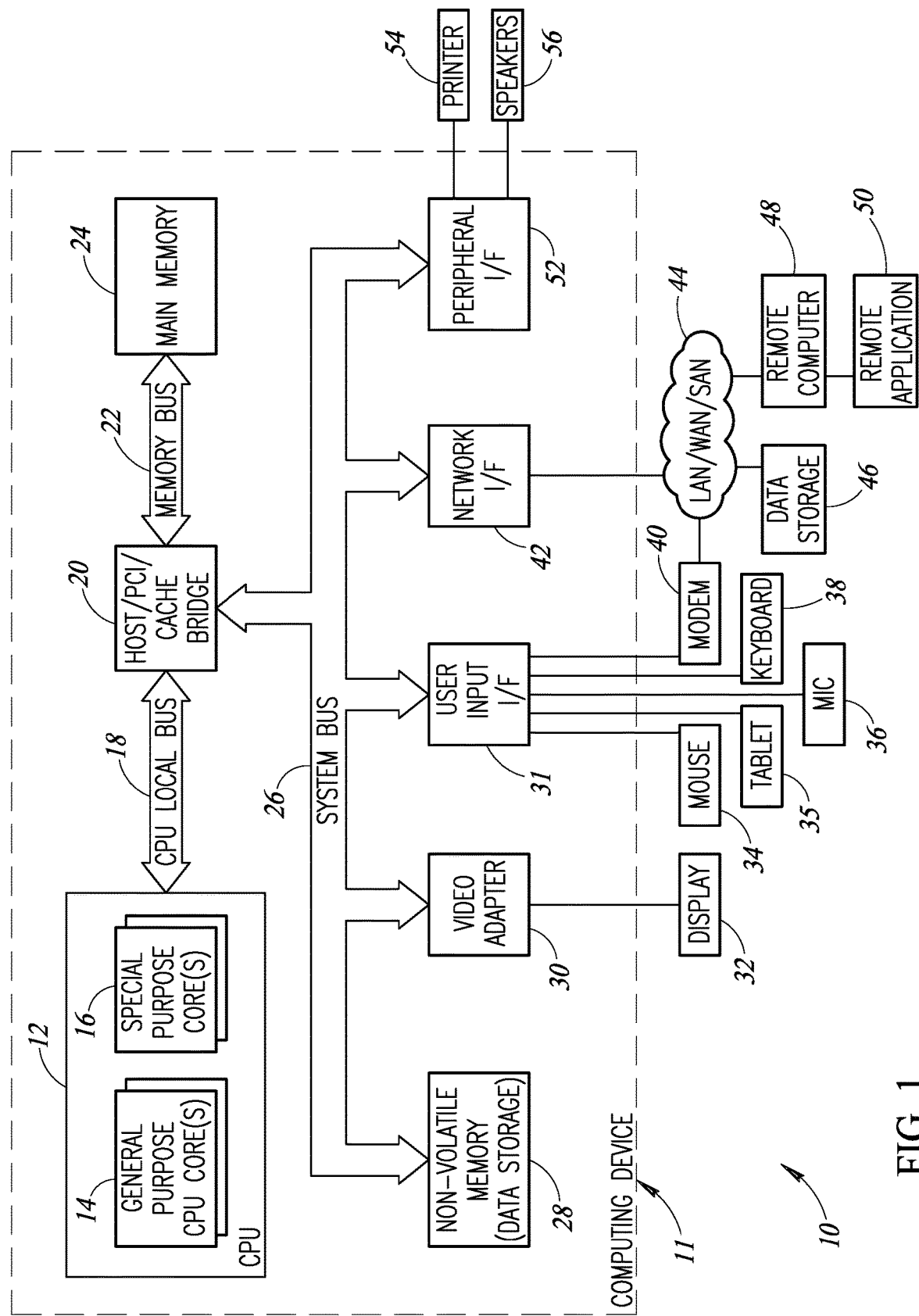
FIG. 1 is a block diagram illustrating an example computer processing system adapted to implement one or more portions of the present invention.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain or store the program for use by or in connection with the instruction execution system, apparatus, or device.

Computer program code for carrying out operations of the present invention may be written in any combination of one or more programming languages, including an object-oriented programming language such as Java, Smalltalk, C++, C# or the like, conventional procedural programming languages, such as the "C" programming language, and functional programming languages such as Prolog and Lisp, machine code, assembler or any other suitable programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network using any type of network protocol, including for example a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or supported by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The invention is operational with numerous general purpose or special purpose computing system environments or configurations. Examples of well-known computing systems, environments, and/or configurations that may be suitable for use with the invention include, but are not limited to, personal computers, server computers, cloud computing, hand-held or laptop devices, multiprocessor systems, microprocessor, microcontroller or microcomputer based systems, set top boxes, programmable consumer electronics, ASIC or FPGA core, DSP core, network PCs, minicomputers, mainframe computers, distributed computing environments that include any of the above systems or devices, and the like.

In addition, the invention is operational in systems incorporating video and still cameras, sensors, etc. such as found in automated factories, autonomous vehicles, in mobile devices such as tablets and smartphones, smart meters installed in the power grid and control systems for robot networks. In general, any computation device that can host an agent can be used to implement the present invention.

A block diagram illustrating an example computer processing system adapted to implement one or more portions of the present invention is shown in FIG. 1. The exemplary computer processing system, generally referenced 10, for implementing the invention comprises a general-purpose computing device 11. Computing device 11 comprises central processing unit (CPU) 12, host/PIC/cache bridge 20 and main memory 24.

The CPU 12 comprises one or more general purpose CPU cores 14 and optionally one or more special purpose cores 16 (e.g., DSP core, floating point, GPU, and neural network optimized core). The one or more general purpose cores execute general purpose opcodes while the special purpose cores execute functions specific to their purpose. The CPU 12 is coupled through the CPU local bus 18 to a host/PCI/cache bridge or chipset 20. A second level (i.e. L2) cache memory (not shown) may be coupled to a cache controller in the chipset. For some processors, the external cache may comprise an L1 or first level cache. The bridge or chipset 20 couples to main memory 24 via memory bus 20. The main memory comprises dynamic random access memory (DRAM) or extended data out (EDO) memory, or other types of memory such as ROM, static RAM, flash, and non-volatile static random access memory (NVSRAM), bubble memory, etc.

The computing device 11 also comprises various system components coupled to the CPU via system bus 26 (e.g., PCI). The host/PCI/cache bridge or chipset 20 interfaces to the system bus 26, such as peripheral component interconnect (PCI) bus. The system bus 26 may comprise any of several types of well-known bus structures using any of a variety of bus architectures. Example architectures include Industry Standard Architecture (ISA) bus, Micro Channel Architecture (MCA) bus, Enhanced ISA (EISA) bus, Video Electronics Standards Associate (VESA) local bus and Peripheral Component Interconnect (PCI) also known as Mezzanine bus.

Various components connected to the system bus include, but are not limited to, non-volatile memory (e.g., disk based data storage) 28, video/graphics adapter 30 connected to display 32, user input interface (I/F) controller 31 connected to one or more input devices such mouse 34, tablet 35, microphone 36, keyboard 38 and modem 40, network interface controller 42, peripheral interface controller 52 connected to one or more external peripherals such as printer 54 and speakers 56. The network interface controller 42 is coupled to one or more devices, such as data storage 46, remote computer 48 running one or more remote applications 50, via a network 44 which may comprise the Internet cloud, a local area network (LAN), wide area network (WAN), storage area network (SAN), etc. A small computer systems interface (SCSI) adapter (not shown) may also be coupled to the system bus. The SCSI adapter can couple to various SCSI devices such as a CD-ROM drive, tape drive, etc.

The non-volatile memory 28 may include various removable/non-removable, volatile/nonvolatile computer storage media, such as hard disk drives that reads from or writes to non-removable, nonvolatile magnetic media, a magnetic disk drive that reads from or writes to a removable, nonvolatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

A user may enter commands and information into the computer through input devices connected to the user input interface 31. Examples of input devices include a keyboard and pointing device, mouse, trackball or touch pad. Other input devices may include a microphone, joystick, game pad, satellite dish, scanner, etc.

The computer 11 may operate in a networked environment via connections to one or more remote computers, such as a remote computer 48. The remote computer may comprise a personal computer (PC), server, router, network PC, peer device or other common network node, and typically includes many or all of the elements described supra. Such networking environments are commonplace in offices, enterprise-wide computer networks, intranets and the Internet.

When used in a LAN networking environment, the computer 11 is connected to the LAN 44 via network interface 42. When used in a WAN networking environment, the computer 11 includes a modem 40 or other means for establishing communications over the WAN, such as the Internet. The modem 40, which may be internal or external, is connected to the system bus 26 via user input interface 31, or other appropriate mechanism.

The computing system environment, generally referenced 10, is an example of a suitable computing environment and is not intended to suggest any limitation as to the scope of use or functionality of the invention. Neither should the computing environment be interpreted as having any dependency or requirement relating to any one or combination of components illustrated in the exemplary operating environment.

In one embodiment, the software adapted to implement the system and methods of the present invention can also reside in the cloud. Cloud computing provides computation, software, data access and storage services that do not require end-user knowledge of the physical location and configuration of the system that delivers the services. Cloud computing encompasses any subscription-based or pay-per-use service and typically involves provisioning of dynamically scalable and often virtualized resources. Cloud computing providers deliver applications via the internet, which can be accessed from a web browser, while the business software and data are stored on servers at a remote location.

In another embodiment, software adapted to implement the system and methods of the present invention is adapted to reside on a computer readable medium. Computer readable media can be any available media that can be accessed by the computer and capable of storing for later reading by a computer a computer program implementing the method of this invention. Computer readable media includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data such as a magnetic disk within a disk drive unit. The software adapted to implement the system and methods of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the system and methods of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk, CDROM, DVD, flash memory, portable hard disk drive, etc. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Neural Network (NN) Processing Core

At a very high-level, an ANN is essentially a function with a large number of parameters, mapping between an input space to an output space. Thus, an ANN can be viewed as a sequence of computations. ANNs, however, have a certain internal structure and a set of properties. Considering this unique structure, the neural network (NN) processor comprises a plurality of basic computation units doing the same or similar mathematical manipulations, which, when combined together make up the neural network.

Figure 2:
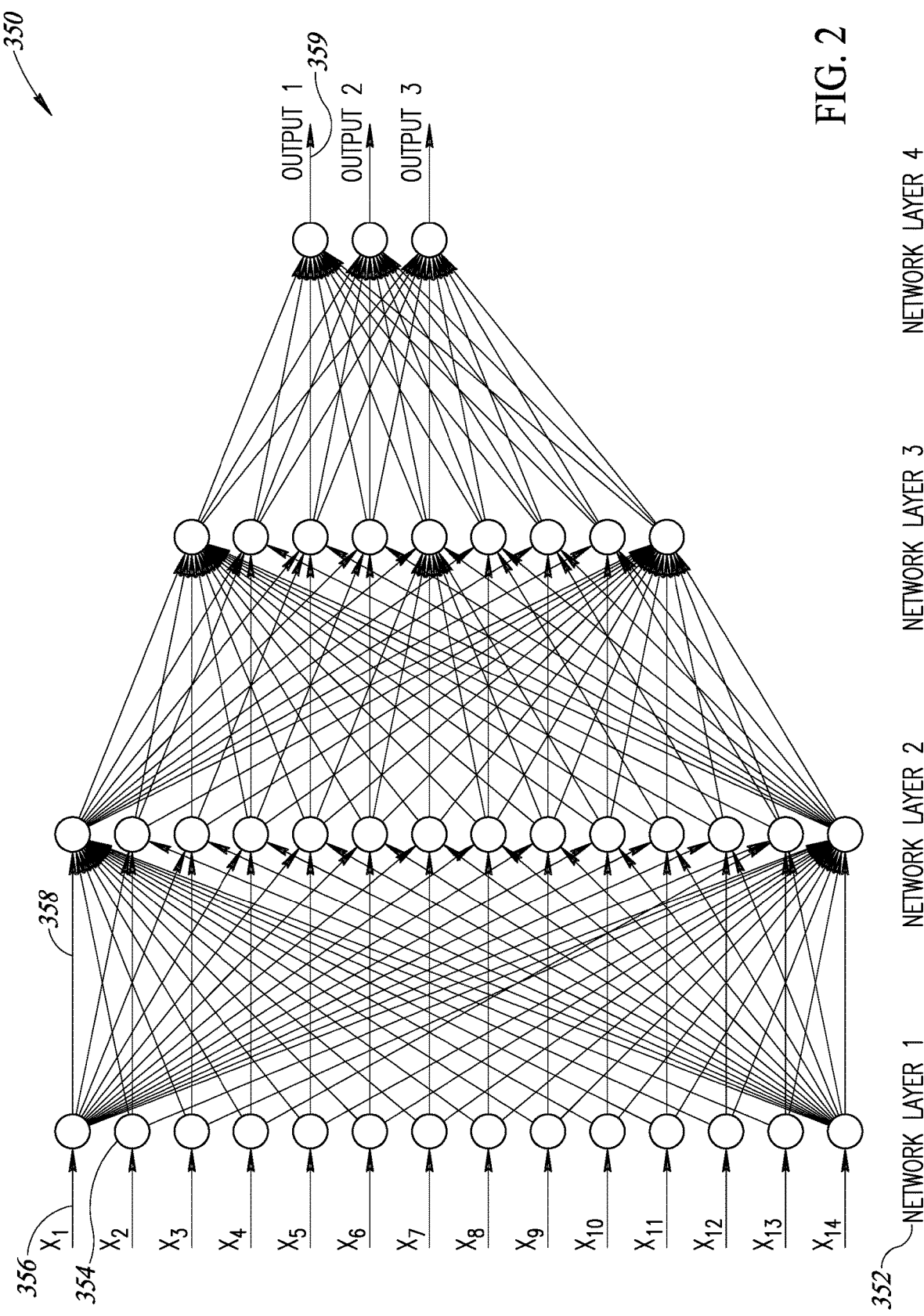
FIG. 2 is a diagram illustrating a first example artificial neural network.

The following set of notations is used herein to uniquely describe the network:

$$ANN \propto \{X^{<S>}, Y^{<T>}, M^{<W>}\} \qquad (1)$$

where:
$X^{<S>}$ represents the input dataset, characterized by a certain structure S;
$Y^{<T>}$ represents the output dataset with a format denoted by T;
$M^{<W>}$ represents the ANN model, which, given a set of parameters or weights (W) is a function that maps input to output;

A diagram illustrating an example artificial neural network is shown in FIG. 2. The example ANN, generally referenced 350, comprises four network layers 352, including network layers 1 through 4. Each network layer comprises a plurality of neurons 354. Inputs $X_1$ to $X_{14}$ are input to network layer 1. Weights 358 are applied to the inputs of each neuron in a network layer. The outputs of one network layer forming the input to the next network layer until the final outputs 359, outputs 1 through 3, are generated.

In one embodiment, the architecture of the present invention comprises a multi-layer architecture (i.e. not referred to ANN layers) that addresses the computational needs of an artificial neural network to its full capacity. The term multi-layer refers to an approach similar to that of the well-known ISO OSI-layer model for networking which describes the overall solution at varying levels of abstraction.

Figure 3:
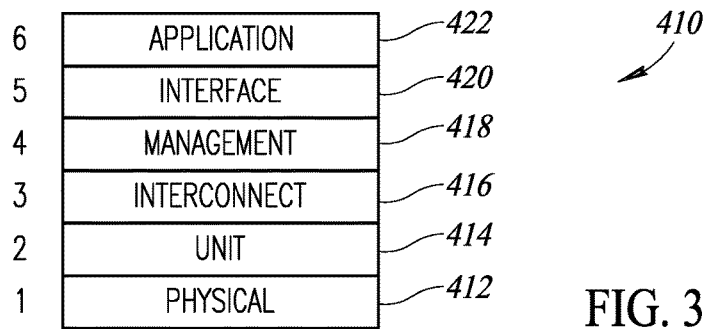
FIG. 3 is a diagram illustrating an example multi-layer abstraction for a neural network processing system.

A diagram illustrating an example multi-layer abstraction for a neural network processing system is shown in FIG. 3. The equivalent model for neural network processing, generally referenced 410, comprises six layers, including: Layer 1 (Physical 412) comprising the physical primitives making up the various units; Layer 2 (Unit 414) comprising the basic computational unit that underlies the neural network; Layer 3 (Interconnect 416) comprising the interconnect fabric that provides the network connectivity; Layer 4 (Management 418) providing network level flow control, monitoring and diagnostics; Layer 5 (Interface 420) providing the application layer interface and mapping to architecture primitives; and Layer 6 (Application 422) comprising the neural network based application.

Figure 4:
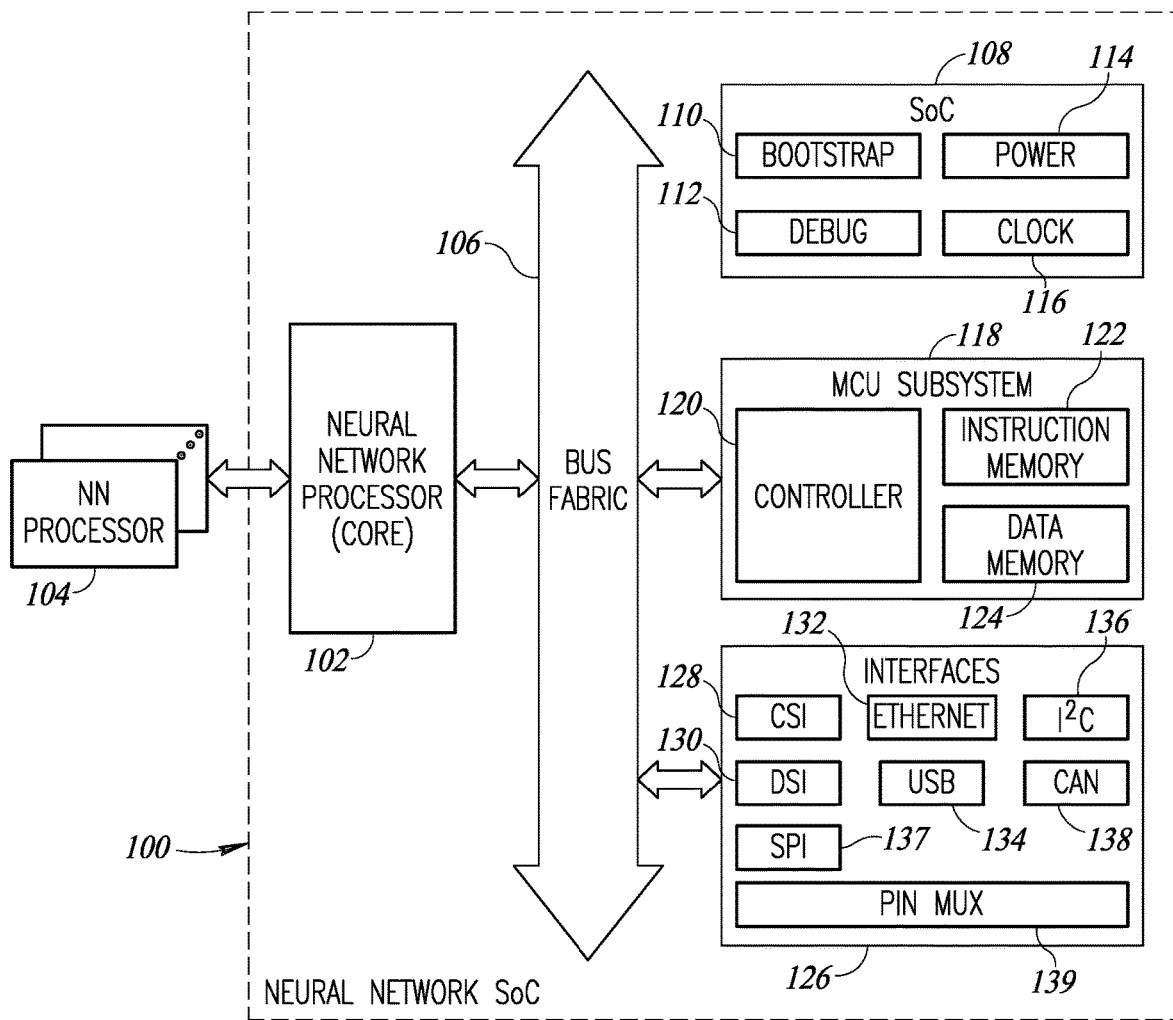
FIG. 4 is a high-level block diagram illustrating an example SoC based NN processing system comprising one or more NN processing cores.

A high-level block diagram illustrating an example system on chip (SoC) NN processing system comprising one or more NN processing cores is shown in FIG. 4. The SoC NN processing system, generally referenced 100, comprises at least one NN processor integrated circuit (or core) 102 optionally coupled to one or more additional internal or external NN processors 104 via one or more suitable chip to chip interfaces, a bus fabric 106 adapted to couple the NN processor to various system on chip elements 108, microcontroller unit (MCU) subsystem 118, and one or more interfaces 126.

In one embodiment, the SoC 108 includes bootstrap circuit block 110, debug circuit block 112, power circuit block 114, and clock circuit block 116. The MCU subsystem 118 includes a controller circuit block 120, instruction memory 122, and data memory 124. Interfaces 126 comprise a pin multiplexer 139, and one or more well-known interfaces including camera serial interface (CSI) 128, display serial interface (DSI), Ethernet 132, universal serial bus (USB) 134, inter-integrated circuit (I²C) interface 136, serial peripheral interface (SPI) 137, and controller area network (CAN) interface 138. Note that these interfaces are shown as an example, as any combination of different interfaces may be implemented.

Figure 5:
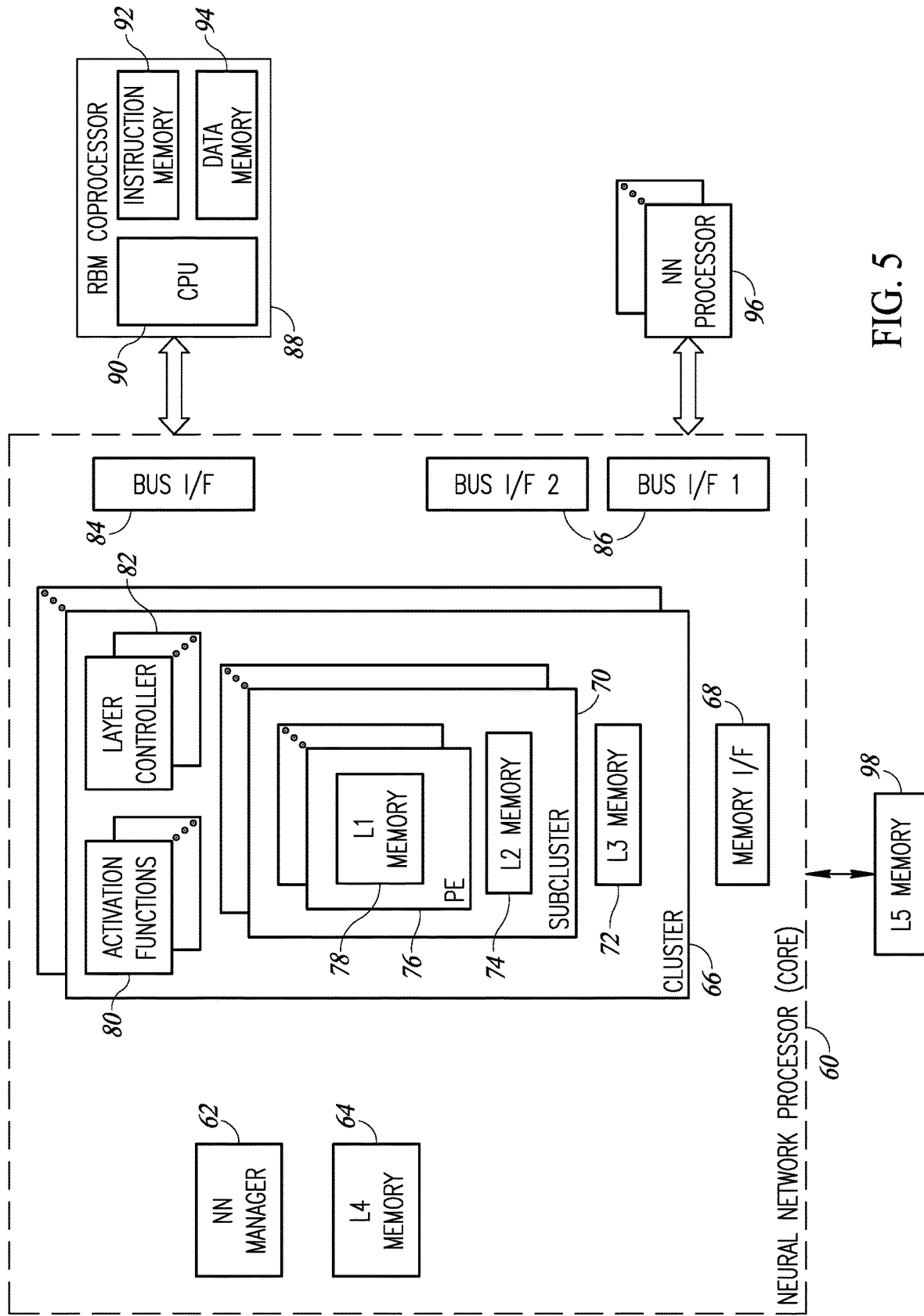
FIG. 5 is a high-level block diagram illustrating an example NN processing core in more detail.

A high-level block diagram illustrating an example NN processing core in more detail is shown in FIG. 5. The NN processing engine or core 60 comprises several hierarchical computation units. The lowest hierarchical level is the processing element (PE) 76 with its own dedicated internal Layer 1 or L1 memory 78 in which individual neurons are implemented. A plurality of N PEs 76 along with dedicated Layer 2 or L2 memory 74 make up the next hierarchical level termed a subcluster 70. A plurality of M subclusters 70 along with dedicated Layer 3 or L3 memory 72, a plurality of activation function circuits 80, and a plurality of layer controller (LC) circuits 82 make up a cluster 66. A plurality of L clusters along with dedicated Layer 4 or L4 memory 64 are in the NN processor core 60 which also comprises NN manager circuit 62, and memory interface 68 to off-chip Layer 5 or L5 memory 98. A plurality of bus interfaces 86 (i.e. chip-to-chip interfaces) couple the NN processor to other off-chip NN processor chips for additional network capacity. Bus interface 84 (i.e. chip-to-chip interface) couples the NN processor to a conventional rule based machine (RBM) co-processor 88 comprising a CPU 90, instruction memory 92 and data memory 94. In an alternative embodiment, the RBM co-processor is optionally coupled to the NN device 60 via a suitable interface, e.g., GPUs, I²C, etc.

Note that in an example NN processor embodiment, a PE comprises P=16 neurons, a subcluster comprises N=64 PEs, a cluster comprises M=64 subclusters, and the NN core comprises L=8 clusters. It is appreciated that the NN processor can be implemented having any desired number of hierarchical levels as well as any number of computation units within each level and is not limited to the examples described herein which are provided for illustration purposes only. In addition, any number of activation functions 80 and layer controllers 82 may be implemented in the cluster level or in any other level depending on the design goals and particular implementation of the NN processor.

In one embodiment, the NN manager 62 is a specialized processor that controls two data pipes: one parallel and one serial along with functions to drive the network fabric. This processor carries out special purpose operations that are native to the control plane of the neural network. Example operations includes, but are not limited to, Infer, Train, Load weights, and Update weights. Load balancing and resource allocation are handled by an external software tool chain, which includes a set of tools including a compiler, mapper, and allocator, that address these tasks.

In one embodiment, the NN processor includes shared memory for the storage of weights and dedicated memory elements are for storing contexts thereby enabling relatively high data processing bandwidth. In addition, the NN processor includes data and control planes that are strictly separate from each other and that provide out of band control to the computation elements. Moreover, the NN processor includes a configurable interconnect between aggregation levels to yield a dynamic and programmable data pipeline.

In another embodiment, the NN processor is capable of implementing multiple ANNs in parallel, where each ANN has one or more network layers. The NN processor is adapted to simultaneously process one or more input data streams associated with the ANNs. Since the architecture of the NN device resembles the structure of an ANN, multiple ANNs can be viewed as a single wide ANN. Note that when deploying multiple ANNs, given enough resources, the mapper in the external tool chain is operative to map available resources while the NN manager governs event triggers. In this case, due to the enormous parallelism of the device, each set of resources grouped within a 'layer' of the ANN is independent from each other.

In addition, the computation elements of the NN processor are operative to function at any desired granularity of a subset of the input data stream thereby trading off memory element usage versus latency, as described in more detail infra.

The NN processor of the present invention uses several design principles in its implementation including: (1) just in time usage of system resources; (2) dynamic allocation of system resources per need; (3) leveraging both the time-domain and the space-domain to optimize utilization and efficiency; and (4) balanced load over available system resources.

Note that the present invention is well suited to implement ANNs. Typically, ANNs are implemented in three stages: modeling, training, and inference, all three of which are addressed to some extent by the NN processor of the present invention.

Regarding modeling, the NN processor is capable of altering the model representation statically and dynamically thus reflecting its flexible nature. The 'processor' notation is used as opposed to an 'accelerator' since the latter is typically adapted a priori to exercise a predefined set of operations. Regarding training, the NN processor supports on-the-fly and complementary training operations that allows implementation of the training procedure. This includes: (1) running back and forth through the network (i.e. backpropagation); (2) dynamically applying dropout; and (3) on-the-fly evaluation of layer performance and ill behavior detection. During the inference mode, the ANN is executed optimally and efficiently and is applied to new inputs.

The NN processor of the present invention combines several features that combine together to provide extremely high computation rate, small chip footprint, low power consumption, scalability, programmability, and flexibility to handle many types of neural networks.

A first feature comprises the compute fabric (or compute capability) provided by the computation units that are organized into various aggregation levels or hierarchical levels, such as PEs, subclusters, clusters, NN cores as described in the example system disclosed herein. The compute fabric comprises the basic compute elements that are configured to address the special nature of the computational needs of ANNs. Several features of the compute fabric include: (1) a lean circuit architecture thereby allowing a relatively large number of physical entities to be implemented; (2) a large number of multiply and accumulate operations at once, where additions are performed as accumulations; (3) flexibility of number representation, including integer and floating point as well as different bit widths; (4) quad-multiplier support allowing for higher resolution computations; and (5) N-way ALU support to provide the capability of optimizing memory bandwidth, i.e. instead of performing a single operation per cycle such as $y \leftarrow y + w \ast x$, a more complex operation such as $y \leftarrow y + w_1 \ast x_1 + w_2 \ast x_2$ can be implemented which reflects a trade-off between an increase in silicon complexity and reduced memory access required.

A second feature is the control plane and the strict separation of the control fabric from the data fabric which enables aggregation of control as well as very 'lean' or 'slim' control of the entire data fabric (i.e. data plane). The control plane is separate from the data plane and thus it can be aggregated in the sense that a large number of compute units are controlled using relatively few control lines, e.g., by a single control line in some cases. For example, considering the multiply circuits in the PEs, a single control signal initiates the multiply operation in thousands of PEs at the same time. Further, the programmability of the control plane is separate from the programmability of the data plane. The massive parallelism of the data fabric of the NN core is matched by the lean structure of the control plane.

This is in contrast to the typical prior art approach of in-band control where control signals are applied in close proximity to the data which require the replication of the control signals by the number of compute elements. Furthermore, out-of-band control is in contrast to traditional microcontroller based techniques as it is not a Von-Neuman machine based technique.

Another advantage of the separation of control and data fabric is that the control remains programmable. The non-rigid implementation of the control fabric and the general nature of the computation units (i.e. PEs, subclusters, clusters, etc.) allows the NN core to handle numerous types of ANNs, such as convolutional NNs (CNNs), recurrent NNs (RNNs), deep NNs (DNNs), MLPs, etc., as well as more intricate implementations of the above and subtle combinations and properties of each, e.g., stride, padding, etc. implemented in convolutional modes.

A third feature is the structure of the memory fabric including memory windowing. In addition to the localization and hierarchical structure of the memory, high bandwidth access to the memory is provided in parallel to a large number of computation units. This is achieved by narrowing access for a particular computation unit to only a small portion of the memory. Thus, full random access to the entire memory is not provided. Rather, access to only a relatively small window of memory is provided. This allows simultaneous access across thousands of computation units, thus representing a tradeoff between bandwidth and random accessibility. Since a single compute unit memory access pattern is structured and well-defined by the ANN and does not require full random access to the entire memory, access can be 'windowed' to only those few memory blocks required for that particular compute unit. Thus, extremely high memory bandwidth is achieved whereby thousands of compute units can access memory simultaneously in parallel with the tradeoff being access only to memory that is 'local' to the compute unit.

In one embodiment, the architecture of the NN processor comprises a control plane and a data plane (or control fabric and data fabric). The control plane is responsible for configuring and controlling all the data computation units in the NN processor. It comprises a dataflow machine or processor incorporating, in one embodiment, microcode tailored for neural network operations. In the example NN processor described herein, the control plane governs the cluster entities 66 which functions as an aggregator for the next layer of aggregation, i.e. the subcluster 70. The subcluster, in turn, comprises the most basic units, namely the processing elements (PEs) 76 which are composed of a multiply and accumulate (MAC) circuit and local memory. It is the PE hierarchical level that contains a set of neuron entities found in a typical neural network.

An important aspect of implementing an ANN in the NN processor is the control and interconnect of all the compute elements. The very large number of compute elements in an ANN is leveraged by the present invention. One feature of the device control fabric is that it is relatively very lean since it is shared among a large set of compute resources. In one embodiment, the NN processor features (1) strict separation between data and control, where the control signaling is performed out of band and does not include any data driven memory access; (2) dynamic mapping between control and attached compute resources; and (3) flexibility and programmability of the control fabric (i.e. at compile time). In addition, the NN processor includes layer controllers incorporating microcode machines that allow full accessibility to the control signaling of the computational elements, memory etc.

Note that data driven memory access denotes access that involves observation of the data that flows through the data pipeline. The NN processor does not require this. Note that data driven memory access is common in rule based machines since the nature of the rules is data dependent and thus control must be intertwined with data. For example, consider the statement: if (x>some_value) then do A. This implies the need to observe every input 'x'. In contrast, consider a machine that compares many inputs with a threshold. The microcode in this case only needs to trigger an operation that applies a massive set of comparators. Such an approach, however, cannot be taken in an RBM because it implies a huge number of operations that must be hard-wired which negates the possibility of programing the machine.

The NN processor, in contrast, operates on data using a very limited set of operations. The nature of the processing flow does not involve the value of the data. Thus, it is possible aggregate control and drive an enormous set of compute elements with relatively few control signals. For example, in the NN device, a control bus of 64 control signals is needed to control thousands of compute units.

In one embodiment the NN processor is implemented such that functionality is provided at several points of aggregation where it is needed, as described in more detail infra. In addition, the NN processor is configured to be substantially balanced in terms of compute and memory resources to ensure the system achieves maximal utilization.

In the event that the capacity of the NN processor is insufficient for a particular neural network, bus interfaces 86 provide for interconnecting additional NN processors 96 to extend beyond the limitations of a single processor.

In one embodiment, an RBM coprocessor subsystem 88 is configured to support one or more primitives that are not supported by the NN processor. In addition, the coprocessor functions to exchange tasks extracted from the ANN and assigned to the RBM.

The NN processor essentially operates as a dataflow machine meaning that the calculations are executed based solely upon the availability of data. The data flow is divided between layers, which are analogous to the layers in the ANN. The computation units inside a layer act synchronously, starting when data is ready at the layer's input and ending when they need new data and/or need to pass results to the next layer, at which point the layer's state machine synchronizes with the previous and/or next layer's state machine.

As an example, an MLP network with two dense layers can be mapped as (1) one layer which receives input from outside the core, (2) two layers which represent the neural network layers, and (3) one layer which sends the result outside the core.

In one embodiment, the input layer waits until it receives all the inputs (e.g., 784 inputs for the well-known MNIST data set), and then signals layer 1 that its input is ready. Layer 1 then performs all the required multiply and accumulate (MAC) operations, the activation function, and finally signals to layer 2, which in turn repeats the same steps. When layer 2 is finished, it signals to the output layer to send the results outside the NN core.

In another embodiment, considering the same network, the NN core starts the MACs in layer 1 on a smaller portion of input data, thus reducing the buffering required between the input layer and layer 1, at the expense of complexity of the state machine in layer 1 and possibly loss of compute efficiency during signaling.

Inside the clusters 66 in the NN core, data is passed through shared L3 memory 72, while the signaling is performed through a dedicated interconnect 282 (FIG. 11), described in more detail infra. In one embodiment, the AXI4-Stream protocol is used between clusters, which handles both data and control planes. To prevent stalls, the interconnect between the layers provides a dual buffer mechanism, so that one layer writes its output to one buffer as the second layer reads the previous output as its input from the second buffer.

In one embodiment, the use of the dataflow architecture together with a relatively limited set of basic operations in neural networks enables a significant reduction in the requirements of control distribution.

Firstly, much of the information regarding the computation being performed is statically known once the network model is defined and can therefore be loaded via a narrowband interface a priori, thus reducing the number of control lines required during computation. The result is that the code for the 'kernels' which implement layers is divided between quasi-static configuration that are constant per network model and dynamic instructions which change throughout the computation.

Secondly, each dynamic 'instruction' actually comprises multiple instructions instructing all the compute elements in a layer what to do in each cycle. As each compute element has relatively simple functionality, the basic instructions themselves are relatively simple. Repetitions (i.e. loops) and jump instructions are provided out of band, to avoid wasting cycles.

Thirdly, the static order of computations combined with an appropriate arrangement of parameters in memory enables sequential access to memory. Therefore, only address increment instructions to access memory are required rather than full addressing.

Fourthly, since the microcode is very compact, it can reside in on-chip SRAM without the need for prefetch, branch prediction, etc.

Fifthly, although a layer comprises many processing elements (PEs), only one central state machine is needed to control the steps of the computation for the entire layer along with smaller slave state machines which store only a sub-state, with each of them controlling multiple PEs. In one embodiment, a global enable bit starts execution of all the state machines, and a global synchronous reset signal returns them to an initial state. Note that reset has no effect on the configuration memory and the data memory as the control plane ensures that no invalid data is used.

Note that the term 'model' is used to describe a quasi-static configuration which defines the dynamic behavior of all the compete units in the NN core. A model is typically analogous to a ANN model, but there may be other types of models, such as a model loaded for debug purposes or for loading weights into memory.

The configuration space is exposed in a memory-like interface, where modules are addressed using a hierarchical address space. Weights loading is normally performed before the configuration of the model and is achieved by configuring control signaling which copies the weights into the relevant memory blocks and sets the enable bit. The inference model is then loaded while the cluster is disabled, the control is reset and finally the cluster is enabled.

Memory Hierarchy

In one embodiment, the memory fabric of the NN processor is designed to address the inherent nature of ANNs. Thus, the memory is structured in a hierarchical manner in order to address the needs of the various memory consumers. These consumers include: (1) inter-layer data (i.e. cross layer input/output); (2) intra-layer information (i.e. contexts or intermediate results); and (3) weights. The various memory layers (e.g., five in the example embodiment disclosed herein), go from smaller, efficient, more localized memory to larger, less efficient, global memory.

In one embodiment, the memory fabric is organized and constructed utilizing the following: (1) localization of memory where computing elements require access to local data which permits accessibility of any given computing element to a predefined and limited memory entity; (2) structured organization whereby memory content is organized a priori in a given consistent matter; (3) limited recall nature (i.e. read once) where most of the data is volatile by nature and once processed, is fully consumed with limited or no need for further access to it; and (4) pipelined operation where the output data of one compute element serves as the input data to another compute element.

As described supra, each hierarchical level contains its own local memory. PEs comprise L1 memory, subclusters comprise L2 memory, clusters comprise L3 memory, NN cores comprise L4 memory, and L5 memory is located externally off-SoC. An example memory hierarchy is presented below in Table 1.

TABLE 1

Memory Hierarchy

| Memory Level | Location | Size [Bytes] | Bandwidth [Bytes/Transaction] | Usage Contexts | Weights | Input Data |
|---|---|---|---|---|---|---|
| L1 | PE | Baseline (B) | L*M*N*2 | X | | |
| L2 | Subcluster | B*512 | L*M*16 | X | X | |
| L3 | Cluster | B*1024*128 | L*128 | | X | X |
| L4 | NN Core | B*512*128 | 128 | | X | X |
| L5 | External to SoC | B*1024*2048 | 0.5 | | (X) | (X) |

Where N represents the number of processing elements in a subcluster, M is the number of subclusters in a cluster, and L is the number of clusters in the NN processor device. Note that the size indicated for each memory level L1 through L5 are for illustration purposes only. It is appreciated that any desired memory size for the various memory layers may be implemented without departing from the scope of the invention.

Note that the lower memory layers, e.g., L1 in the PE, are smaller sized but carry the larger bandwidths. The upper memory layers, e.g., L4 in the NN core, are much larger sized by carry far less traffic.

In accordance with the invention, as much memory as possible is kept as close as possible to where it is needed while utilizing the localized nature of memory usage in ANNs to avoid providing full mesh access between the entire memory and the compute elements. To overcome the restrictions imposed by the above strategy, the allocation of memory to consumers is done in a 'gradual' way, such that each level of memory having a specific role is complemented by a higher level as it requires more resources, where the higher level memory is used for 'resource load balancing' between multiple layers in the ANN which have different requirements.

Note that in one embodiment this 'spillover' is a quasi-static feature, as the resource requirements are already known once the model is selected, and thus does not require complex arbitration. This feature allows the static allocation of a significantly lower amount of memory resources in each layer since they are allocated according to the nominal case rather than the worst case.

In addition, the 'gradual' allocation of memory also features a sliding window mechanism, described briefly supra, which is used in L3 memory and described in more detail infra.

Processing Element (PE)

Figure 6:
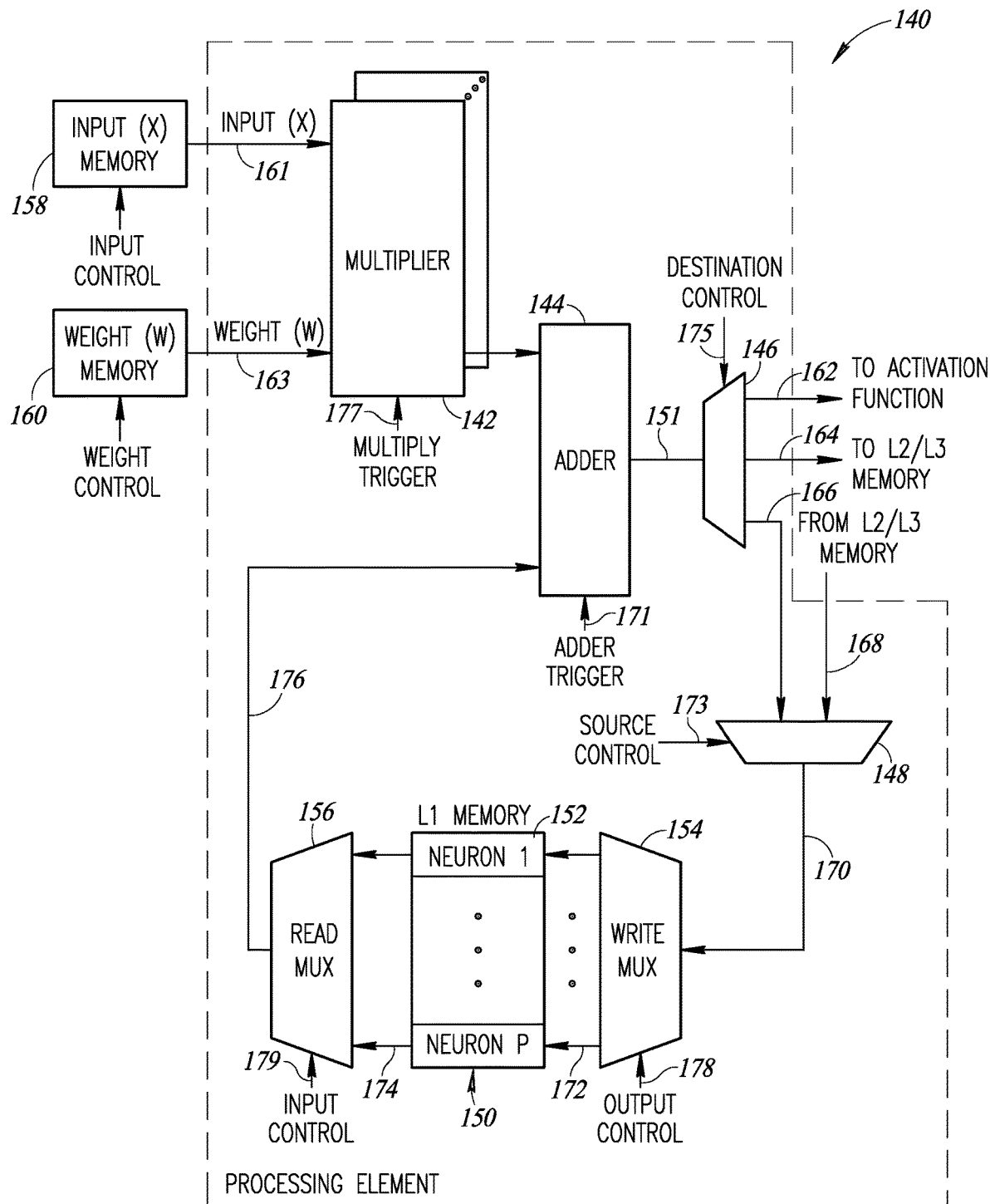
FIG. 6 is a block diagram illustrating a first example low-level processing element (PE) in more detail.

In one embodiment, the basic compute unit is the processing element (PE). A block diagram illustrating an example low-level processing element (PE) in more detail is shown in FIG. 6. The PE, generally referenced 140, comprises one or more multipliers 142 controlled by multiply trigger 177, an adder 144 controlled by adder trigger 171, L1 memory 150 comprising a plurality of registers 152, destination multiplexer 146 controlled by destination control 175, source multiplexer 148 controlled by source control 173, write multiplexer 154 controlled by output shuffle control 178, and read multiplexer 156 controlled by input shuffle control 179.

Input (x) data 161 from input memory 158 and weights (w) 163 from weight memory 160 are provided to the multiplier(s) 142 in accordance with an input control and weight control, respectively.

The most basic mathematical operation of a neuron in a neural network is defined by the following:

$$y_j = \sigma(\Sigma_{i=0}^{N-1} w_{i,j} \cdot x_i) \quad (2)$$

Where:
x(i) denotes the input dataset, organized into a 1D vector;
w(i,j) denotes the weight representing $i^{th}$ input contribution to output j;
σ denotes the activation function, typically a nonlinear scalar function;

The basic compute unit is a PE and comprises a multiply/accumulate entity that reflects the intrinsic operation of a neuron. The intermediate result or outcome is stored in L1 memory 150 which is local to the PE. The L1 memory has a certain depth and width, e.g., number of neurons P=16, each of which is 16 bits wide, in the example described herein. It is appreciated that L1 memory having any desired depth and width may be used. The depth P of L1 memory reflects the number of simultaneous 'neurons' or 'contexts' a PE can handle. Note that more than P neurons (i.e. contexts) can be handled by storing intermediate results for additional neurons in L2/L3 memory. Latency is impacted in that additional time is required to process the additional neurons. Providing P neurons leverages both the spatial domain by limiting the computational construct to the bare minimum, while also leveraging the time domain by storing multiple contexts.

The capability of handling internal context provides for a number of capabilities such as: (1) the ability to assign multiple logical neurons to a single physical neuron (each context stores the output of one neuron); (2) storing multiple intermediate results for the same input resulting in simultaneous operations, and hypothesis testing for different versions of weights (e.g., backpropagation results, correction values based on gradients, etc.); (3) multithreaded inference of the same inputs for the purpose of applying common methodology of a network committee and a majority vote extraction; (4) running multiple networks if resources are available; and (5) load balancing based on overall network capacity as governed by an NN manager.

Figure 20:
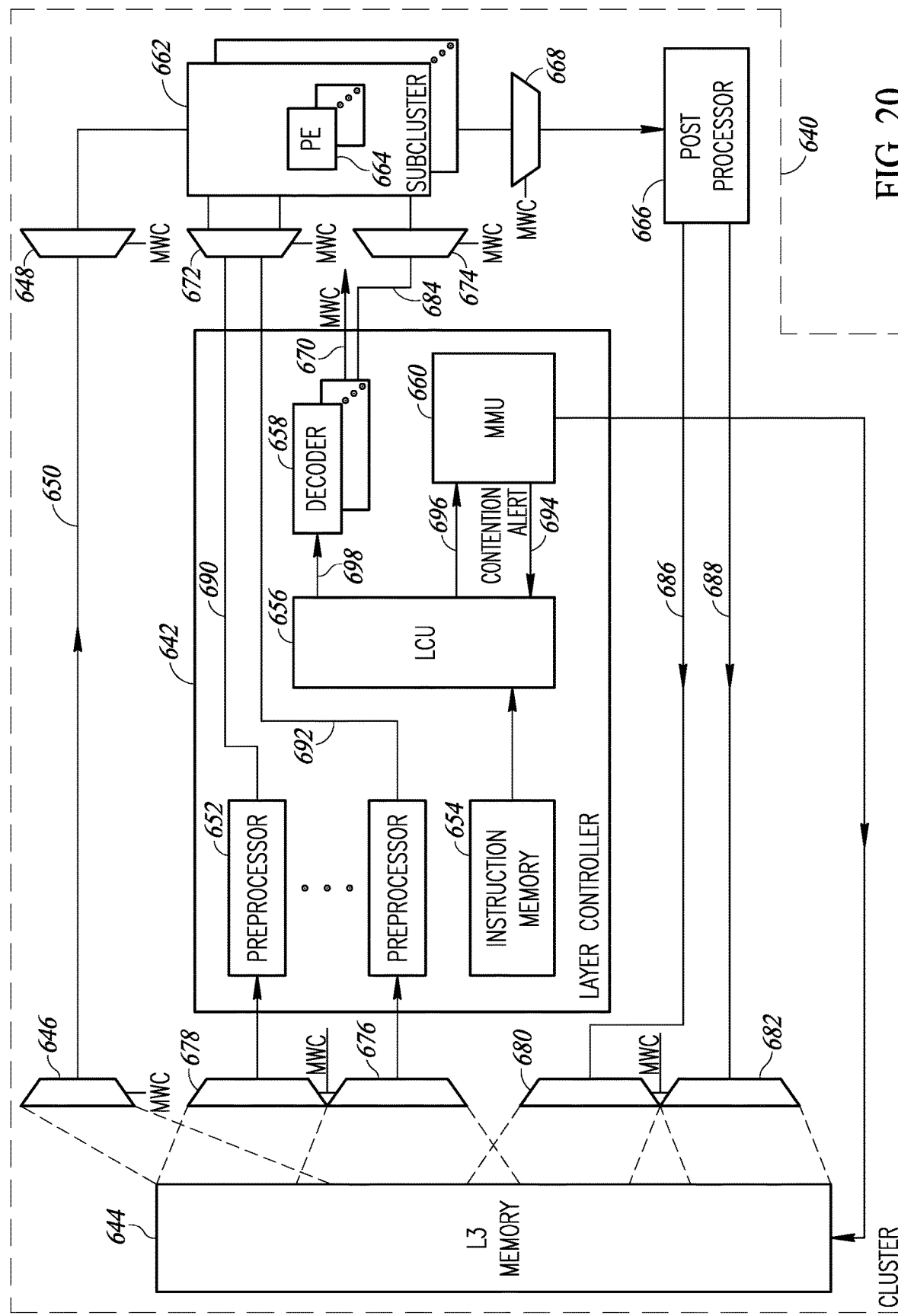
FIG. 20 is a high-level block diagram illustrating the layer controller interface to L3 memory and subclusters in more detail.

In operation, Equation 2 above reflecting neuron functionality is spread over multiple time instances and implemented as provided below in Listing 1. Note that this is an example implementation only as other sequences may be used by loading different microcode to the layer controllers (LCs) 642 (FIG. 20).

---

Listing 1: Neuron functionality

@ time t = 0:
  Set default value based on subcluster control signal as follows:
    •Ctrl = load_zero:      y ← 0
    •Ctrl = load_bias:      y ← L2/L3 [@bias_address]
    •Ctrl = load_same:      y ← L1 [@same_address_index]
    •Ctrl = load_cont:      y ← L2 [@next_address_index]
    •Ctrl = load_other:     y ← L3 [@previous_layer_neuron_index]
@ t = 1 . . . P − 1:
  Apply calculation according to configured representation, based on subcluster ctrl.
  Target is stored in place unless otherwise indicated by control signals.
      y ← y + w * x
    •'*' is implemented as a multiplier with control signals for representation type
    •'+' is implemented as an adder with control signals for representation type
  Update weight according to the control scheme:
      w ← (ctrl = weight_update) & read_next (base, offset)
  Update input according to the control scheme:
      x ← (ctrl = input_update) & read_next (base, offset)
@ t = P:
  Apply activation function unless bypassed; activation type determined through control
  Destination is pre-configured and auto-determined by activation
      z ← (ctrl ≅ bypass_activation) & activation_func (y, type)

---

With reference to FIG. 6, the PE comprises separately controlled counting elements for the weights (w) and inputs (x) as well as separate control over the representation format for the adder and multiplier. It also comprises separately controlled ingress/egress L1 entry index, allowing the order of calculations to be manipulated. The intermediate results of the accumulation function are stored locally in the L1 memory registers 152. In addition, pre-processing during initialization enables L1 memory to be pre-loaded with default values (e.g. prior intermediate results, bias values, etc.). The PE also includes intermediate memory aggregation control, i.e. allocation step size. In addition, activation functions are aggregated to minimize area overhead and not implemented at the PE or subcluster level but rather at the cluster level. The PE also supports activation bypass to permit concatenation.

Pre-synthesis configurability allows for: (1) N-way multiply and accumulate (i.e. $Y = Y + A_1 * B_1 + \ldots + A_N * B_N$); (2) representation format span (e.g., support for $k_0 \ldots k_N$ bits per entry with m-bit mantissa and e-bit exponent, where k=m+e); and (3) selection of local storage depth P.

In operation, the data flow within the PE is fairly flexible. The output 151 of the adder 144 can be steered via destination mux 146 using destination control 175 to either (1) the activation function via path 162; (2) to L2 or L3 memory via path 164; or (3) to the source mux 148 via path 166. The source mux 148 selects via source control 173 either (1) the output from the adder; or (2) an intermediate result from L2 or L3 memory 168. The write mux selects via output shuffle select 178 one of the neuron registers 152 to write the output of the source mux to via one of P paths 172. The data written to the L1 memory typically comprises intermediate results generated as a result of the multiply and accumulate operations performed over many cycles.

Data is read out of the L1 memory via one of P paths 174 connecting the neuron registers to the read mux 156 and selected via input shuffle control select 179. The output 176 of the read mux forms one of the two inputs to the adder 144. The other input to the adder being the output of the multiplier 142. Note that in the event multiple multipliers 142 are implemented, a pre-adder (not shown) functions to add the outputs of the multipliers to generate a single sum that is then input to the adder 144.

Figure 7A:
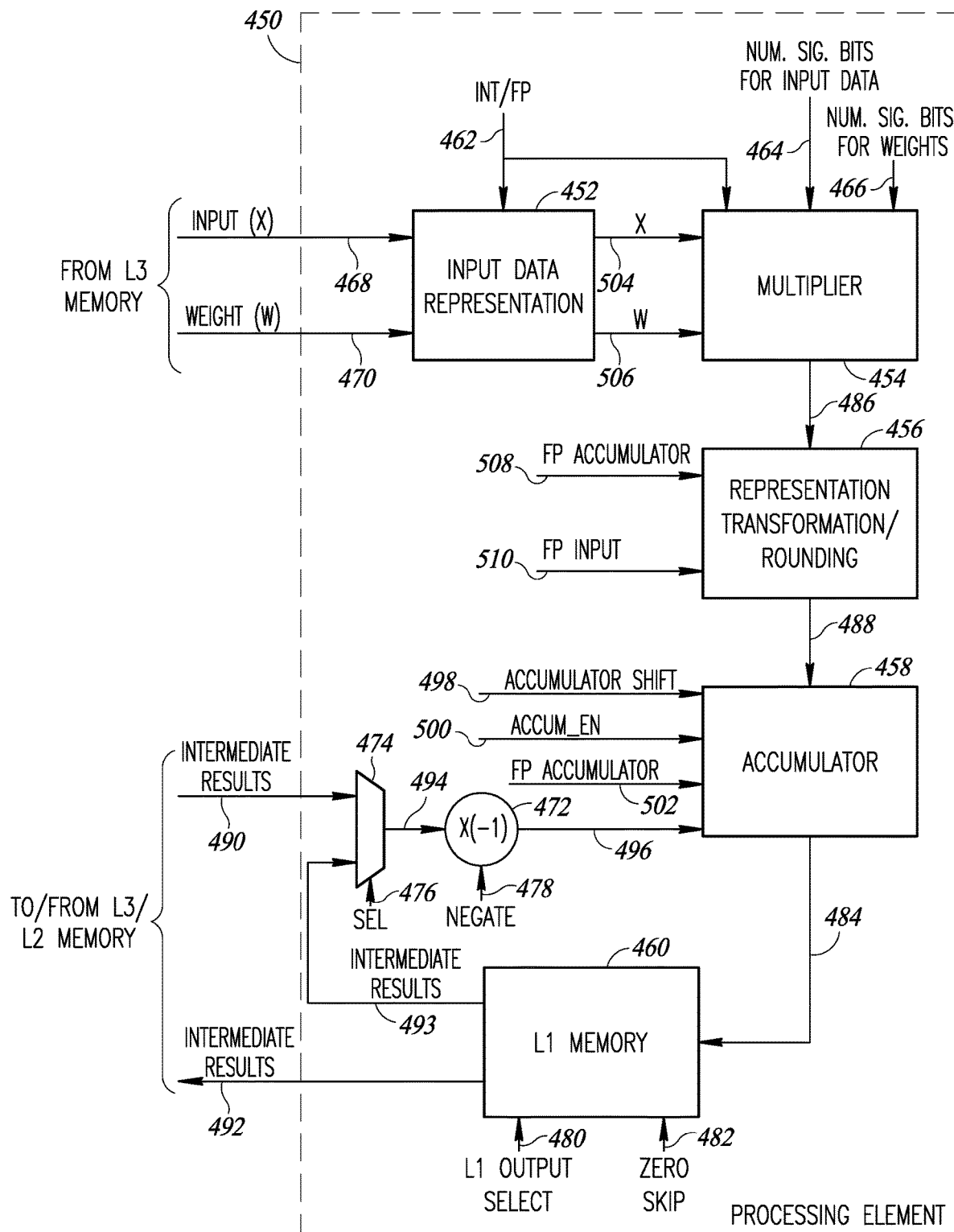
FIG. 7A is a block diagram illustrating a second example low-level processing element (PE) in more detail.

A block diagram illustrating a second example low-level processing element (PE) in more detail is shown in FIG. 7A. As described supra, the PE is the most basic compute element of the NN processor. The neurons of the ANN are implemented in the PE, essentially in the L1 memory. The processing element, generally referenced 450, comprises an input data representation circuit 452, multiplier circuit 454, representation transformation/rounding circuit 456, accumulator (i.e. adder) 458, L1 memory 460, negate circuit 472, and multiplexer 474.

In operation, input data (X) 468 and weights (W) 470 are input from L3 memory to the input data representation circuit 452. This circuit is operative to transform the representation of the input data and/or weights from integer to floating point (FP) format and vice versa in accordance with an INT/FP signal 462 which is also input to the multiplier. The resulting X 504 and W 506 are input to the multiplier 454. Note that either of the two PE embodiments shown in FIGS. 6 and 7A may be used in the NN device of the present invention.

In one embodiment, the multiplier comprises several multipliers that operate in parallel.

The multiplier is capable of multiplying both integer and floating point numbers. The number of significant bits for the input data and weights can also vary as set by the control inputs 464, 466, respectively. The product output of the multiplier 486 is input to the representation transformation/rounding circuit 456. FP accumulator and FP input control inputs 508, 510, respectively, signal circuit 456 whether the product is integer or FP format. In addition, the circuit 456 functions to perform rounding of the product before input to the accumulator.

The output 488 of circuit 456 is input to the accumulator (adder) 458. The second input to the accumulator 496 comprises either a context (i.e. intermediate result) 490 from L2 or L3 memory or the output of local L1 memory 460. Multiplexer 474 selects between the two in accordance with SEL 476. The output 494 is input to a negate circuit 472 where, in accordance with a Negate control 478, the output 496 is negated before being input to the accumulator.

Additional configuration controls to the accumulator include an accumulator shift signal (accumulator_shift) 498, accumulator enable (accum_en) 500, and FP accumulator 502. The output 484 of the accumulator is written to the L1 memory. The L1 memory also includes L1 output select 480 and zero skip 482. Intermediate results (i.e. contexts) output from the L1 memory are either input to the accumulator via path 493 or written to L2 or L3 memory via path 492. In one embodiment, accumulated (i.e. intermediate) results are written to and read from L1 memory sequentially, i.e. there is no random access to the neuron registers in L1 memory. Note that L1 memory may be accessed using any suitable predefined pattern other than randomly, e.g., sequential (one by one), skip one, skip two, etc. This greatly simplifies the addressing required to access the neuron registers. In addition, access to and from L2 and L3 memory layers is provided in the event not enough local L1 memory is available for a particular ANN. In this case, intermediate results are stored in higher memory layers to accommodate the particular ANN. The tradeoff, however, is increased latency in accessing the higher memory layers.

Figure 7B:
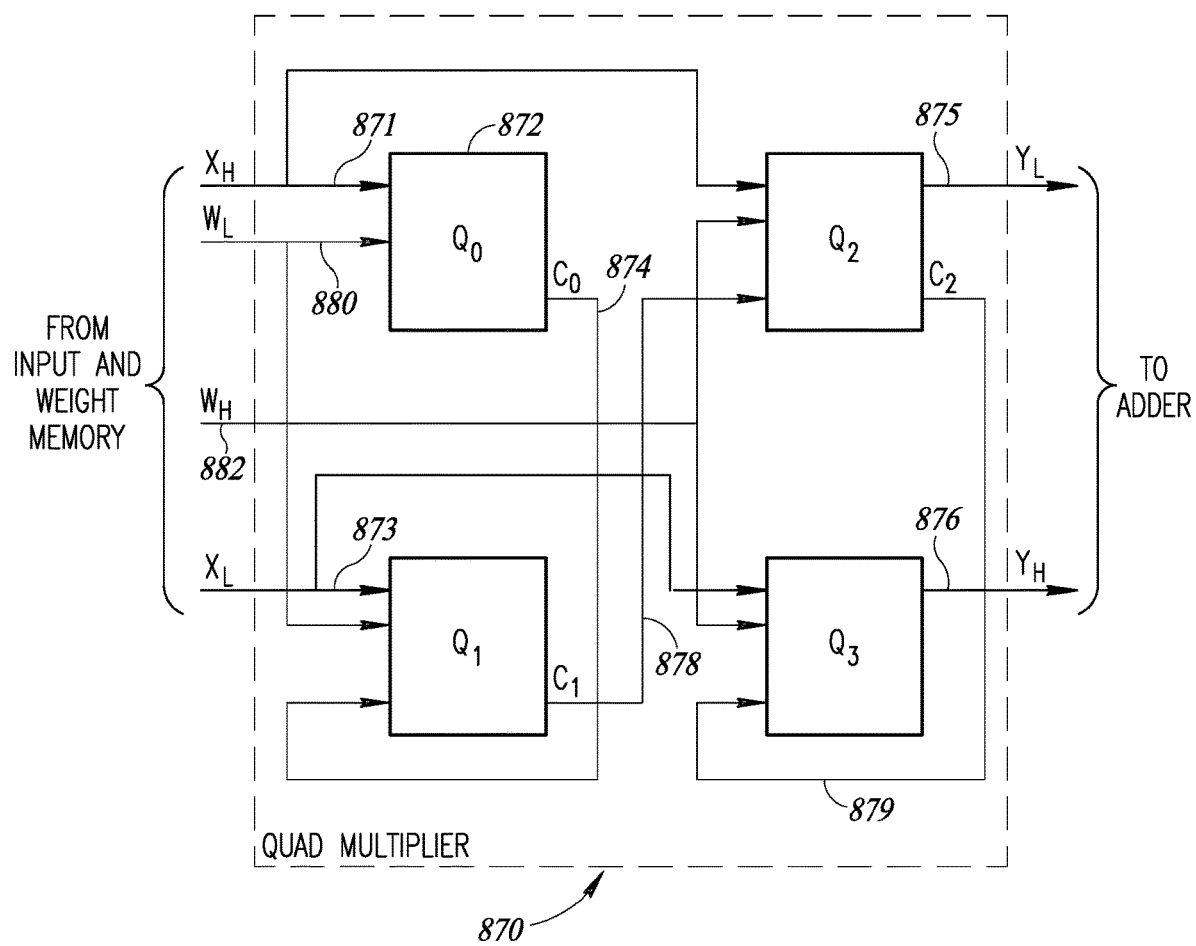
FIG. 7B is a block diagram illustrating the quad multiplier of the PE in more detail.

In an alternative embodiment, a higher precision multiplication (e.g., 16-bit) is performed by combining four low precision (e.g., 8-bit) multipliers to generate a high (or double) precision (e.g., 16-bit) product. A block diagram illustrating the quad multiplier of the PE in more detail is shown in FIG. 7B. The quad multiplier, generally referenced 870, comprises four lower precision (e.g., 8-bit) multipliers 872, $Q_0$, $Q_1$, $Q_2$, and $Q_3$. The input to the quad multiplier is a double precision input X made up of two low precision (e.g., 8-bit) values, namely $X_L$ 873 and $X_H$ 871, and a double precision weight W also comprising two low precision (e.g., 8-bit) values, namely $W_L$ 880 and $X_H$ 882.

In operation, each basic unit $Q_i$ receives a low precision (e.g., 8-bit) W and X value and based thereon, the quad multiplier circuit generates the result $Y \leftarrow Y + W*X$. Considering double precision X and W values, we denote the upper and lower parts of weights, input data and output as $W_H$ 882, $X_H$ 871, $Y_H$ 876 and $W_L$ 880, $X_L$ 873, $Y_L$ 875, respectively. Three carries $C_0$ 874, $C_1$ 878, and $C_2$ 879 are generated as well.

Expanding $Y \leftarrow Y + W*X$ into $$(Y_H<<16+Y_L) \leftarrow (W_H<<8+W_L)*(X_H<<8+X_L) \quad (3)$$

yields the following $$Y_L \leftarrow W_L*X_L + [(W_L*X_H + W_H*X_L)<<8]_L + C_0<<9 \quad (4)$$

and $$Y_H \leftarrow W_H*X_H + [(W_L*X_H + W_H*X_L)<<8]_H + C_1<<9 + C_2<<9 \quad (5)$$

Note that each output $Y_L$ and $Y_H$ represents a 16-bit number to yield a 32-bit multiplication product Y. It is appreciated that results of greater precision can be obtained using additional multipliers and suitable combination of input, weight and carry components.

Subcluster

Figure 8:
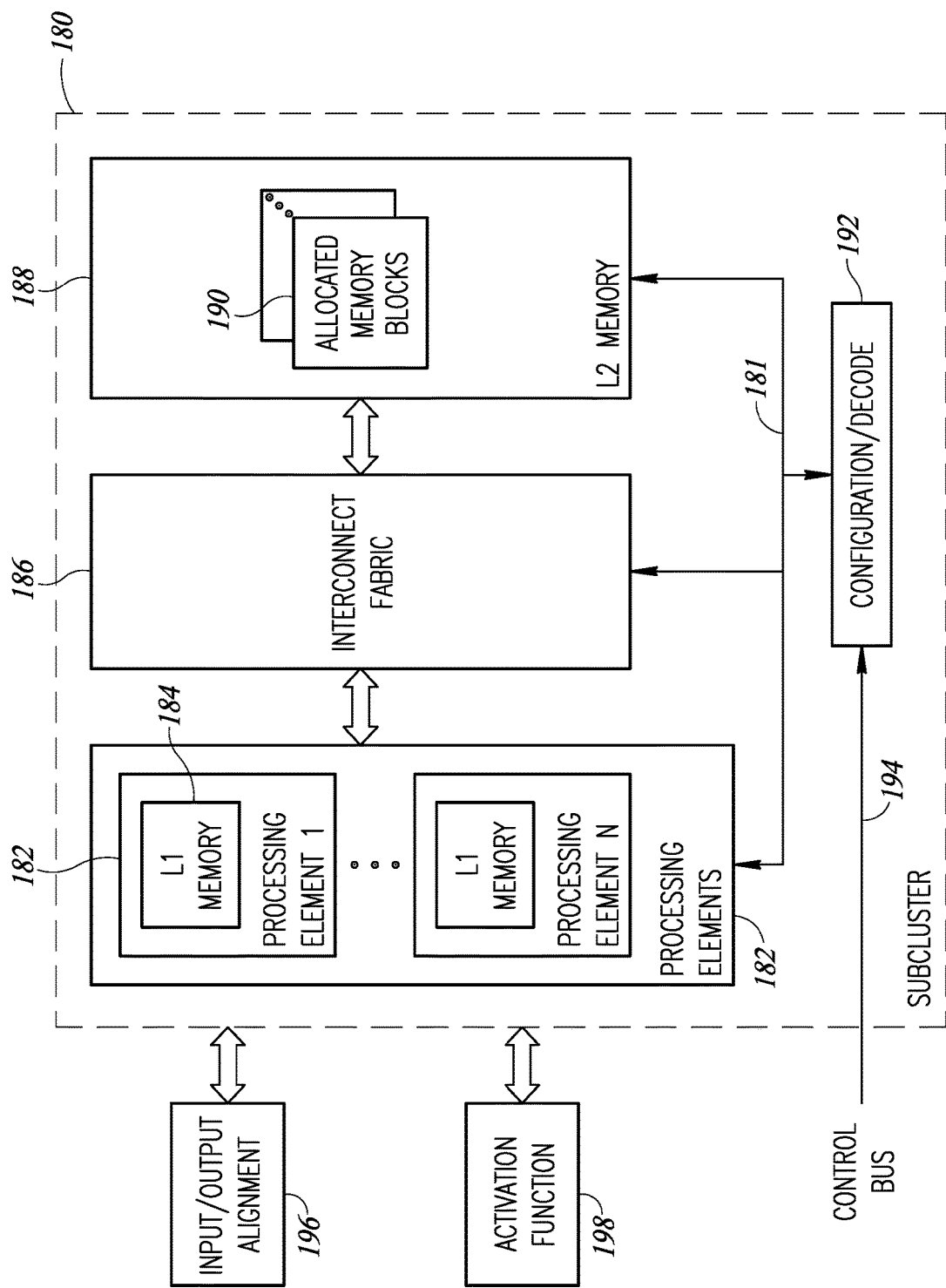
FIG. 8 is a high-level block diagram illustrating a first example subcluster in more detail.

A high-level block diagram illustrating a first example subcluster in more detail is shown in FIG. 8. The subcluster, generally referenced 180, comprises a plurality of N PEs 182, each individual PE 182 including local L1 memory 184, interconnect fabric 186, dedicated local L2 memory 188 portioned into a plurality of allocated memory blocks 190, configuration and decode block 192, and control/data signals 181. The configuration/decode circuit 192 receives instructions from an external control bus 194. Each subcluster 180 also communicates with input/output alignment circuit 196 and activation circuit 198 which in the example embodiment presented herein are located in the cluster hierarchy level, as described in more detail infra.

In one embodiment, the function of the subcluster is to aggregate a plurality of N PEs, e.g., N=64. All PEs in a subcluster belong to the same layer of a neural network which greatly simplifies the control logic required. For example, apart from a static configuration a priori, control of cycle-by-cycle operation is not needed.

In addition, the subcluster encapsulates the next level of memory hierarchy, i.e. the L2 memory layer that stores interlayer and intermediate results. In one embodiment, it also includes the activation function circuits (i.e. represented by σ in Equation 2 supra). For efficiency, however, the example NN core moves the activation function to the cluster level. The activation function, regardless of its location receives the outputs of the neurons and is triggered once per N multiply and accumulate operations. Note that the number and location of the activation function circuits are selected to reflect optimal utilization of hardware.

Several features of the subcluster include: (1) a distributed control scheme to manage memory access; (2) dynamic allocation of L2 memory for weights and intermediate results; (3) inherent intermediate results shuffling support to seamlessly augment L1 memory; (4) layer-centric information and diagnostics storage; (5) layer-centric pre-processing; (6) layer-centric post-processing; and (7) in-layer split support (e.g., for quantization segmentation).

Figure 9:
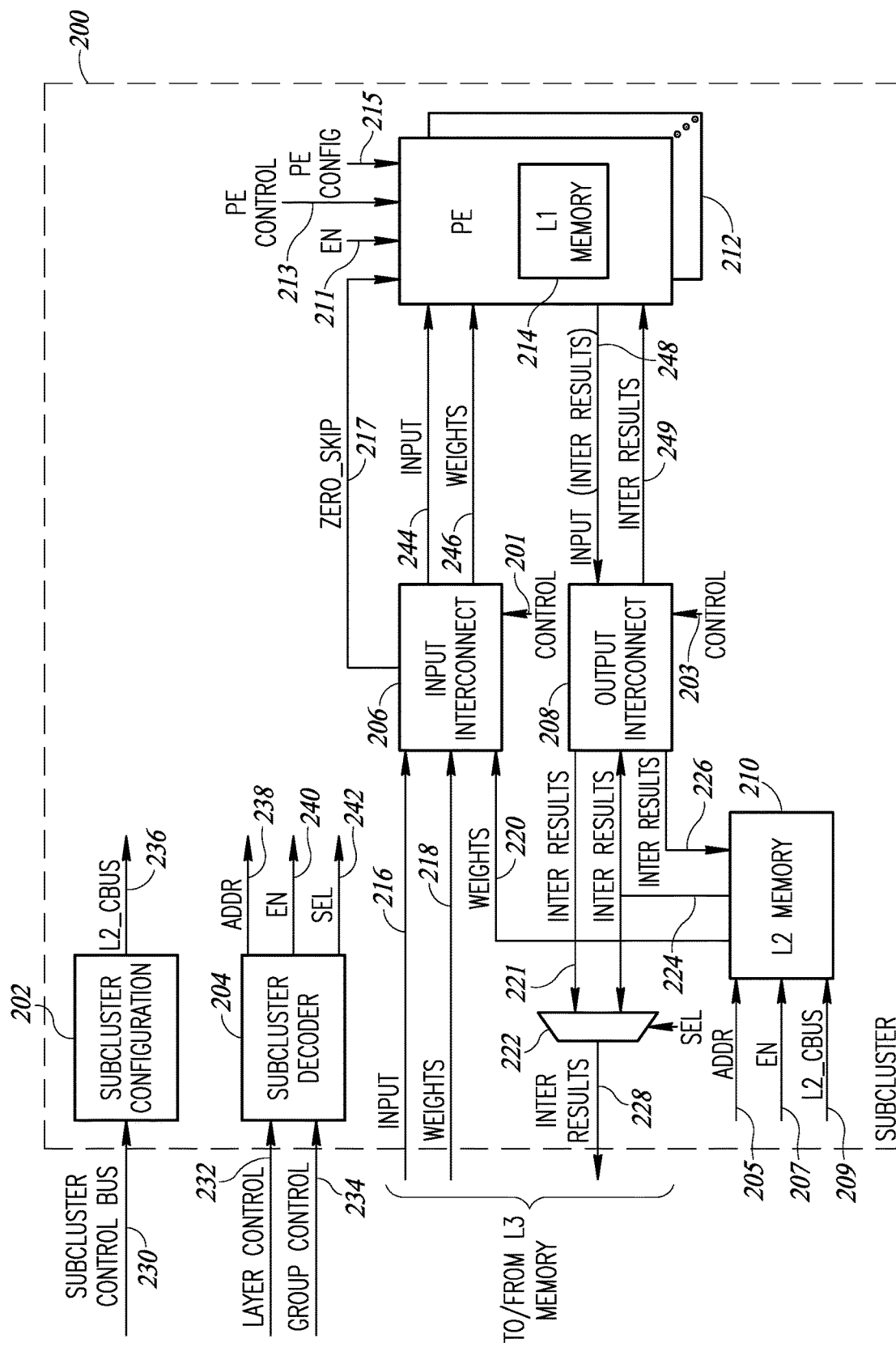
FIG. 9 is a high-level block diagram illustrating a second example subcluster in more detail.

A high-level block diagram illustrating a second example subcluster in more detail is shown in FIG. 9. While FIG. 8 reflects a mostly logical view of the subcluster, FIG. 8 reflects a more physical view. The subcluster, generally referenced 200, comprises dedicated local L2 memory 210, a plurality of N PEs 212, each with its own L1 memory 214 and receiving enable EN 211, PE control signal 213, and PE configuration signal 215, input interconnect 206, output interconnect 208, subcluster configuration 202 which receives instructions from the subcluster control bus 230 and outputs L2_cbus 236, and subcluster decoder 204 which receives layer control 232 and group control 234 and outputs address ADDR 238, enable EN 240, and select SEL 242.

In operation, input data 216 and weights 218 are provided from the L3 memory at the cluster level to the input interconnect 206 in accordance with control signal 201. The input interconnect feed input data 244 and weights 246 to the PEs 212. A zero_skip signal 217 notifies the PEs that either the input data or weights have zero values and thus a multiply and add operation are not needed. Note that weights 220 may also come from local L2 memory 210, which receive address ADDR 205, enable EN 207, and control L2_cbus 209.

Once the neurons in the PEs have accumulated the required calculations for a particular layer, the contents of the neurons, now representing intermediate results 248, are read out and output to the output interconnect 208 via control signal 203. Intermediate results can then be written to local L2 memory via path 226 or written to L3 memory via path 221, multiplexer 222, and path 228. In addition, intermediate results 224 can be read from L2 memory and either transferred to L3 memory via multiplexer 222 or to the output interconnect which then forwards it to the PEs via path 249.

Thus, each subcluster comprises flexible and programmable pathways for feeding input data and weights to the neurons in the PEs as well as steering intermediate results from the neurons to and from either L2 or L3 memory.

In one embodiment, a subcluster is dedicated to the execution of a single ANN layer or a portion of it. Its function is to receive external inputs from L3 memory, perform multiply and adds with weights from either local L2 or external L3 memory, store intermediate results (also referred to as 'contexts') in PE L1 memory (or in local L2 memory when L1 memory is not sufficient), and finally send the results to the external activation function for normalization and activation.

The subcluster decoder 204 functions to combine static input from the subcluster configuration 202 with dynamic input, both the common layer control and the timing group control. The state it stored includes counters which hold the following addressing: (1) weights read/write address; (2) contexts read address; (3) contexts write address; (4) activation source address (which PEs output for reading).

The input interconnect is operative to (1) selects between external weights (i.e. L3 memory) or local weights (i.e. from L2 memory); (2) select the width of the weights memory, i.e. the number of weights selected and the depth of the memory where the maximum width allows all PEs to receive a different weight from L2 memory, or from L3 external memory; (3) select the weights to pass to the PEs from the selected weights source (using the MSBs of the address); select the width of the input bus; and (4) select the inputs to pass to the PEs from the selected input source (using the MSBs of the address).

Note that the L2 memory 210 is used to store both weights and contexts in the same block. The weights addresses start from zero and count upwards while the contexts addresses start from the end of the memory. It is the responsibility of the control plane to prevent overflows.

Cluster

Figure 10:
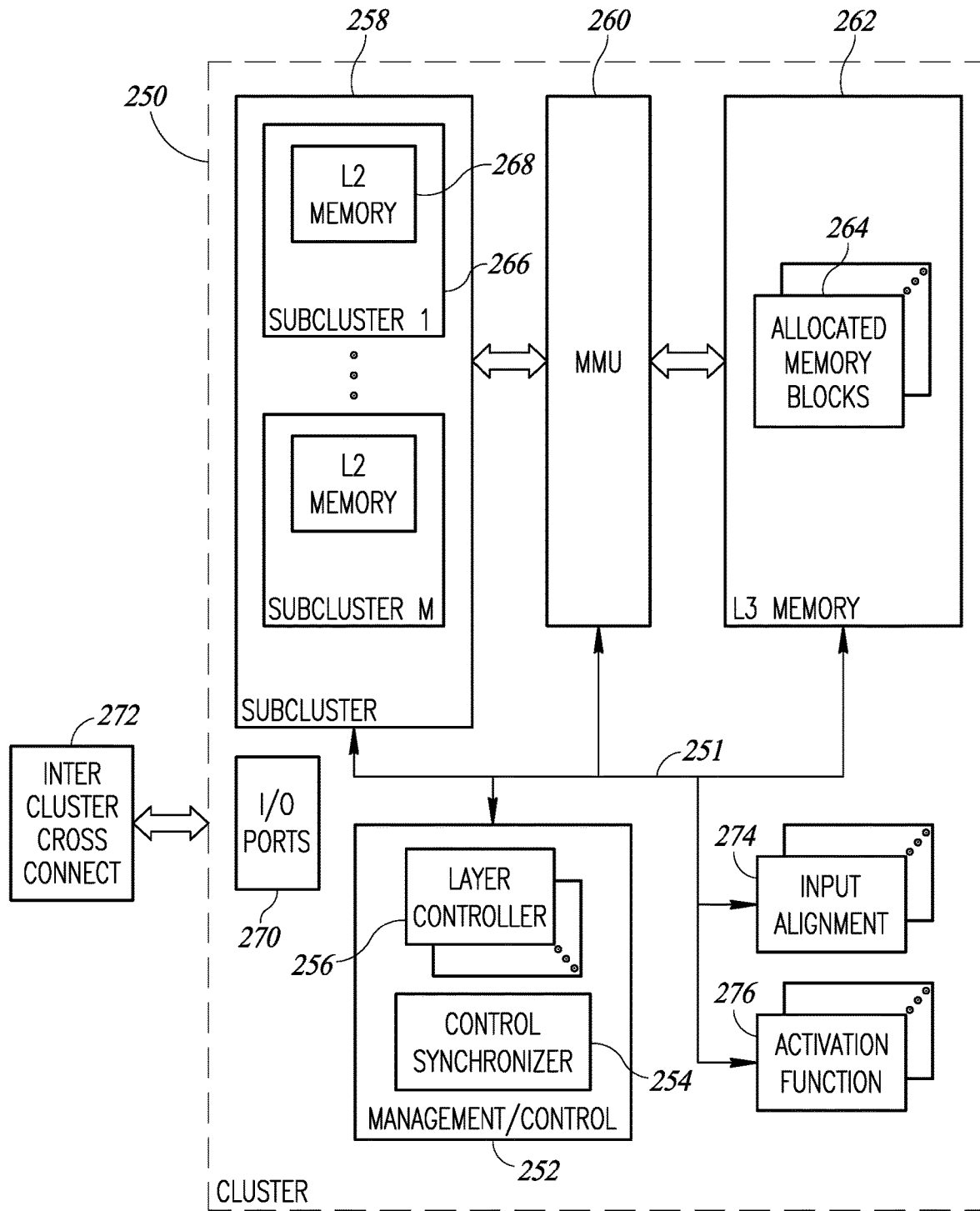
FIG. 10 is a high-level block diagram illustrating a first example cluster in more detail.

A high-level block diagram illustrating a first example cluster in more detail is shown in FIG. 10. The cluster, generally referenced 250, comprises a plurality of M subclusters, each subcluster 266 having its own L2 memory 268, dedicated local L3 memory 262 portioned into a plurality of allocated memory blocks 264, memory management unit (MMU) 260 adapted to interface L3 memory to the subclusters, management and control block 252 including control synchronizer 254 and a plurality of layers control circuits 256, a plurality of input aligners 274, and a plurality of activation function circuits 276. Input/output (I/O) ports 270 interface each cluster to an inter-cluster cross connect switch 272.

In one embodiment, the cluster is the next level of aggregation typically representing more than one neural network layer. It contains both the subclusters which contain the PE basic computational entities as well as the interconnect fabric amongst subclusters. This provides the NN core with the flexibility to represent different neural network models by controlling the connectivity between subclusters. The L3 memory 262 functions to store interlayer results in one or more allocated memory blocks 264.

Several features of the cluster include: (1) a distributed control scheme to manage memory access; (2) flexible configurable routing matrix to support representation of the total M subclusters into multiple layers; (3) dynamic allocation of L3 memory for weights and intermediate results (relatively infrequent); and (4) interlayer control to allow data flow throttling and load balancing.

Additional features include: (1) weight/input data balancing; (2) pre and post-processing blocks; (3) dynamic bus width and memory bit cell; (4) input data and weights interchangeability in the MMU; (5) the capability to provide event-driven behavior and pipelining; (6) control is decoupled from the data plane; (7) optional zero pipeline capability; and (8) balanced capability of runtime configuration modification.

Figure 11:
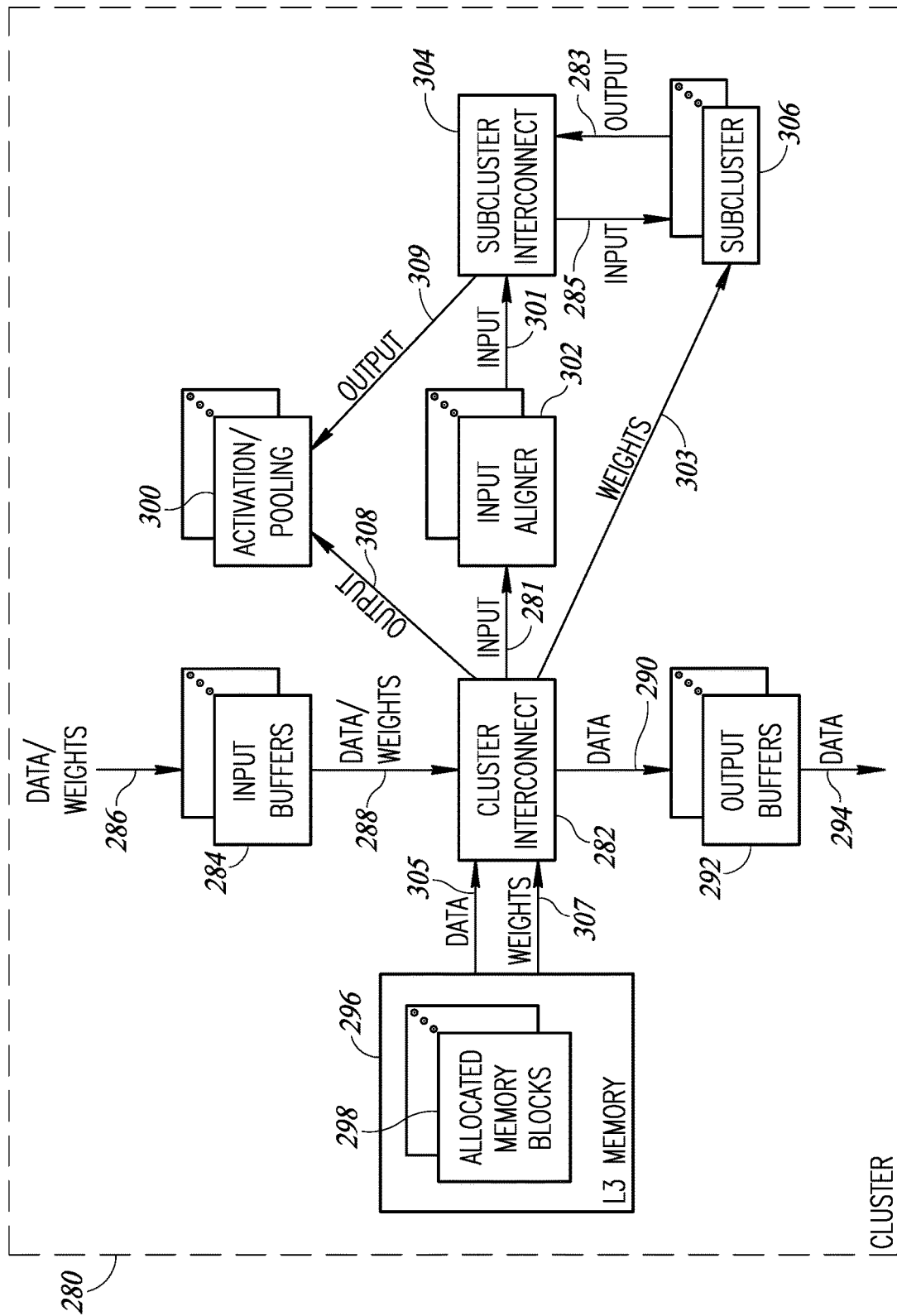
FIG. 11 is a high-level block diagram illustrating a second example cluster in more detail.

A high-level block diagram illustrating a second example cluster in more detail is shown in FIG. 11. The cluster, generally referenced 280, comprises a cluster interconnect circuit 282, input buffers 284, output buffers 292, plurality of M subclusters 306, subcluster interconnect 304, a plurality of activation function/pooling circuits 300, a plurality of input aligner circuits 302, and L3 memory 296 including a plurality of allocated memory blocks 298.

Input data and weights 286 are stored in the input buffers 284. From the input buffers the input data and weights 288 are input to the cluster interconnect 282. Input data 305 and weights 307 can also be written to and read from L3 memory 296. Input data 281 from the cluster interconnect is input to the aligner circuit 302 before being input to the subcluster interconnect 304. Input data 285 is fed to the subclusters 306 from the subcluster interconnect while output 283 from the subclusters is sent to the subcluster interconnect. The output 309 is input to the activation functions/pooling circuits 300 where the resulting output 308 is input to the cluster interconnect 282. Output data 290 is written to the output buffers 292. Data output 294 is then sent to other clusters or off-chip.

In one embodiment, the NN core supports multiple neural networks in parallel. Each cluster is operative to expose a control interface (e.g., clock, reset, enable, etc.), a configuration interface (memory like) and data interfaces (e.g., Advanced Extensible Interface (AXI)). Each cluster is adapted to implement one or more ANN layers, possibly from more than one ANN. The AXI interconnect exposes a control interface, and is used to connect the clusters, the DMA engine of an ARM controller in the NN core, and external ports. The ARM exposes an AXI interface through a DMA engine, control and configuration interfaces to the clusters and the interconnect, and external standard interfaces.

In one embodiment, clusters comprise: (1) configuration circuit; (2) memory management unit (MMU); (3) control interconnect; (4) trigger interconnect; (5) multiple subclusters; (6) multiple layer controllers (LCs); (7) multiple special purpose units; (8) multiple input units; (9) multiple output units; and (10) multiple memory blocks (i.e. L3 memory).

In one embodiment, the cluster supports multiple ANN layers in parallel, possibly from multiple ANNs. Note that a network layer can be implemented as a layer controller (LC) with one or more subclusters connected through the control interconnect, or one of the special units (special purpose, input or output) which contains the control within. Layers communicate data through the allocated memory blocks 298 in L3 memory 296, using signaling for flow control over the trigger interconnect, all defined by the configuration. The allocated memory blocks are also used as weight memory for the subclusters. All the control signals from the various layers to the L3 memory are translated by the MMU 260 from virtual to physical addresses using the configuration.

The MMU uses a sliding overlapping window mechanism between two communicating port groups, such as the read ports of the L3 memory and the input ports to the subcluster. Each subcluster can choose its input from a group of memory ports around its relative place in the list of subclusters. The window mechanism is described more detail infra.

In order to be able to utilize the pipeline in the NN core efficiently, the allocation of subclusters for each ANN layer is preferably proportional to the number of computations required in the ANN layer per feed. The allocation is determined by the control interconnect, which maps the subclusters to the LCs. The mapping is performed in two levels: (1) each subcluster is assigned to an LC through a sliding overlapping window mechanism (i.e. similar to that used in the MMU); and (2) the subcluster is assigned to a timing group inside the ANN layer. The timing groups spreads over time the actions requiring common resources, such as the write port to L3 used after activation. An ANN layer may comprise one or more timing groups, each containing one or more subclusters. The controls, which are common among all timing groups, are not passed through the second selection level, reducing multiplexing complexity of the circuit.

In one embodiment, the signaling mechanism between ANN layers is based on two bi-directional wires, which negotiate on the state of the dual buffer between them. Therefore, two bidirectional lines are required to connect two consecutive layers, i.e. each layer uses four bidirectional lines, two for the previous layer and two for the next layer. The two backward signals indicate whether the buffer ready for receiving new data for each one of the two buffers between the layers, and the two forward signals indicate whether the data in the buffer is valid for both buffers. To simplify the interface, the controller can flip the meaning of the two buffers (i.e. active and passive) in both directions, using a dedicated instruction.

Figure 12:
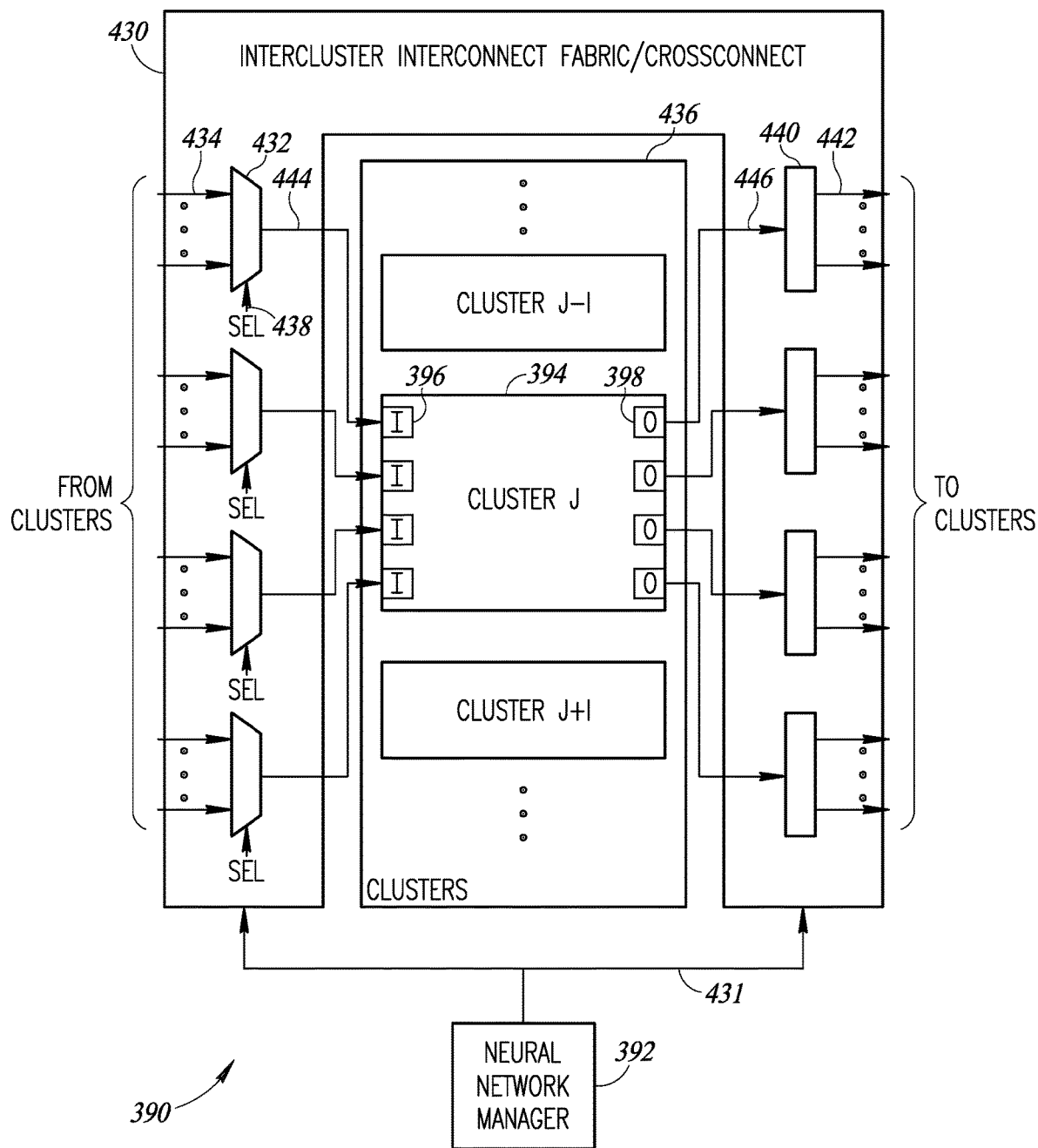
FIG. 12 is a high-level block diagram illustrating the inter-cluster crossconnect in more detail.

A high-level block diagram illustrating the inter-cluster crossconnect in more detail is shown in FIG. 12. The inter-cluster interconnect fabric/crossconnect, generally referenced 430, comprises a plurality of multiplexers 432 and splitters 440 that enable communications between clusters 436. In one embodiment, each cluster J comprises a plurality of ports, including input ports 396 and output ports 398. Four input and output ports are shown in the example but any number can be implemented.

Multiplexers 432 on the input side are controlled by SEL lines 438. The inputs 434 to each multiplexer comprise output lines from neighboring clusters, e.g., clusters J-2, J-1, J, J+1. The output 444 from each multiplexer is input to a separate input port 396 in a cluster. Similarly, splitters 440 on the output side generate outputs 442 that are fed to input lines of neighboring clusters, e.g., clusters J-1, J, J+1, J+2. The output 446 from each output port 398 of a cluster is input to a separate multiplexer 440. The NN manager 392 functions to control the configuration of the crossconnect 430. In one embodiment, the possible connections from one cluster to another is intentionally limited to reduce addressing and control routing and to improve bandwidth. For example, connections to cluster J via inputs 434 are limited to clusters J-2, J-1, J, and J+1, i.e. neighboring clusters (and itself) only. Similarly, connections from cluster J at the outputs 442 are limited to clusters J-2, J-1, J, and J+1. Note that although direct connections to other clusters are limited, any cluster is still able to communicate with any other cluster indirectly by traversing one or more intermediary clusters.

Note that the crossconnect occurs at all levels, starting at the cluster level, going through the top level of the NN processor core as well as device to device. The L clusters in the NN processor are connected using a cyclic interconnect fabric that enables output ports from one cluster to be mapped to neighboring clusters. The crossconnect is also capable of routing outputs of a cluster to itself (i.e. self-routing). Note that the extent of access in the crossconnect is configurable and permits a tradeoff between design complexity and accessibility. Note also that a 'scatter/gather' mechanism allows the outputs to be split (i.e. via splitters) into multiple replicas such that the same output feeds multiple inputs in parallel. Control of the crossconnect is provided by NN manager 392 via control lines 431.

Sliding Overlapping Memory Windowing

Figure 13:
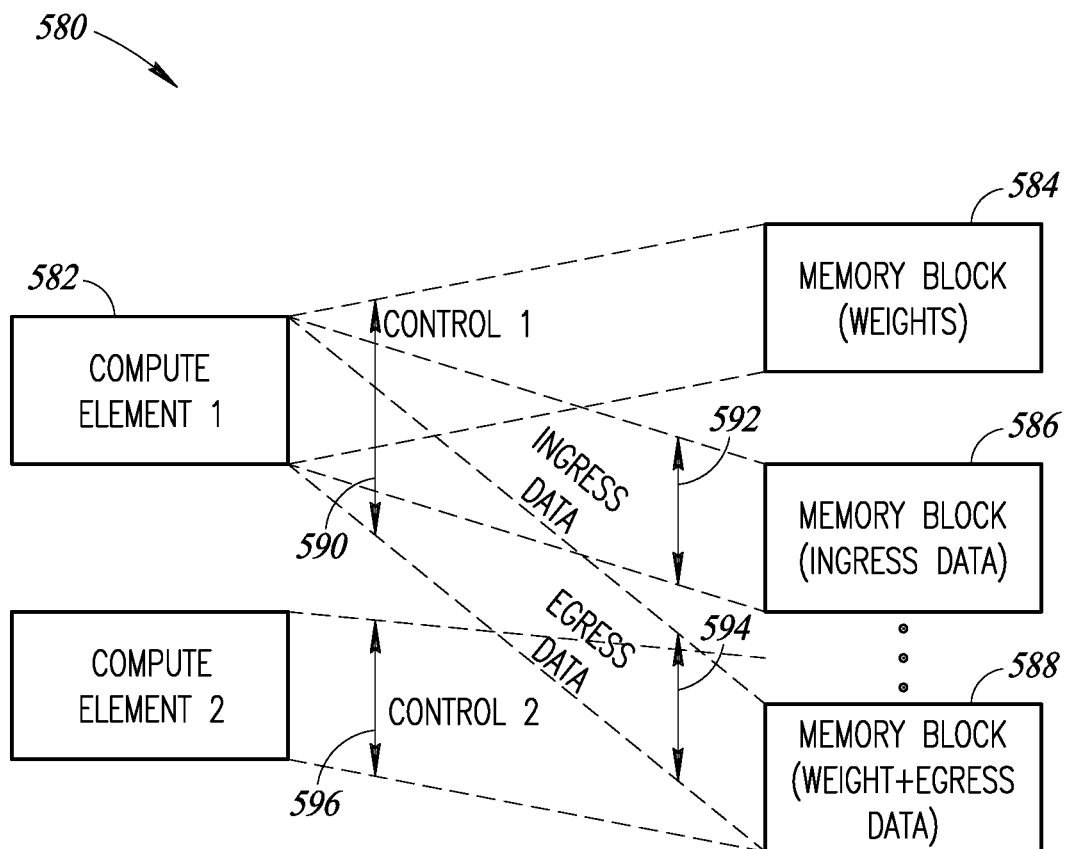
FIG. 13 is a diagram illustrating a first example memory windowing scheme.

A diagram illustrating a first example memory windowing scheme is shown in FIG. 13. To maintain flexibility, each consumer of memory in the processor has the ability to access different memory segments for the exchange of data. The term memory windowing refers to a scheme whereby a computing element or entity is given access only to a certain subset of available memory resources rather than a much wider range of memory resources. Limiting access to memory by the compute elements using a memory windowing scheme significantly improves the available bandwidth while greatly reducing the required address and control routing. Note that the memory fabric can dynamically rearrange the memory windowing scheme whereby the memory resources accessible by compute elements is programmable and configurable (e.g., at compile time, runtime, etc.). The windowing scheme is based on a scatter/gather technique described in more detail infra.

In the example shown, generally referenced 580, two compute elements 582 access memory resources 584, 586, 588. None of the compute elements have access to the entire memory, but rather only to a finite window. This is because the compute elements never require access to the entire memory fabric at once. Note that the windowing can different for control, ingress data, egress data, and weights. In addition, the windows typically overlap to enable sharing and pipelining. Also, the memory resources themselves is multipurposed where it can be used to store more than one type of information.

In the illustrative example, control for compute element 1 spans memory blocks 584, 586, and 588, denoted by Control 1 arrow 590. Compute element 1 includes an ingress data window to memory block 586, denoted by Ingress Data arrow 592. Similarly, compute element 1 includes an egress data window to memory block 588, denoted by Egress Data arrow 594. The weights are stored in memory block 584 as well as in memory block 588 which also functions to store egress data. In similar fashion, the other compute elements include control, ingress, egress, and weight windows as well. For example, compute element 2 includes a control window 596 spanning memory block 588 as well as one or more other memory blocks (not shown).

Figure 14:
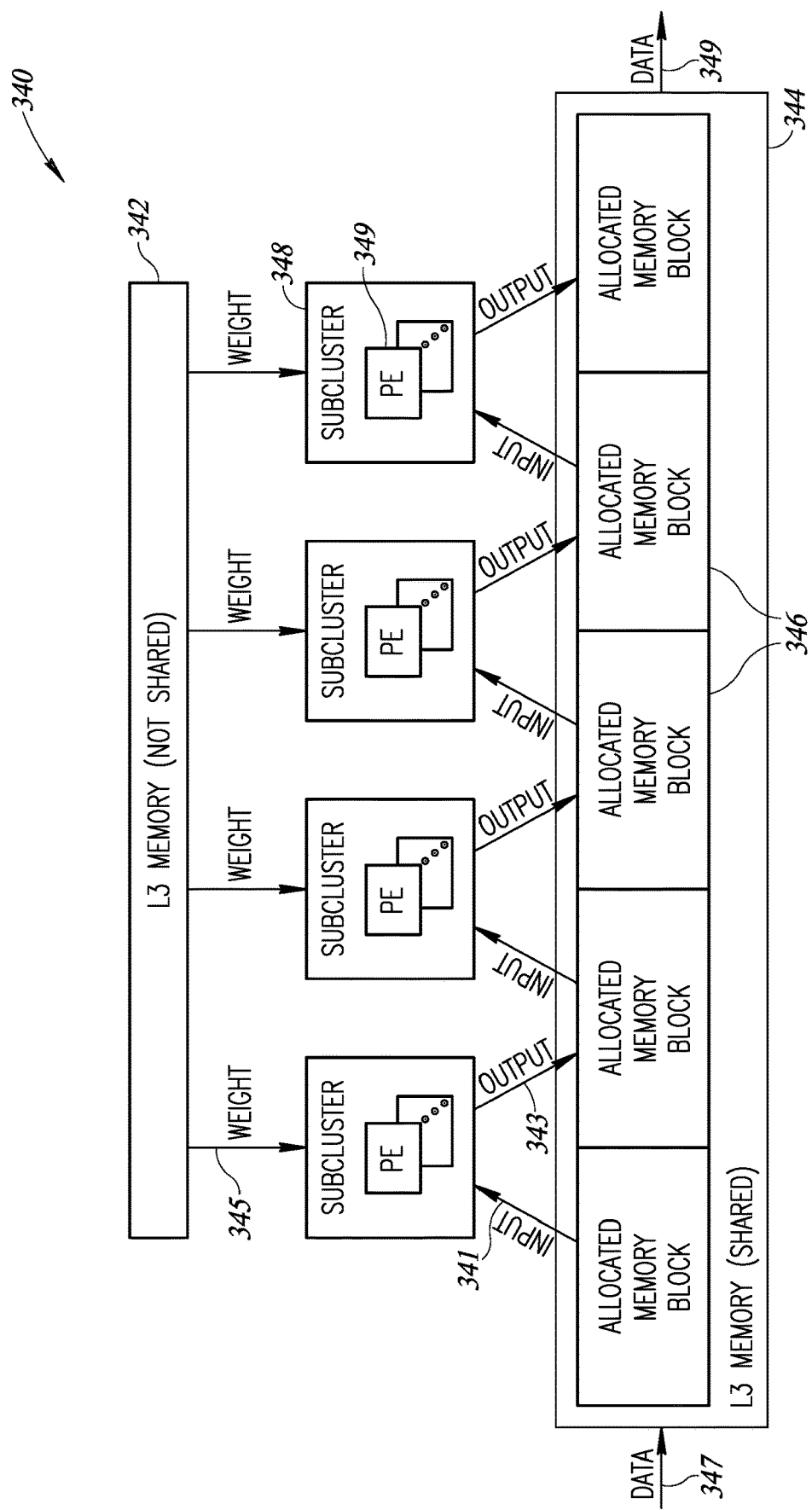
FIG. 14 is a diagram illustrating a second example memory windowing scheme.
Figure 15:
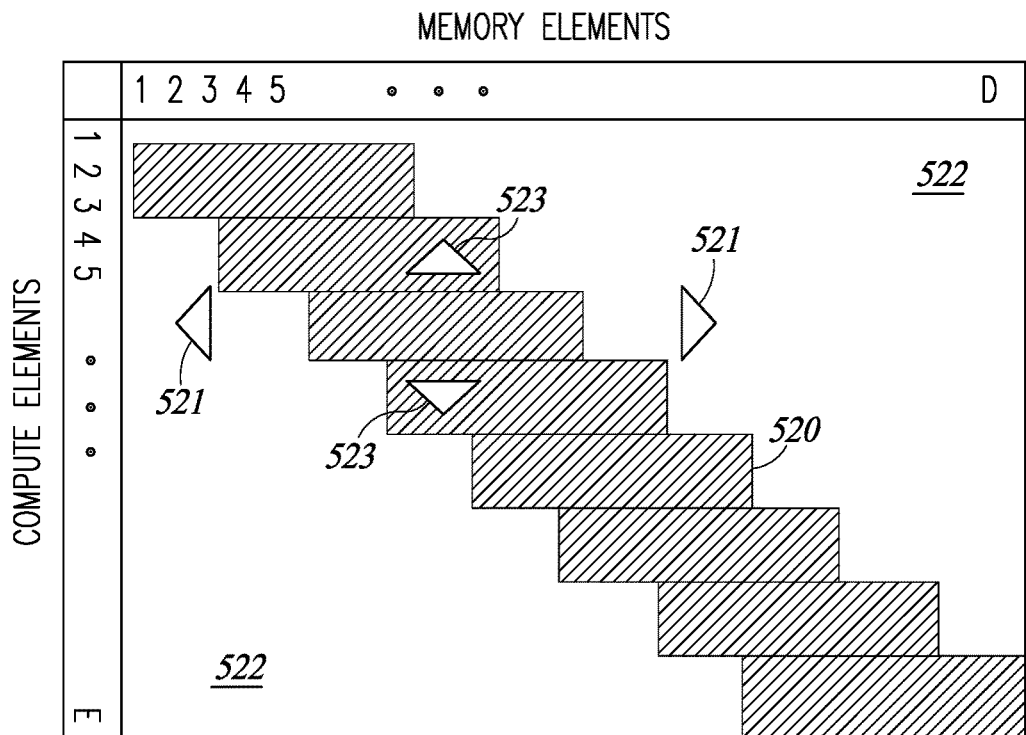
FIG. 15 is a diagram illustrating first example memory accessibility between compute and memory elements including window size and computer access configurability.
Figure 16:
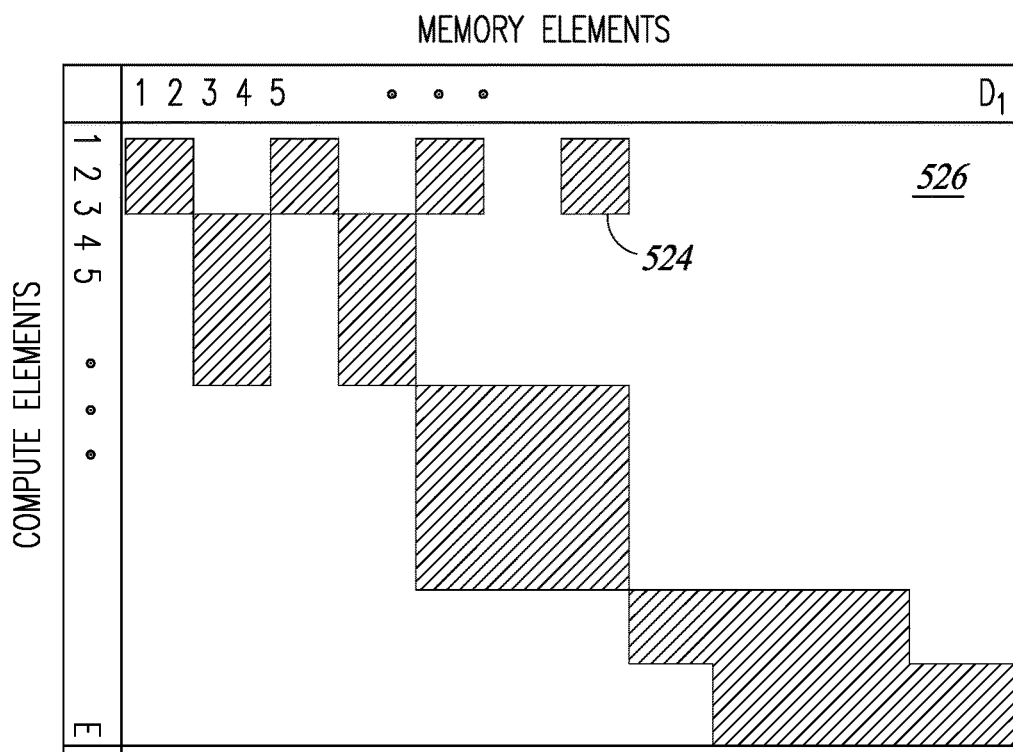
FIG. 16 is a diagram illustrating second example memory accessibility between compute and memory elements.
Figure 17:
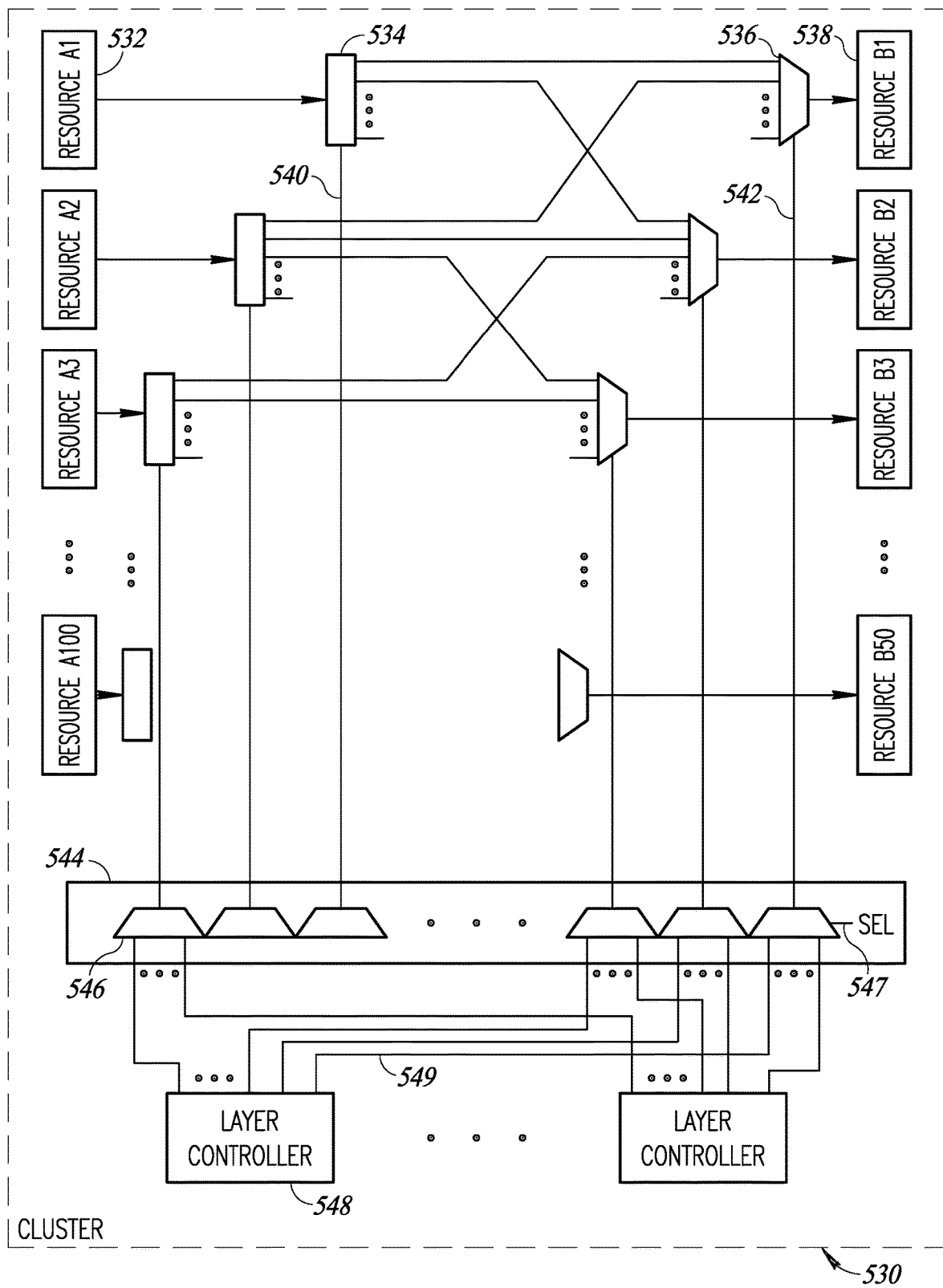
FIG. 17 is a diagram illustrating an example scatter/gather based resource windowing technique.

A diagram illustrating a second example memory windowing scheme is shown in FIG. 14. In one embodiment, the data that flows through the computing elements in the NN processor is pipelined, wherein PEs in the subclusters receive data as input and generate outputs which then serve as input for some other subcluster for subsequent computations. The memory in the various layers is localized as much as possible and leveraged to maximize accessibility and efficiency of the computing elements each layer serves. Since the computing elements only need to access a limited subset of the memory routing (i.e. address lines, control, etc.) can be limited to cross connect memory blocks and computing elements that are actually needed. FIGS. 15, 16, and 17 illustrate the configurability of the memory access windows through which the allocation of each resource is administered and configured and equipped with the resources that address the particular demand.

The window memory scheme, generally referenced 340, comprises a plurality of subclusters 348, each including a plurality of PEs 349, L3 memory (not shared) 342, and L3 memory (shared) 344. In operation, the subclusters receive weights information 345 from a portion of L3 memory that is not shared. Input data 341 to a subcluster is received from an allocated memory block 346 from a shared portion of L3 memory. The PEs within the subcluster process the weights and input data and generate outputs 343. The outputs, however, are written to a different (e.g., neighboring) allocated memory block (i.e. not the memory block the inputs were read from). These outputs are then read as inputs to another subcluster (e.g., neurons in a subsequent layer of the ANN). In this fashion, ANN input data 347 enters shared L3 memory, is read from allocated memory blocks, processed by the PEs in one or more subclusters, output to neighboring memory blocks, and after traversing through the various layers in the ANN is ultimately output as ANN output data 349 from shared L3 memory.

Note that the subclusters, however, do not have direct random access capability to L3 memory, but rather only to neighboring or close by allocated memory blocks. For example, subcluster H has access to subcluster H−2, H−1, H (itself), and H+1 subclusters. This greatly reduces the addressing and control routing requirements for memory access. Thus, each subcluster only 'sees' a relatively small window of memory, just enough for its PEs to perform their function.

A diagram illustrating first example memory accessibility between compute and memory elements window size and computer access configurability is shown in FIG. 15. This diagram illustrates the memory windowing scheme whereby compute elements as well as memory elements have limited access to each other. For example, consider memory elements 1 through D and compute elements 1 through E. The hatched blocked area 520 represents the resources accessible by each. Thus, the compute elements 1 through 3 can only access memory elements 1 through 12. Similarly, memory elements 1 through 12 can only connect to compute elements 1 through 3. As shown, the memory elements accessible to the compute elements form sliding access windows that overlap one another. The access windows have a size (i.e. span) and specific connectivity that can be dynamically configured and not hardwired or fixed. A key feature is that any single compute element does not have random access to the entire memory. Rather, each compute element can only access a portion of the memory elements, e.g., neighboring memory elements or those close by. The non-accessible portion of memory for the compute elements is represented by the white area 522.

Note also that the number of compute elements accessible by memory is programmable and configurable as represented by the vertical arrows 523. Similarly, the number of memory elements accessible by a compute element is programmable and configurable as represented by the horizontal arrows 521.

A diagram illustrating second example memory accessibility between compute and memory elements is shown in FIG. 16. This diagram illustrates that access between compute and memory elements is not limited to contiguous windows. Rather, access may be discontinuous which is achieved in one embodiment using virtual to physical mapping. Regardless of the means, the accessible regions have rectangular shapes of limited and predefined range indicating that access between compute and memory elements is limited and finite i.e. no such region covers the entire address space.

A diagram illustrating an example scatter/gather based resource windowing technique is shown in FIG. 17. For illustration purposes, a portion of an example cluster 530 is shown. The technique, however, is not limited for use in a cluster and can be used anywhere in the NN processor. Consider two resources A 532 and B 538, where the resource may comprise any desired circuit, e.g., compute, memory, control elements, etc. To limit access, the output of each resource A 532 is input to a splitter 534 and the input to each resource B 538 is the output of a multiplexer 536. Rather than provide full mesh connectivity, the outputs of the splitters only go to a limited number of multiplexer inputs, thus providing limited connectivity. For example, the output of resource A1 is input to resources B1 and B2 only. Similarly, the output of resource A2 is input to resources B1, B2, and B3 only and the output of resource A3 is input to resources B2 and B3 only. In this manner, each B resource only connects to a small window of A resources. Thus, access between the 100 A resources and 50 B resources (the number of resources is only an example) forms a sliding window where a finite number of A resources connect with a finite number of B resources on an overlapping sliding basis.

Control of the splitters and muxes is provided by the layer controllers (LCs) 548. The control lines 549 output of the LCs are input to a series of muxes 546 in a control fabric 544 that select one of the controls from the LC in accordance with a SEL line 547 which originates in the LCU and may be further decoded within the LC. The control of the muxes 546 is programmable and configurable, such as at compile or run time, thereby achieving flexible mapping between the A and B resources.

In accordance with the invention, a feature of the memory access fabric of the NN processor is the ability to operate in substantially high parallelism. This is a virtue of the inherent separation of mappings between compute resources and the memory attached to them. For example, weights are connected explicitly only to the relevant subcluster. One exception, however, is the case where an allocated memory block is shared and a collision occurs. Although such an event is typically rare, the NN processor provides the capability to resolve the contention resulting from the collision. In one embodiment, memory contention is resolved at the control layer, where the two compute entities that share a common memory block handle collision avoidance at the signaling level as described infra. Note that backpressure is typically temporary and short lived, and the overall total bandwidth is guaranteed by the design of the NN processor.

Figure 18:
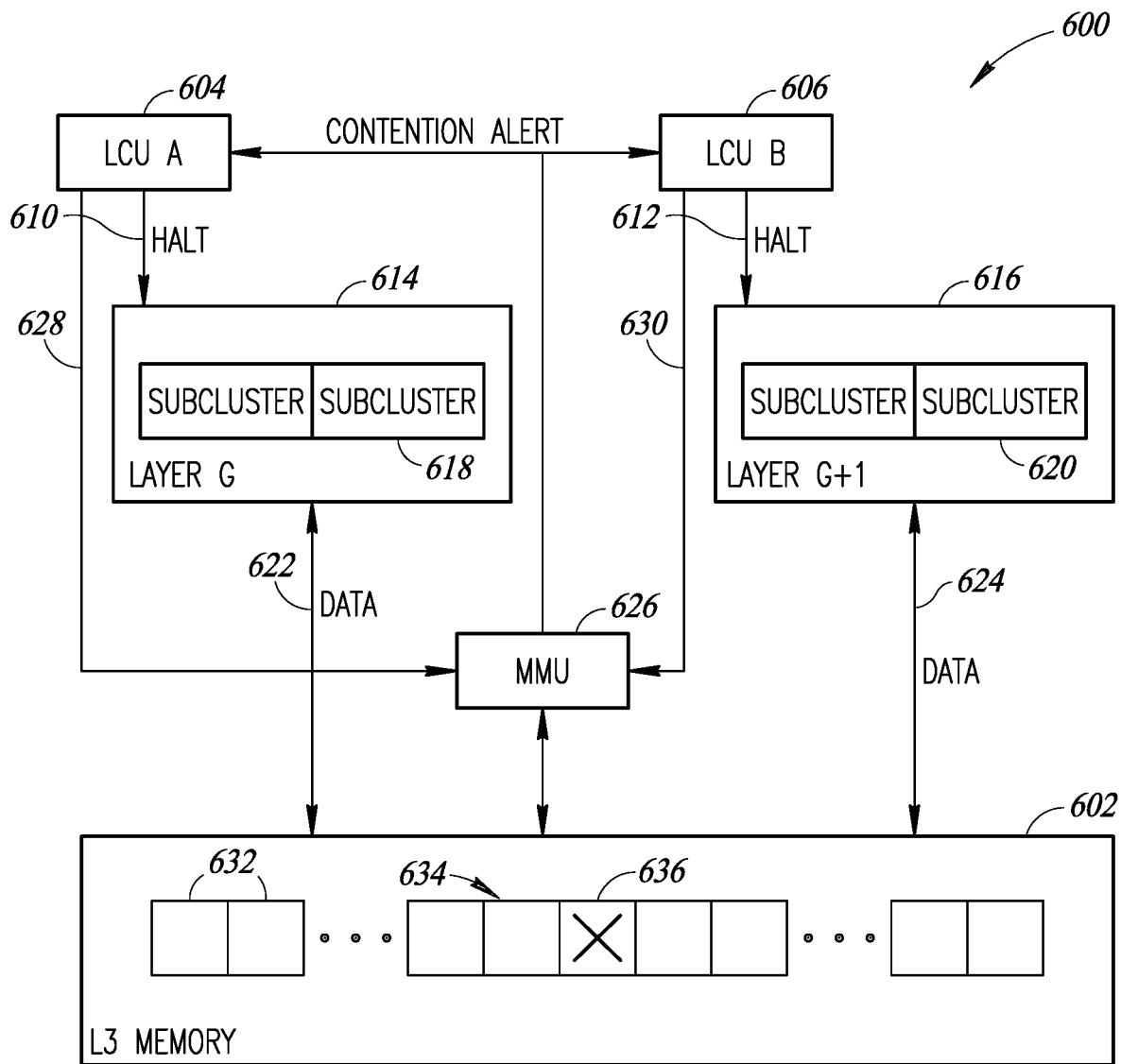
FIG. 18 is a block diagram illustrating an example memory contention resolution scheme.

A block diagram illustrating an example memory contention resolution scheme is shown in FIG. 18. Memory contention resolution circuit, generally referenced 600, comprises L3 memory 602 including a plurality of memory blocks 632, MMU 626, LCU A 604, LCU B 606, one or more subclusters 618 forming ANN layer G 614, and one or more subclusters 620 forming ANN layer G+1 616.

In this illustrative example, both layers G and G+1 of the ANN read and write data to and from memory blocks 634 in L3 memory. The output of layer G serves as the input to layer G+1. Occasionally, however, both layers may try to access the same memory block at the same time. This is indicated by the memory block 636 labeled with an 'X'. When contention for the same memory block occurs, the MMU 626 detects the event and generates a contention alert 608 to the LCUs (A and B in this example) in their respective LCs. In response to the contention alert, one of the LCUs generates a halt command 610, 612 that is input to the subclusters. The subcluster that receives the halt command inhibits access to the memory block in L3 memory until the read or write operation is complete.

Note that memory contention always occurs between ANN layers and not within a layer since within a layer, the subcluster making up the layer are configured such that contention for memory never occurs. Typically, contentions occur when one layer is writing while the other is reading. In response to the contention alert, either the write or the read operation can be inhibited. In one embodiment, the write operation is inhibited since the nature of ANNs is that write operations are far rarer events. In addition, inhibiting read operations would stall a significant portion of the data processing pipeline. Thus, write operations are inhibited rather than read operations. A halt signal (610 to layer G or 612 to layer G+1) is issued to the layer to be inhibited. Note also that the decision whether to inhibit write or read operations is programmable and configurable a priori at compile time.

Layer Controller

Figure 19:
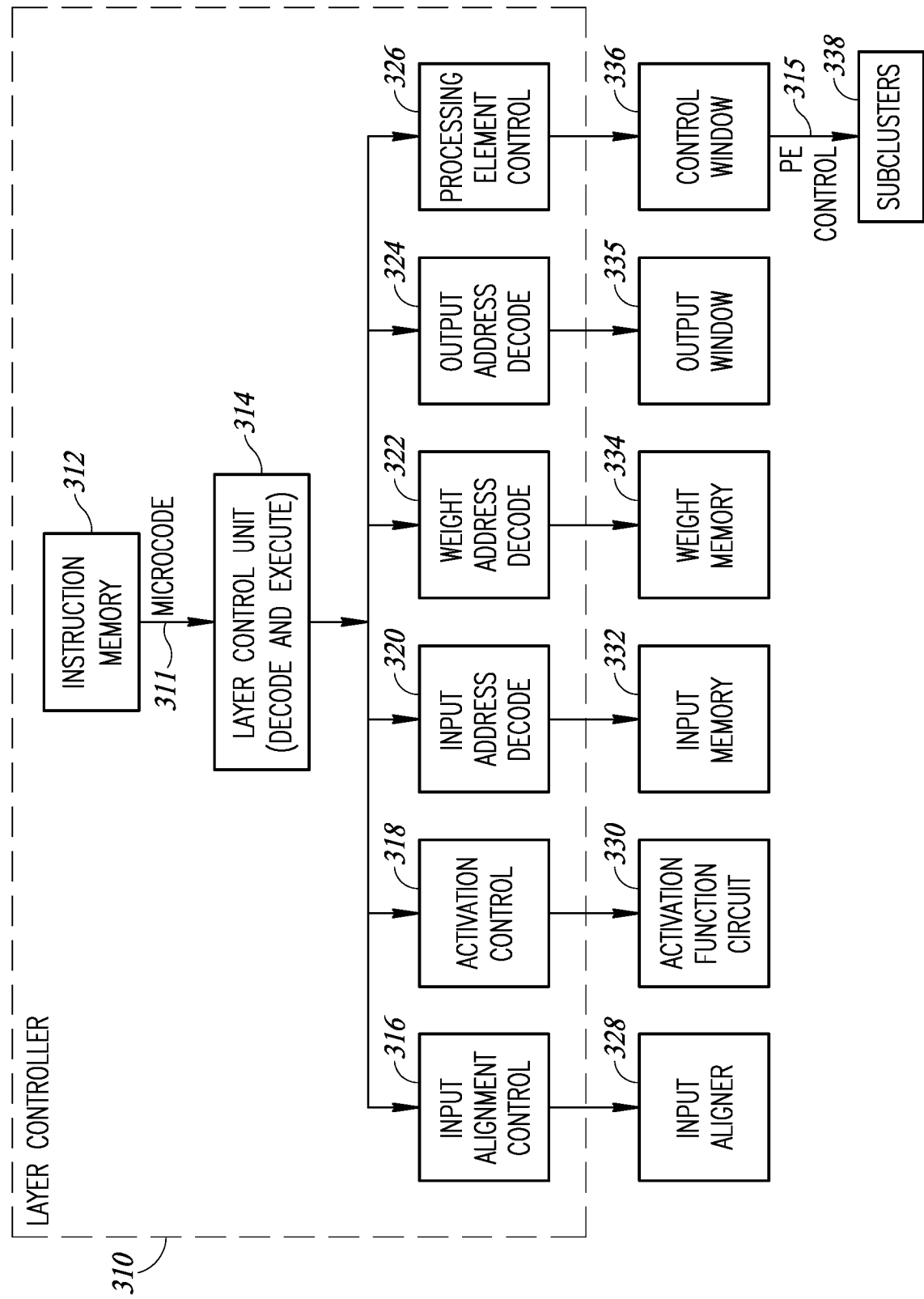
FIG. 19 is a high-level block diagram illustrating a first example layer controller in more detail.

A high-level block diagram illustrating an example layer controller in more detail is shown in FIG. 19. The layer controller (LC), generally referenced 310, comprises a layer control unit (LCU) 314 responsible for decoding and executing microcode instructions 311 read from instruction memory 312. Depending on the instruction one or more command signals 313 are output to various control and decode blocks, including input aligner control 316, activation control 318, input address decoder 320, weight address decoder 322, output address decoder 324, and PE control 326. The control and address signals from these six blocks are respectively output to input aligner 328, activation function circuit 330, input memory 332, weight memory 334, output window 335, and control window 336. PE control signals 315 are output from the control window 336 to the PE circuits in the subclusters 338.

A high-level block diagram illustrating the layer controller interface to L3 memory and subclusters in more detail is shown in FIG. 20. The example cluster, generally referenced 640, comprises L3 memory 644, LC 642, plurality of subclusters 662, post processor 666, and windowing for control, write data, read data, and weights as described supra in connection with FIG. 17. The LC 642 comprises LCU 656, one or more preprocessors 652, instruction memory 654, one or more decoder circuits 658, and MMU 660.

In particular, control windowing includes circuit 674 and control lines 684; weight windowing includes circuits 646, 648, and signal lines 650; ingress data windowing includes circuits 676, 678, 672, and signal lines 690, 692; egress data windowing includes circuits 680, 682, 668, and signal lines 686, 688. Note that the ingress and egress windows accessing L3 memory overlap as indicated by the dashed lines. Control for the windowing (i.e. selects for the splitters and muxes) is provided by the memory window control (MWC) signals 670 generated by the LCU and decoders and input to the window circuits 674, 646, 648, 676, 678, 672, 680, 682, and 668.

In operation, ingress data is read from L3 memory and input to the preprocessing circuits 652. These circuits function to optionally reshape the data, performing manipulations on the input data, e.g., shifting, etc. The preprocessed data is output to the subclusters where the PEs 664 multiply the input data with weights also read from L3 memory. Intermediate results, i.e. contexts, are output from the subclusters to post processing circuitry 666 through the memory windowing. The post processing circuit is part of the data processing pipeline and is operative to apply the activation function and optionally alignment.

Note that each LC is assigned one or more subclusters that make up a layer in the ANN. Each cluster comprises a plurality of LCs (e.g., eight). Thus, the subclusters 662 shown are only a subset of the M subclusters within each cluster, where each LC controls a different set of subclusters that can be selected using the same windowing concept described above. In addition, the N PEs within a subcluster are not split, meaning all PEs in a subcluster are controlled as a single unit. This simplifies the control of the computing elements and allows for relatively lean control signaling as only a few control lines control large numbers of PEs and ultimately neurons. Similarly, each of the decoder circuits 658 is configured to control a different set of memory blocks. The control signals 698, which in one embodiment are encoded, are generated by the LCU and input to the decoders circuits 658. The LCU itself is controlled by the contents of the instruction memory 654. The execution of each instruction results in the generation of encoded control signals which are then decoded by the decoders and output to the computing elements via the control window circuit 674. Note that in addition to the control signals that control the computing elements in the subclusters, the LCU also generates the control signals (i.e. MWC select controls) for controlling the control window as well (along with the weight, ingress and egress data windows). Once configured (as compile time), the control signals, weights, ingress and egress data are routed statically. The MMU 660 generates the control signals for the L3 memory windowing and functions to perform the virtual to physical mapping. It also functions to generate a contention alert 694 in response to a memory contention event between two layers in the ANN. As described supra, the LCU resolves the contention event by issuing one of the layers a halt command.

Figure 21:
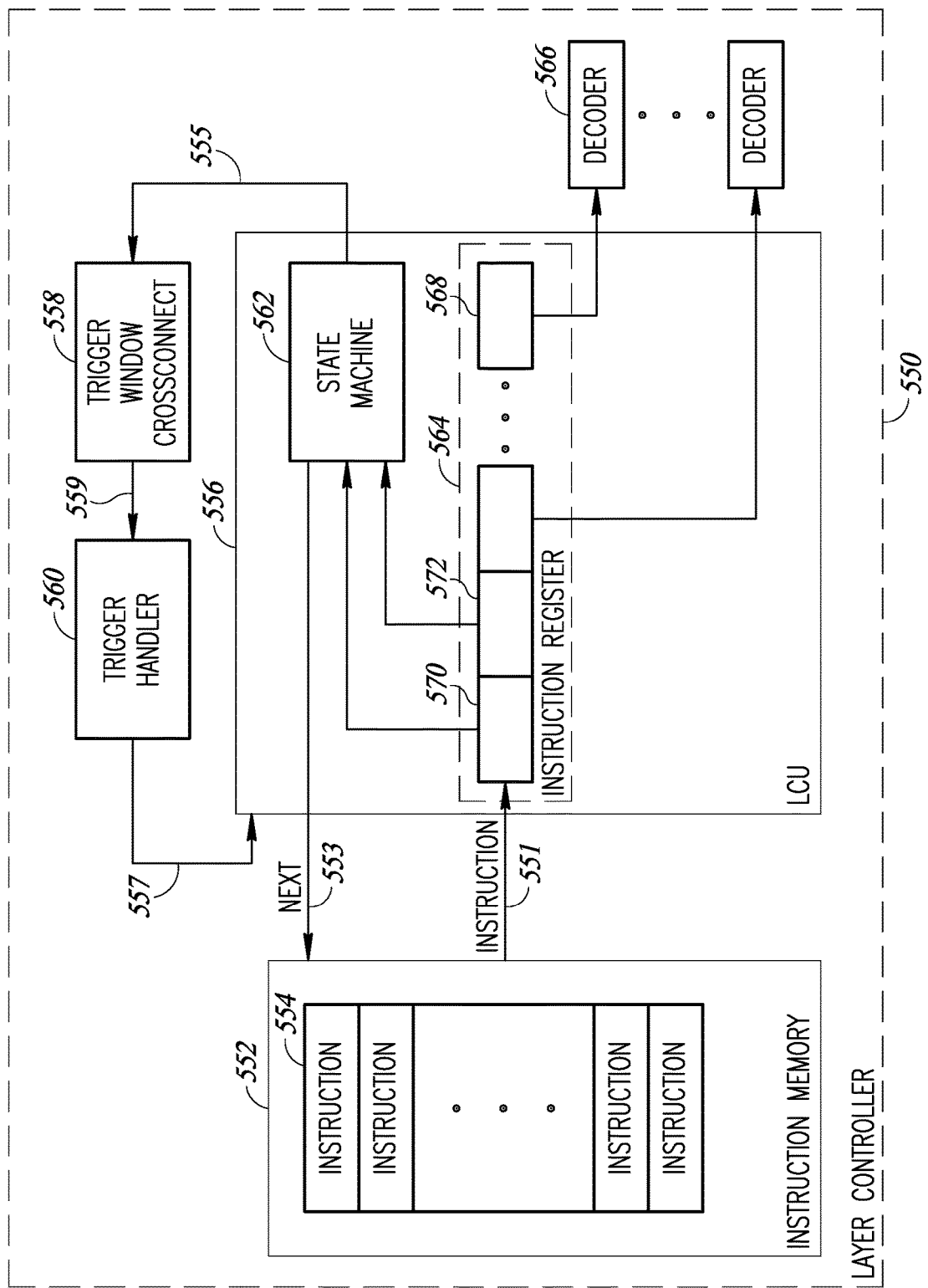
FIG. 21 is a high-level block diagram illustrating a second example layer controller in more detail.

A high-level block diagram illustrating a second example layer controller in more detail is shown in FIG. 21. The example LC, generally referenced 550, comprises instruction memory 552 including a plurality of instructions 554, LCU 556, instruction decoders 566, trigger window crossconnect 558, and trigger handler 560. The LCU 556 comprises a state machine 562, and instruction register 564.

In operation, instructions 551 are read from instruction memory into the instructions register 564 in the LCU where they are decided and executed. The one or more portions 568 of the instruction that are configured to directly control hardware are sent to the one or more decoders 566 for decoding. The output of the decoders comprises direct control signaling that is sent to the subclusters to control the internal PE operation as shown and described supra in FIG. 20. The other portions 570, 572 of the instruction control the logical state of the LCU and are input to the state machine 562. These portions control looping and branching, for example. A next 553 command causes the next instruction from the instruction memory 552 to be read into the LCU for execution.

In one embodiment, one or more triggers 555 are generate by the state machine and input to the trigger crossconnect 558. The trigger function is similar to an 'interrupt' where activity can be halted and delayed until the occurrence of some event. Trigger signals are used to trigger activity. Triggers can be issued to activate other triggers. They represent an asynchronous mechanism that functions to synchronize activities in the NN processor. For example, a trigger can be issued to halt processing until a buffer is written to, or until a layer completes processing (or otherwise function as an indication that some event has taken place and further processing can commence).

In addition, a trigger can be issued to trigger activity in an LCU in a different LC. This process is termed a 'handover'. The handover mechanism can trigger activity from one LC to another, e.g., a trigger can be used when one ANN layer completes and sends results to another layer in the ANN. The trigger window crossconnect, functions to steer output trigger signals 559 to the trigger handler in the appropriate LC where they act to control activity in the LCU via signals 557.

Regarding the separation between data and control planes, in one embodiment, the microcode that governs the control plane executes in the LCs and does not have any access to data. An additional capability of the microcode machine in the LCs is that there are no conditional statements or conditional branching. This is advantageous for data pipelining since the need to manage branch prediction or other pipeline overhead is avoided. Execution is thus fully predictable. This is in contrast to typical prior art microcode that can branch causing execution to be dependent on the input. In the NN processor, once microcode executes, the evolution of data flow is fully predictable, i.e. the generation of each control signal can be predicted at every instance in time.

In one embodiment, each microcode instruction executed in the microcode-based controllers is operative to generate control signaling for compute resources and memory resources. In other words, the microcode does not carry any 'overhead' as there are no operations that are responsible for internal handling that do not also apply actual control signaling to the outputs. Thus, no microcode instruction operations are wasted on internal housekeeping of the microcode machine (with the sole exception of a 'NOP' operation).

Another capability of the microcode machine in the LCs is triggered operation. Although branching is not supported, execution flow can be triggered by external signals that indicate start/stop of execution to enable data pipeline handshakes, e.g., handoffs from one LCU to another.

Yet another capability of the microcode machine in the LCs is repeated operation support whereby inline repetition of operations (i.e. loops that run inline) are supported such that repeated operations can be indicated within the opcode itself thereby avoiding unnecessary cycles for setting up and managing the loop, and related fetching. Note that this feature is useful for loops that have few operations compared to the overhead of loop management. The latter is very common in neural network operations, e.g., many multiple and accumulate (MAC) operations followed by activation. In a data pipeline machine, it is very important when the ratio between control and data is such that very little control defines the behavior of a relatively large data pipe.

For example, consider a conventional processor configured to perform 1000 multiply and accumulate (MAC) operations. Example pseudo code is provided in Listing 2 below.

| Listing 2: Example conventional processor pseudo code loop |  |
| --- | --- |
| Init: | Set count = 1000 |
| Start: | Multiply A, B => C |
|  | Add C, D |
|  | Decrement count by 1 |
|  | If count > 0 jump to Start |

In the above pseudo code, there are four opcodes in the loop (i.e. four cycles) two of which are operational, for a utilization of 50%. Assuming that this loop controls 1024 MAC circuits, this means that only 512 are effectively operating at full capacity.

In contrast, inline repetition is supported in the NN processor. In addition, there is zero overhead for internal control eliminating the requirement to have 'spare' opcodes, i.e. opcodes that are used just for internal management of the machine or housekeeping. The pseudo code of Listing 2 translates into the following pseudo code presented below in Listing 3.

Listing 3: Example NN processor pseudo code loop

```
Mul a, b => c; start loop
Add c, d; end loop, 1000 repetitions
```

As shown above, all loop information is embedded in the functional opcodes and MAC utilization increases to 100%.

It is noted that having a deep separation between control and data planes also functions to provide a degree of inherent immunity from control plane security hazards. This is because a common technique for hacking a device is to feed it data that interferes with the control plane. Since the two planes are strictly separate, interfering with one does not affect the other.

Compiler

Figure 22:
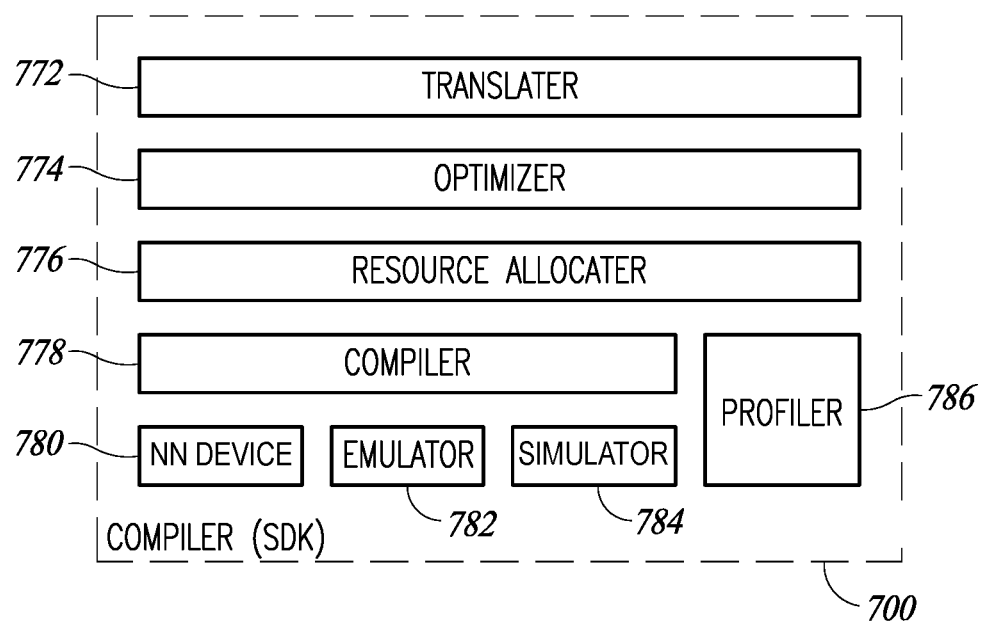
FIG. 22 is a high-level block diagram illustrating an example NN processor compiler/SDK.

A high-level block diagram illustrating an example NN processor compiler/SDK is shown in FIG. 22. The compiler, generally referenced 770, functions to configure the NN processor based on an input ANN model. It is executed in a process that executes off-chip as part of an external software tool chain used and initiated by a user. Typically, the compiler has knowledge of the NN processor, NN processor SoC or multiple NN processor SoCs that will be the target of the source ANN model.

In particular, the translator 772 functions to receive the user model and generate an intermediate format of the model. The optimizer 774 functions to perform model level optimizations, post-translation model adjustments for performance, and numerical adaptations to different bit widths. The resource allocator 778 allocates and assigns physical resources (e.g., compute and memory elements, etc.) in accordance with the intermediate model. The profiler 786 performs a performance evaluation, including for example, expected power consumption, throughput, latency, etc. The software emulator 782 functions to perform bit exact numerical emulation of the NN processor using the intermediate model output of the translator 772.

In one embodiment, several target options are provided to the user to implement the external tool chain. The three target options include (1) the NN Device 780, (2) emulator 782, and (3) simulator 784 which comprises a software model of the hardware that simulates NN device functionality. Thus, a user has the option of executing the tool chain either using the NN device itself, a hardware emulation of the NN device or a software simulation of the NN device.

Multiple Operating Granularity of the NN Processor and Related Memory/Latency Trade-Off A capability and advantage of the present invention is that the pipeline in the NN processor is able to operate at any desired granularity of any subset of the input where memory is traded off for latency and vice versa. More specifically, when the input data has some internal structure (e.g., frames of video and each frame is composed of multiple rows (or buffers, packets, etc.), the NN processor architecture can trigger the activity of a next layer at any aggregation from a single such row, buffer, packet, etc. multiples of thereof.

In the case of lower aggregation, additional intermediate result (i.e. contexts) storage is required to store the intermediate results. Latency, however, is minimal since subsequent processing elements are freed up for further processing earlier in the pipeline, which allows incoming traffic to be consumed but not become blocked. Thus, higher memory storage requirements are traded-off for lower latency of contexts.

On the other hand, in the case of higher aggregation, i.e. less context memory is desired or an ANN model that requires large numbers of contexts is to be implemented, a trade-off can be made where less context memory is used in exchange for buffer memory whereby additional buffering of the input is implemented resulting in a decrease of the number of contexts needed simultaneously at any one time, but with an increase in latency. In one embodiment, this trade-off is implemented by microcode in the LCs and is thus configurable and programmable.

Figure 23:
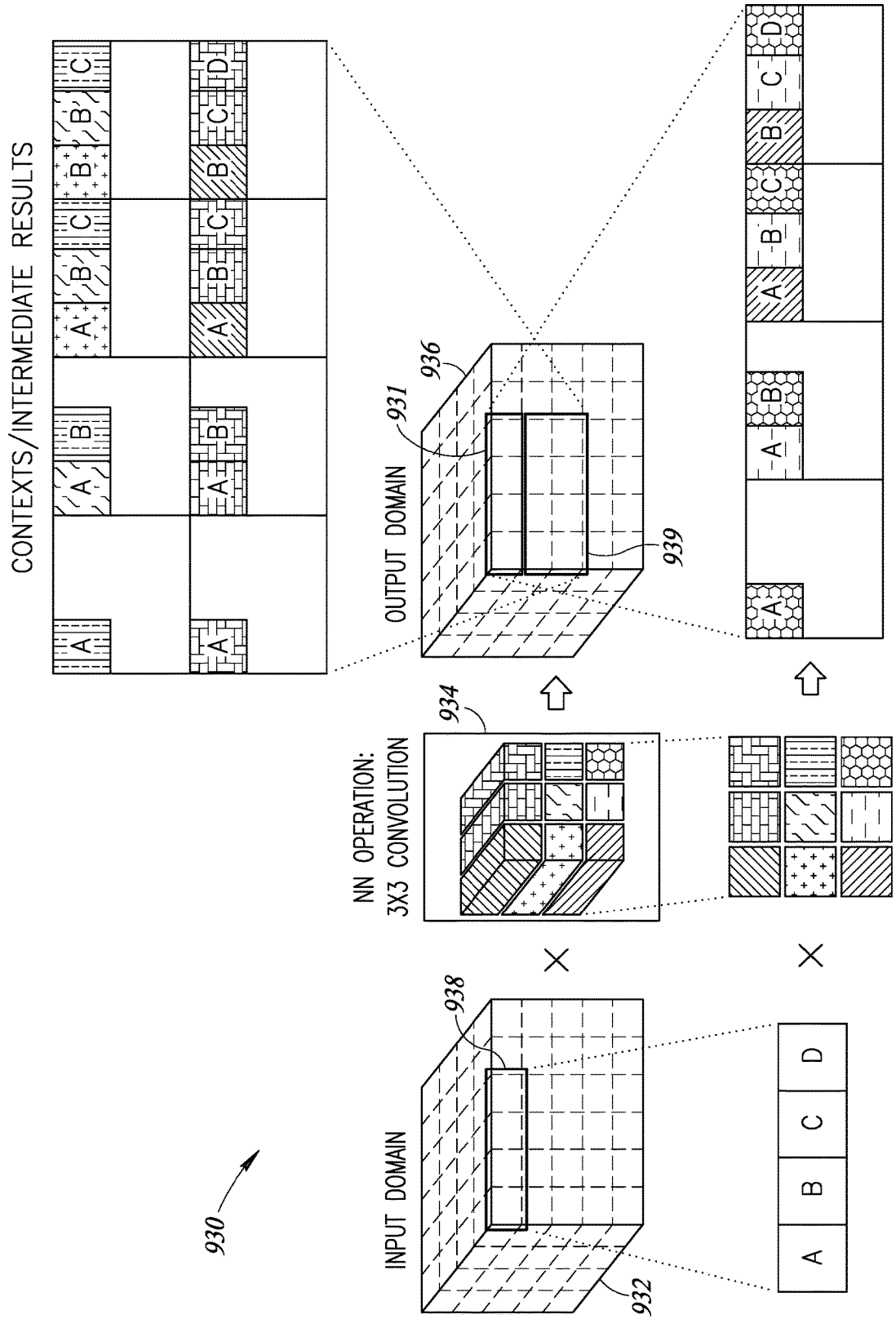
FIG. 23 is a diagram illustrating the flexible processing granularity of the NN processor and related memory versus latency trade-off.

A diagram illustrating the flexible processing granularity of the NN processor and related memory versus latency trade-off is shown in FIG. 23. The data pipeline example, generally referenced 930, highlights the option of leveraging the data pipeline to favor minimal latency and operate at low input domain granularity. Consider the example input tensor 932 including input data 938 that can be located at the beginning of or at any arbitrary point in the network. One of the network layers then applies an NN operation 934 to the input data (e.g., 3×3 convolution in this example) followed by the output domain 936 including memory blocks 931 and 939.

In this example, the input data stream is fully consumed and all needed calculations are applied while minimizing latency and without the need to retrieve the input data since all computations are committed to intermediate results stored in memory. In alternative embodiments, this function can be executed by: (1) waiting for the entire frame and applying a batch operation whereby all data is immediately committed to output to avoid intermediate results; (2) waiting for the minimal set of rows in order to avoid intermediate results (in this example case three); (3) using intermediate results stored in external memory with the increase in memory access latency; or (4) recalling inputs as needed (i.e. multiple reads of the same data) in order to avoid having to store intermediate results.

NN Processor SoC, Intra-Chip and Inter-Chip Connectivity

As described in detail supra, the NN processor can be used to implement an ANN. In the event, however, that the ANN to be implemented exceeds the capacity of the NN processor, the invention provides the capability of using several NN processors to implement the ANN model. As described supra, the NN processor comprises a plurality of bus interfaces (e.g., chip to chip interfaces) for communicating between NN processor cores. In the example disclosed herein, two chip-to-chip interfaces are provided, but any number can be implemented. Thus, large ANN models can be accommodated by combining the processing power of multiple NN processor cores.

It is noted that deployment of a network of interconnected NN processors over the chip to chip interfaces is substantially seamless. Utilizing device-to-device communications, the behavior of the network is equivalent to an ANN contained on a single NN device. In one embodiment, the chip-to-chip interface keeps with the technique of narrowing bandwidth on the boundaries of layers. The physical layer of the interface may comprise any suitable protocol that is synchronous and guarantees the required bandwidth. The next layer is a packet layer which carries a frame format that can be decoded by the receiving chip. The structure of the frame format attempts to minimize overhead in transition between devices and is similar to that of Ethernet, including a plurality of fields including, for example, a stream ID, destination layer, data format, etc. For example, consider a layer having a W×H×F output tensor. The protocol identifies the structure, the stream ID, and network ID in the next device before any processing occurs. The bandwidth needed is then (W×H×F+overhead)×frames/s.

Figure 24:
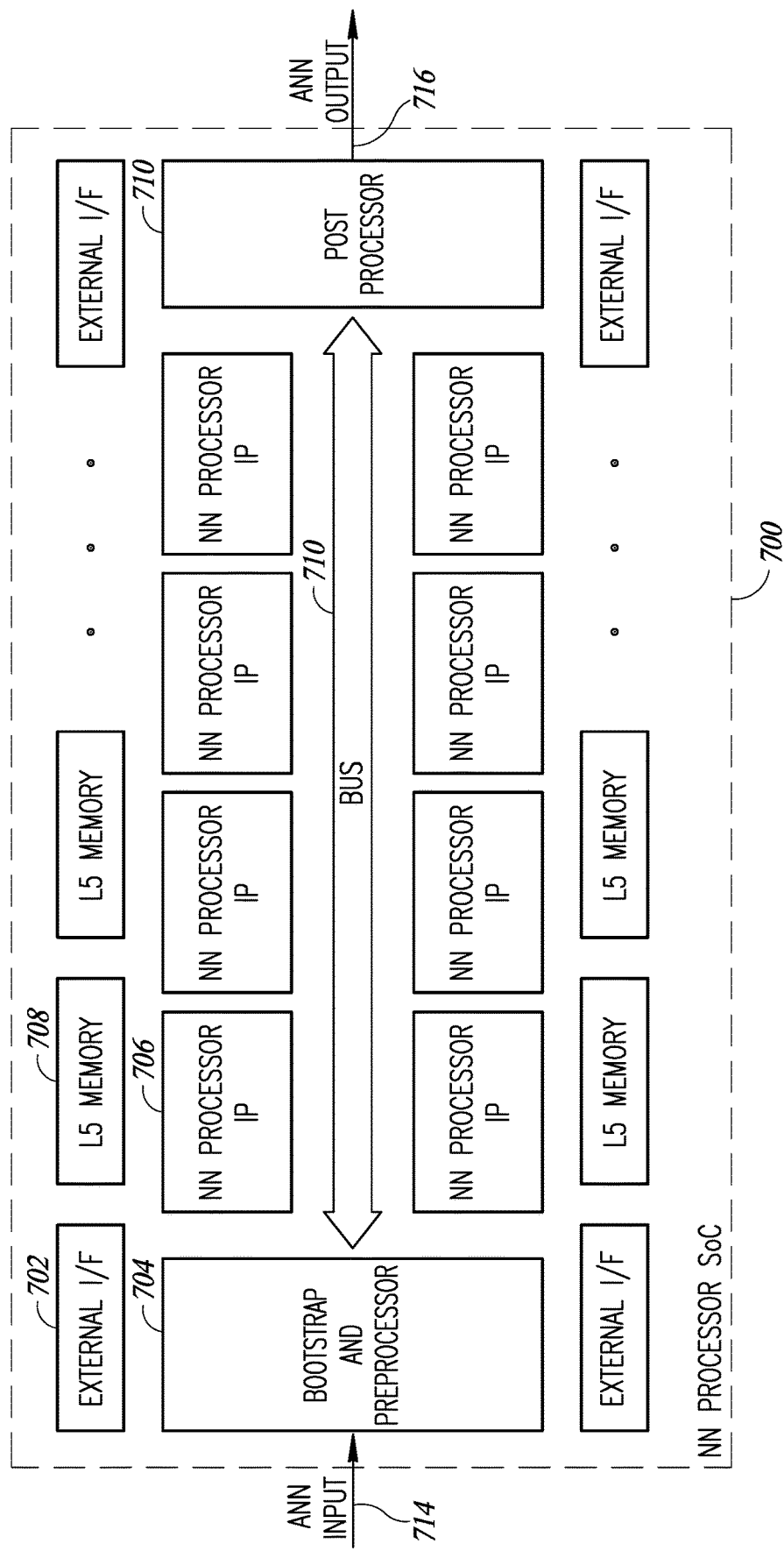
FIG. 24 is a diagram illustrating a first example multi-NN processor SoC system of the present invention.

A diagram illustrating a first example multi-NN processor SoC system of the present invention is shown in FIG. 24. In one embodiment, the NN processor core (or engine) as described supra and shown in FIGS. 4 and 5 can be replicated and implemented as a System on Chip (SoC). The intellectual property (IP) for the NN processor core can be used to implement a monolithic integrated circuit (IC). Alternatively, physical NN processor core dies can be integrated and implemented on an SoC.

Implemented as a monolithic semiconductor or an SoC, the NN processor SoC, generally referenced 700, comprises a plurality of NN processor cores 706 interconnected via an internal bus 710, one or more external interface circuits 702, one or more 'external' L5 memory circuits 708, bootstrap and preprocess circuit 704, and postprocess circuit 712. Note that the number of NN processor cores, L5 memory circuits, etc. is not limited to that shown as one skilled in the semiconductor arts can implement an IC or SoC having any number of NN processor cores and other components.

In operation, ANN input data 714 is written to the SoC 700 via an external I/F 702. The bootstrap and preprocess circuit 704 is operative to perform one or more functions depending on the implementation, including for example, buffering, clocking, power management, data throttling, etc. Data is then fed to the NN processor cores 706 for processing. The NN processor cores communicate with each other over the internal bus 710. Note that connectivity between the NN processor cores may comprise any desired routing type including such as full mesh, token ring, chained, etc. depending on implementation and is not critical to the invention. Note that the other circuit components also communicate over the bus, including the bootstrap and preprocessor 704, external I/Fs 702, L5 memories 708, and postprocessor 712.

Figure 25:
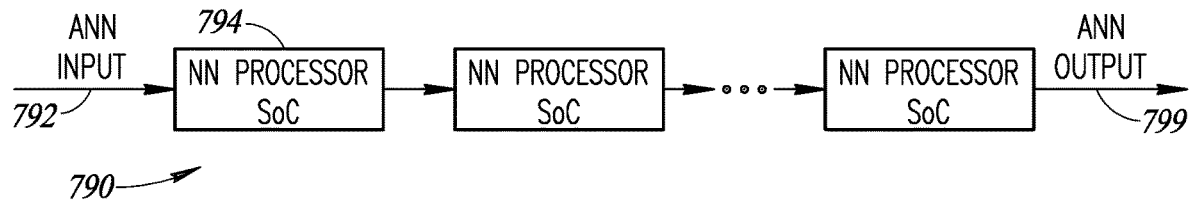
FIG. 25 is a diagram illustrating a second example multi-NN processor SoC system of the present invention.

A diagram illustrating a second example multi-NN processor SoC system of the present invention is shown in FIG. 25. In this example system, generally referenced 790, a plurality of NN processor cores or SoCs 794 are concatenated serially. ANN input data 792 enters the left most NN processor and ANN output data 799 exits the right most NN processor. The plurality of NN processors together implement the ANN model layer by layer.

Figure 26:
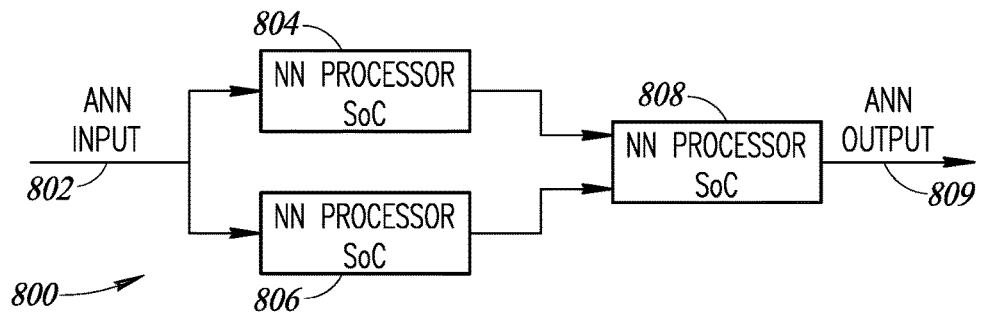
FIG. 26 is a diagram illustrating a first example multi-NN processor SoC system of the present invention.

A diagram illustrating a first example multi-NN processor SoC system of the present invention is shown in FIG. 26. In this example system, generally referenced 800, three NN processor cores or SoCs 804, 806, 808 are combined in a 2→1 gather scheme and together implement the ANN model. ANN input data 802 is input to both NN processors 804, 806 through input ports. In this example, two NN processor cores 804, 806 in parallel are needed to implement the ANN model, e.g., either (1) the model contains a very large number of neurons in one or more layers or (2) the number of neurons exceeds any of the resource constraints (e.g., control, memory or compute) of a single device. The outputs of each NN processor 804, 806 are input via chip to chip input ports to NN processor 808 which functions to generate the ANN output 809.

Figure 27:
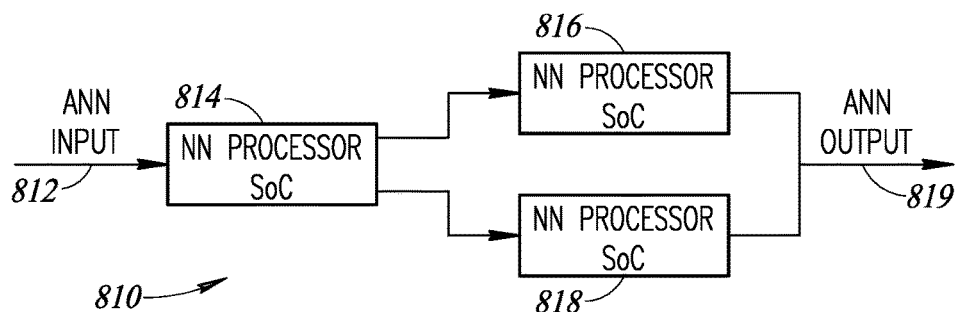
FIG. 27 is a diagram illustrating a first example multi-NN processor SoC system of the present invention.

A diagram illustrating a first example multi-NN processor SoC system of the present invention is shown in FIG. 27. In this example system, generally referenced 810, three NN processor cores or SoCs 814, 816, 818 are combined in a 1→2 scatter scheme and together implement the ANN model. ANN input data 812 is input to NN processor 814 through an input port. The output of NN processor 814 is input to both NN processors 816, 818. In this example, two NN processor cores 816, 818 in parallel are needed to implement the ANN model, e.g., either (1) the model contains a very large number of neurons in one or more layers or (2) the number of neurons exceeds any of the resource constraints (e.g., control, memory or compute) of a single device. The outputs generated by each NN processor 816, 818 are combined to form the ANN output 819.

Example ANN Mapping Strategies

As described supra, if the requirements of an ANN exceed the compute and/or memory resources of a single NN processor core, the ANN model can be split across several devices. The compiler/SDK seamlessly leverages the typically cellular nature of ANNs that allows splitting and merging between and across network layers. Within the compiler, the split is done while accounting for the bandwidth demand at the input and output of the sub-networks that are mapped to each device, in addition to relying on the fact that inter-layer bandwidth is inherently much lower than intra-layer bandwidth. Several example mapping possibilities and strategies are presented.

Generally speaking the device to device mapping, as performed by the compiler, is driven by the number of input and output ports present in the device (e.g., two in the present example). In the example case of two input and output ports on the device, the flexibility to map 1→2 (i.e. scatter), 2→1 (i.e. gather), as well as 1→1 (i.e. feedforward) allows constructing the system arrangements shown.

Figure 28:
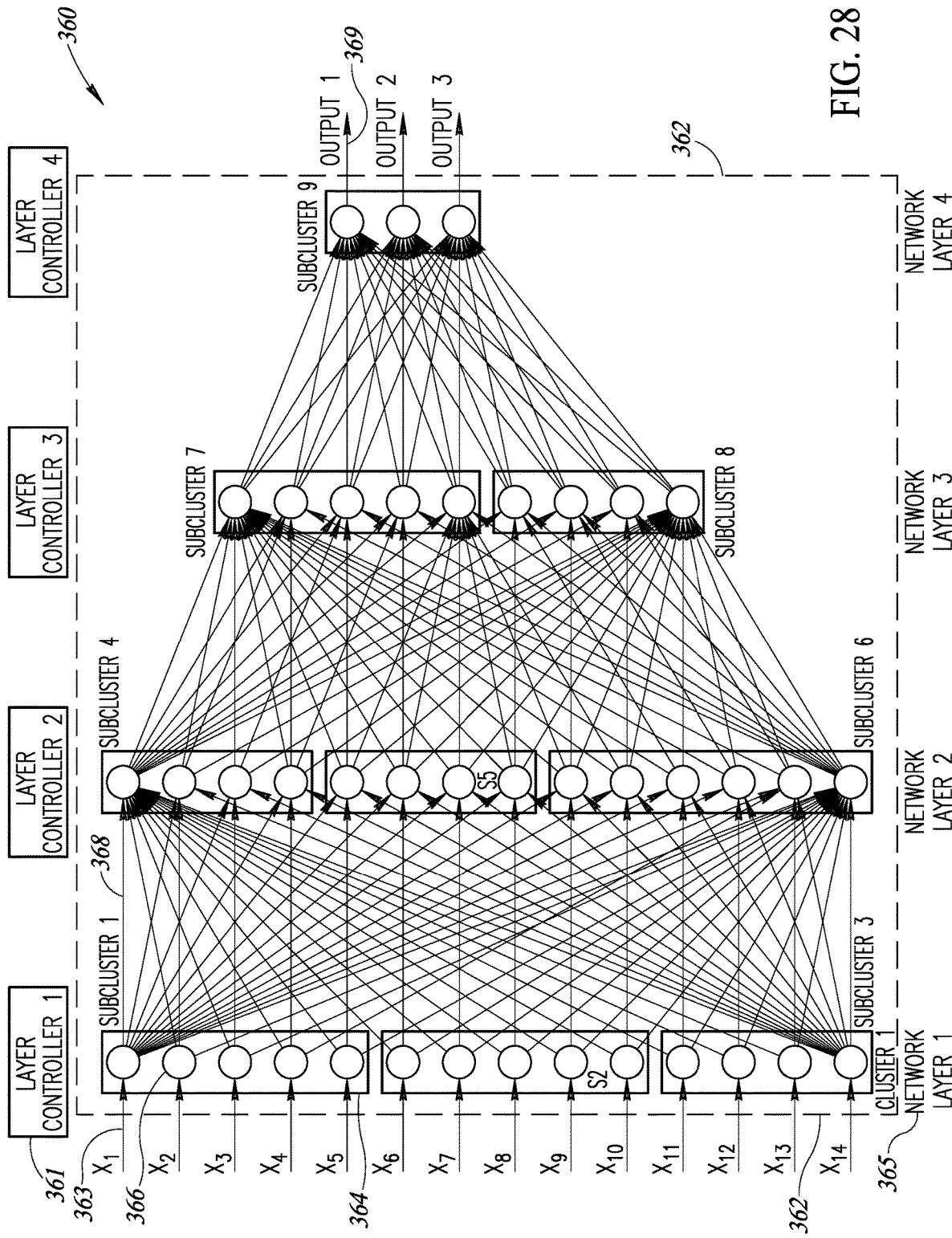
FIG. 28 is a diagram illustrating an example mapping strategy for the first example artificial neural network of FIG. 2.

A diagram illustrating an example mapping strategy for the first example ANN of FIG. 2 is shown in FIG. 28. As described supra, the compiler/SDK functions to map the logical ANN model to the physical NN processor device. As a result of its analysis, in this example, the compiler determines that the entire ANN can be implemented in a single cluster 362 in a single NN processor device. Each network layer 365 in the ANN is mapped to one or more subclusters 364 and an LC 361 is assigned as well. Thus, for example, network layer 1 is mapped to three subclusters, namely subclusters 1, 2, and 3 which also receive ANN inputs 363. These three subclusters are configured and controlled by LC 1. Similarly, the neurons in network layer 2 are mapped by the compiler to subclusters 4, 5, and 6 and assigned to LC 2. The neurons in network layer 3 are mapped to subclusters 7 and 8 and assigned to LC 3. Finally, network layer 4 is mapped to subcluster 9 and configured and controlled by LC 4. The ANN outputs 369 are generated by subcluster 9.

Figure 29:
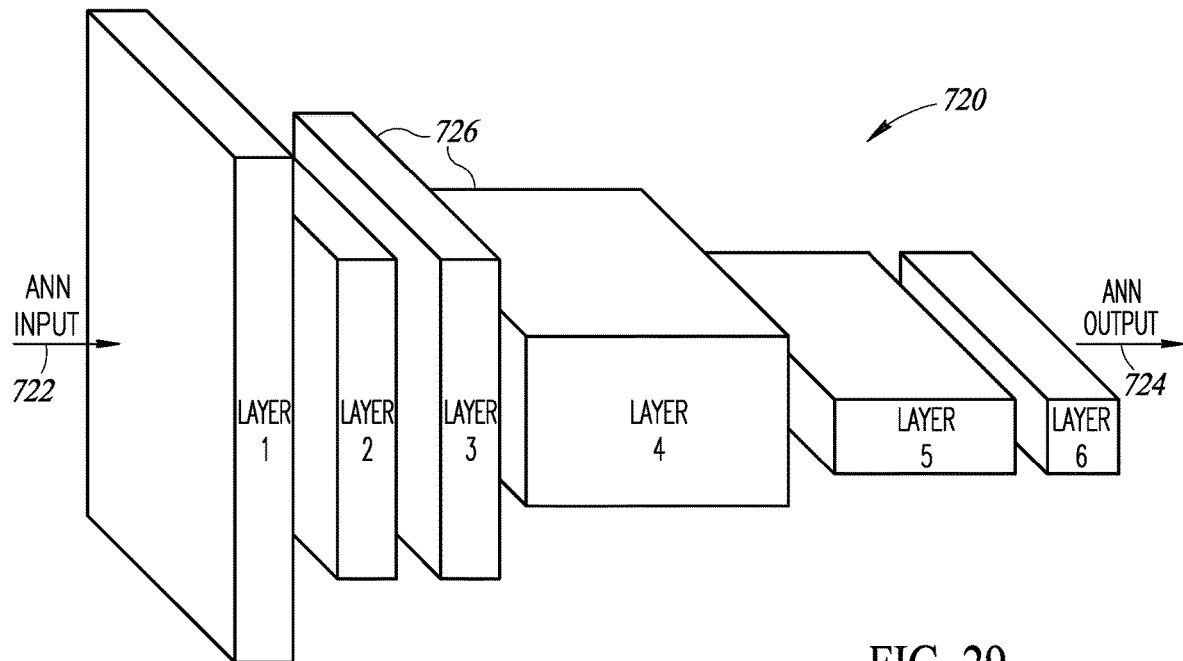
FIG. 29 is a diagram illustrating a second example artificial neural network.

A diagram illustrating a second example artificial neural network is shown in FIG. 29. This example ANN, generally referenced 720, which may be a convolutional type NN, comprises a plurality of layers 726, including Layers 1 through 6. Layer 1 receives ANN input 722 and Layer 6 generates ANN output 724.

Figure 30:
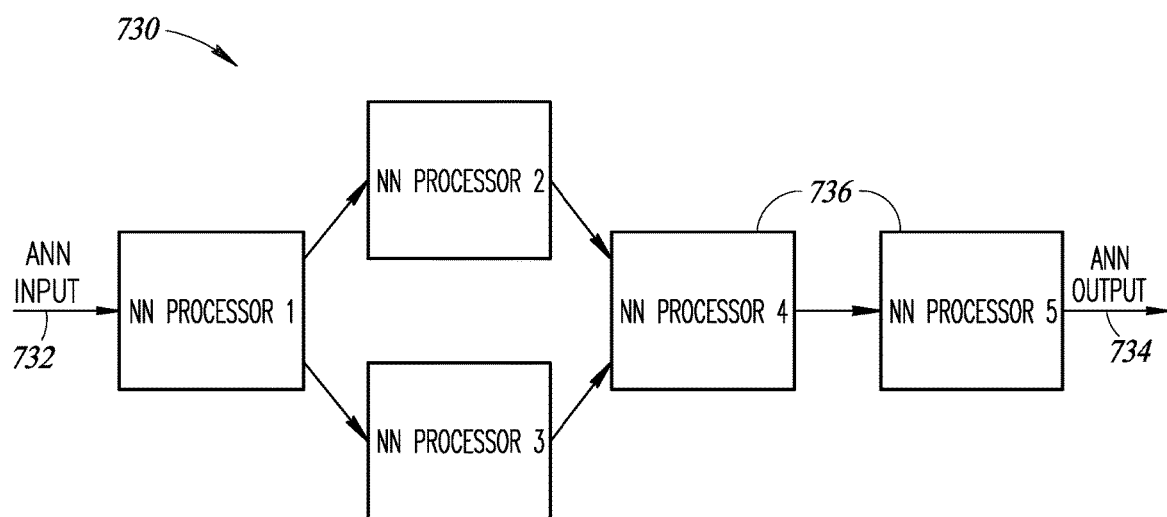
FIG. 30 is a diagram illustrating an example multi-NN processor SoC system of the ANN of FIG. 29.

A diagram illustrating an example multi-NN processor SoC system of the ANN of FIG. 29 is shown in FIG. 30. The NN system, generally referenced 730, represents the mapping of the ANN 720 to the NN processor system of the present invention. Each NN processor 736 comprises a separate IC or alternatively, a separate die in an SoC.

It is the function of the compiler and SDK to map the logical ANN model to physical NN processor configuration during the compilation process. In this example, Layer 1 maps into the entire NN processor 1 since its capacity in terms of compute elements, memory fabric, etc. is only sufficient to implement Layer 1. NN processor 1 also receives the ANN input 732. Layers 2 and 3 are such that they cannot be implemented in a single device, thus two devices are required, i.e. NN processors 2 and 3, in parallel and the processing is split between them. Layer 4 is large but the compiler determines that it can be implemented in a single device. Thus, the entire NN processor 4 is mapped to Layer 4. Layers 5 and 6 are analyzed and mapped to a single NN processor 5 device by the compiler. NN processor 5 generates the ANN output 734. Note that the NN processors communicate with each other in a feedforward manner via the chip to chip interfaces in each device.

Figure 31:
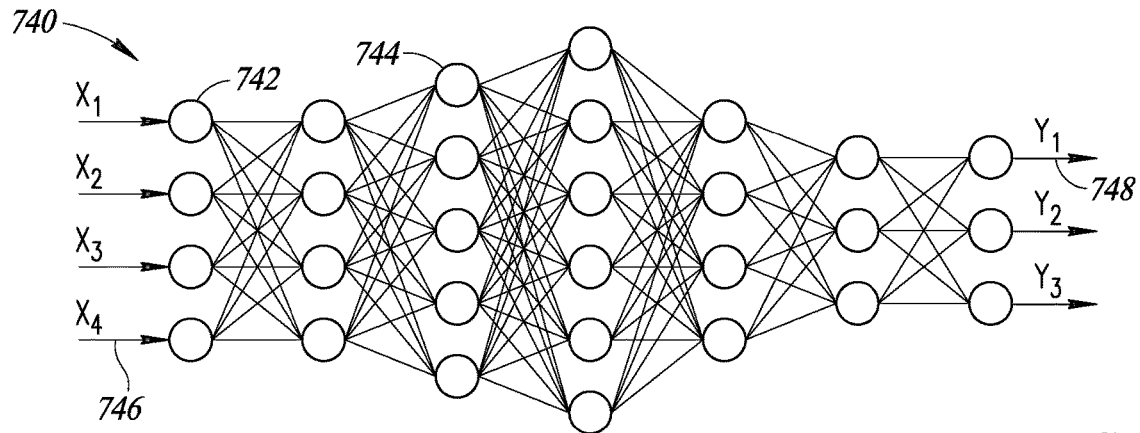
FIG. 31 is a diagram illustrating a third example artificial neural network.

A diagram illustrating a third example artificial neural network is shown in FIG. 31. The example ANN, generally referenced 740, is intended to represent any desired ANN. It comprises a plurality of neurons 744 organized into different network layers. Input data X 746 is input to the first layer and output data Y 748 is generated by the last layer.

Figure 32:
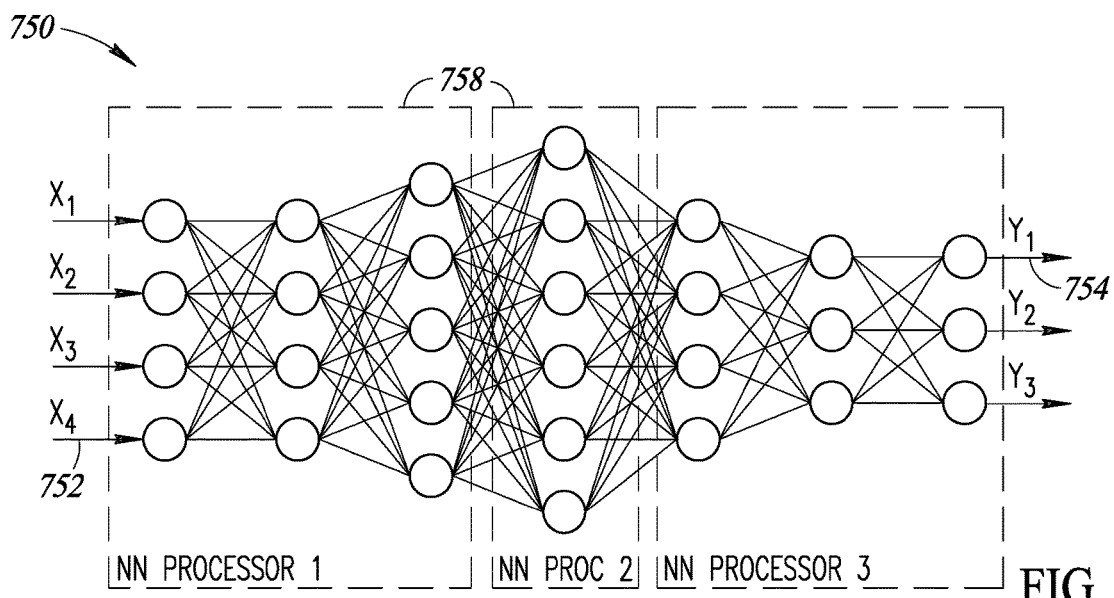
FIG. 32 is a diagram illustrating a first example multi-NN processor SoC system of the ANN of FIG. 31.

A diagram illustrating a first example multi-NN processor SoC system of the ANN of FIG. 31 is shown in FIG. 32. In this example, a first mapping, generally referenced 750, is generated by the compiler/SDK and comprises several NN processor devices. In particular, the neurons 756 in the first two network layers are mapped to NN processor 1, the third network layer is mapped to NN processor 2 and the last three network layers are mapped to NN processor 3. ANN input data 752 is input to the first layer in NN processor 1. NN processor 3 generates the ANN output data 754.

Figure 33:
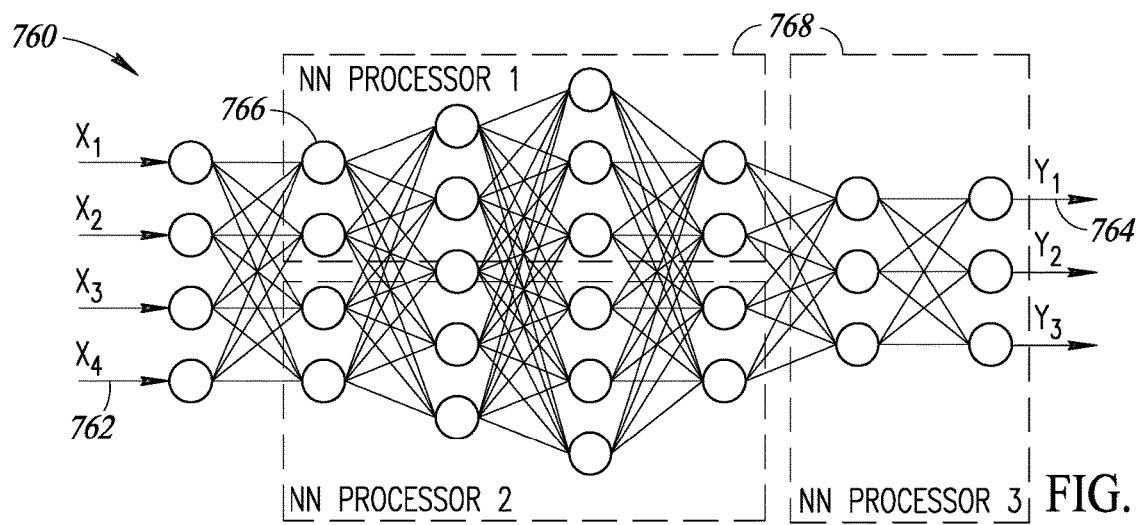
FIG. 33 is a diagram illustrating a second example multi-NN processor SoC system of the ANN of FIG. 31.

A diagram illustrating a second example multi-NN processor SoC system of the ANN of FIG. 31 is shown in FIG. 33. In this example, a different mapping, generally referenced 760, is generated by the compiler/SDK and comprises several NN processor devices. In particular, the neurons 766 in the first four network layers are split between two devices, namely NN processors 1 and 2, as they exceed the capacities of a single device. The last two network layers are mapped to NN processor 3. ANN input data 762 is input to the first layer in NN processors 1 and 2. NN processor 3 generates the ANN output data 764.

Scanning Multi-Dimensional Data Stored in Memory

In implementing ANNs, often times the data that is stored in memory is multi-dimensional in nature, i.e. the data stored in memory is ordered and structured. For example, in convolutional neural networks, data arrays of two, three or more dimensions are stored in memory. This fact can be leveraged to simplify the addressing required to scan the memory. The present invention leverages the fact that a dimension (or several dimensions) are to be scanned where memory is accessed element by element for a particular dimension. This is important since without this assumption, the 'next' trigger signal (described infra) as a lean control interface does not hold.

For example, consider the addressing required for a conventional 1 MB memory. In this case, 20-bits are required to access a memory location. Using the multi-dimension address generator of the present invention, 20-bits of address are still required to access a location in memory. The number of address lines required to interface to the memory does not change. What is different, however, is that a memory access circuit is placed in front of the memory to reduce the number of address lines required to be generated by the compute elements. The memory access circuit generates the memory address. Thus, rather than require the full 20-bits of address to be provided, the memory access circuit only requires a few signal lines and a single signal line to count up or down. In one embodiment, once configured, the memory access circuit only requires a single external control input (e.g., NEXT) provided from the compute elements to access a location in memory.

The invention thus provides a memory access circuit for efficiently accessing a memory entity, which is by nature linear and organized sequentially as a multi-dimensional tensor of given shape and form. Using this circuit, a window of Z-dimensions with each dimension of size $S_1$ through $S_Z$, can be accessed on a dimension-level basis (i.e. location advancement within a given dimension) using a single control bit per dimension.

The memory access circuit is preferably placed in close proximity to the memory circuit. This minimizes the routing and space required in the NN device for the complete set of address line signals for the memory. In one embodiment, in place of the full set of address lines, the memory access circuit takes as input a signal that indicates the particular dimension to access. Within a dimension, memory access is sequential. Any number of dimensions may be configured with the only limitation the size of the memory.

In one embodiment, the memory access circuit can be used in combination with the memory windowing technique described in detail supra to further reduce the number of signals required to be provided by the compute elements to access memory, thus further narrowing the control bandwidth required. This is because the neural network data stored in the memory represents a tensor, i.e. an Z-dimensional matrix of size $S_1 \cdot S_2 \cdot S_3 \cdot \ldots \cdot S_Z$.

Figure 34:
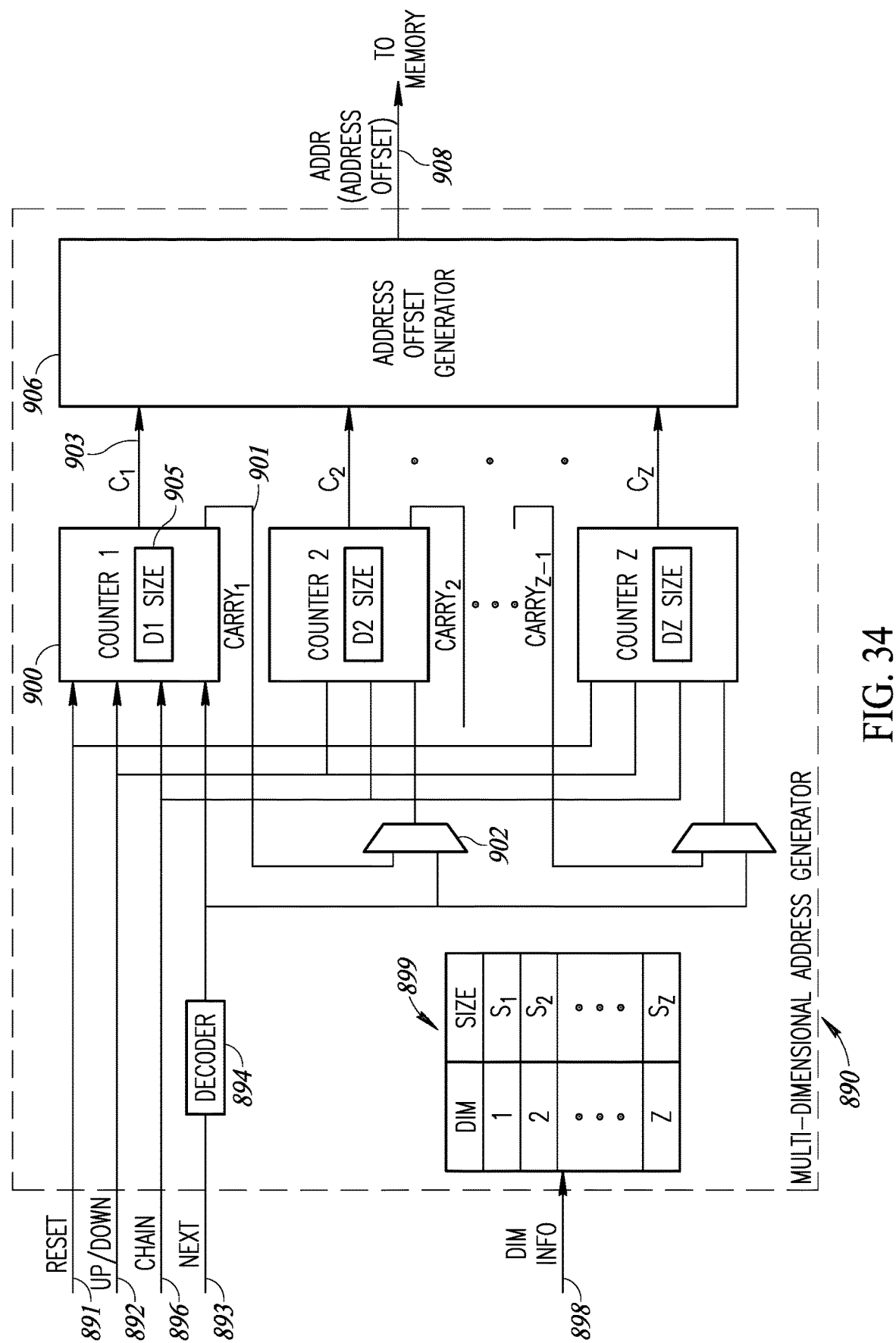
FIG. 34 is a block diagram illustrating an example multi-dimensional memory access circuit in more detail.

A block diagram illustrating an example multi-dimensional memory access circuit in more detail is shown in FIG. 34. The memory access circuit, generally referenced 890, comprises a plurality of counters 900, labeled counter 1 through counter Z, with each counter associated with a different dimension, multiplexer circuits 902, decoder 894, dimension information register bank 899 and address generator circuit 906. A RESET signal 891 functions to reset and clear all the counters 900. An UP/DOWN signal 892 functions to configure the counters to count either up or down causing the memory address (ADDR) 908 output to either increase or decrease.

A CHAIN input signal 896 functions to configure whether the counters are chained together or function independently. If the counters are independent, then each counter counts without regard to arriving at the end of a dimension. The counter for that dimension wraps around to the beginning of the dimension and continues counting.

If the counters are chained, then when a counter reaches the end of its dimension, a carry signal 901 is generated that is input to a neighboring counter (i.e. the next dimension) causing it to trigger (i.e. increment or decrement). In this manner, counting in one dimension can have a ripple effect on the count in other dimensions. This enables a repeating single count command (NEXT) in one dimension to scan (i.e. access) multiple dimensions in memory.

In addition, dimension information is provided to the circuit 890. This includes the number of dimensions Z of the data as well as the size S of each dimension. The dimension size information stored in register 905 is used by each respective counter to configure a 'modulo' function or maximum value whereby when the counter reaches the maximum size (i.e. the dimension size), generates the carry signal 905, and then wraps back to zero and continues counting.

The function of the multi-dimensional memory access circuit (also referred to as a multi-dimensional counter) is to address (or scan) memory that is virtually organized in Z multiple dimensions each having a given size $S_1 \cdot S_2 \cdot S_3 \cdot \ldots \cdot S_Z$. The circuit is operative to generate an address offset of a given coordinate in the Z-space. In one embodiment, the order of the dimensions in multi-dimensional space matters. The inner most dimension is defined as dimension 1 and the outermost dimension as dimension Z. Thus, as the index increases, the dimensions go from inner to outer.

The inner most dimension is 'inner' in the sense that it is the only dimension whose elements are stored in consecutive locations in memory. Thus, the first element in the tensor is stored in address $addr_0$, the next at $addr_1$, etc. through to $addr_{S1}$. Given the dimension size $S_1$, it can be said that $S_1$ elements belong to this dimension and once $addr_{S1-1}$ is reached the counter wraps back to 0.

The counters 900 are statically configured a priori to count in a pre-defined direction either up (i.e. increment) or down (i.e. decrement) in accordance with the UP/DOWN input signal 892. The counter for each dimension is capable of independently counting (up or down) where each counter can be configured differently, i.e. not all counters count in the same direction. When a counter increments, it is along a single dimension each cycle. The NEXT signal 893 comprises a number 1 through Z indicating which dimension the circuit 890 is to generate a memory address for. Decoder 894 functions to translate the input dimension number to a signal output on one of $2^Z$ 'trigger' or 'count' instruction lines, each trigger command line input to one of the counters. Thus, the NEXT signal functions to (1) indicate which of the dimensions to generate a memory address for; and (2) serve as a 'clock' indicating when to trigger the address generation.

As described supra, the counters can count independently or in chain mode. When in independent mode, the counters are not chained and each counter has a maximum value set by the corresponding dimension size S. This value may be stored in a register 905 in each counter, e.g. counter 1 stores the size of dimension 1, counter 2 stores the size of dimension 2, etc. through dimension Z. The counter, in accordance with the UP/DOWN signal, counts either up or down (i.e. forward or backward) to the maximum value and returns (or wraps) to zero once reached. The NEXT input signal and the output of decoder 894 indicates which dimension to trigger (i.e. to clock). Once triggered, the selected counter corresponding to this dimension updates its value (i.e. counts either up or down). Note that in this mode, each counter counts up or down independently from the action occurring on all the other counters.

In chain mode, however, one or more counters can be chained to neighboring counters. In this mode, counters that are chained are triggered by a carry signal 901 generated by the preceding neighboring counter instead of the NEXT signal (as selected by the respective multiplexer 902). Counters that are configured in chain mode cannot be controlled by the external NEXT signal. Counters that are chained, have the ability to trigger another counter once the inner counter's maximum count has been reached. When a counter reaches its maximum value, a carry signal 901 is generated and input to the next outer dimension counter it is chained to trigger it to count (i.e. either up or down).

Note that in one embodiment, the order of chaining is from the inner dimension to outer dimensions. Note also that the inner most dimension counter 1 is never chained since there cannot be a dimension more inner than it and thus it always increments or decrements explicitly via the NEXT signal. The multiplexers 902 in front of counters (other than counter 1), function to select either the decoded NEXT signal or the carry signal from a counter it is chained to.

The output values 903 of all the counters as well as the size of each dimension are used to calculate the memory address addr 908 output of the circuit 890. In one embodiment, the address is a summation of the current count status 903 of all counters where each count value is multiplied by the dimensions of all previous dimensions, i.e. dimensions that are 'inner' to it. The following expression is used to generate the memory address.

$$addr = \text{SCALE}\left[\sum_{i=2}^{Z}\left(\prod_{j=1}^{i-1} S_j\right)(C_i - 1) + C_1\right] - 1 \quad (6)$$

Where addr denotes the generated address output, SCALE represents a scale factor, Z represents the number of dimensions, $S_j$ represents the size of dimension j, SCALE is a scale factor, and $C_i$ is the value of counter i. Note that the address generated by the circuit typically functions as an offset or index to the memory that is added to a base value to yield the final physical memory address.

The SCALE factor is used to represent the size in bytes (i.e. the granularity) of each element in memory. For example, if SCALE=1 the memory address offset steps by one at a minimum. If the content stored in memory is double word (i.e. 32-bit), then each address offset generated comprises four bytes and thus the address is generated in 4-byte granularity or SCALE=4.

Figure 35:
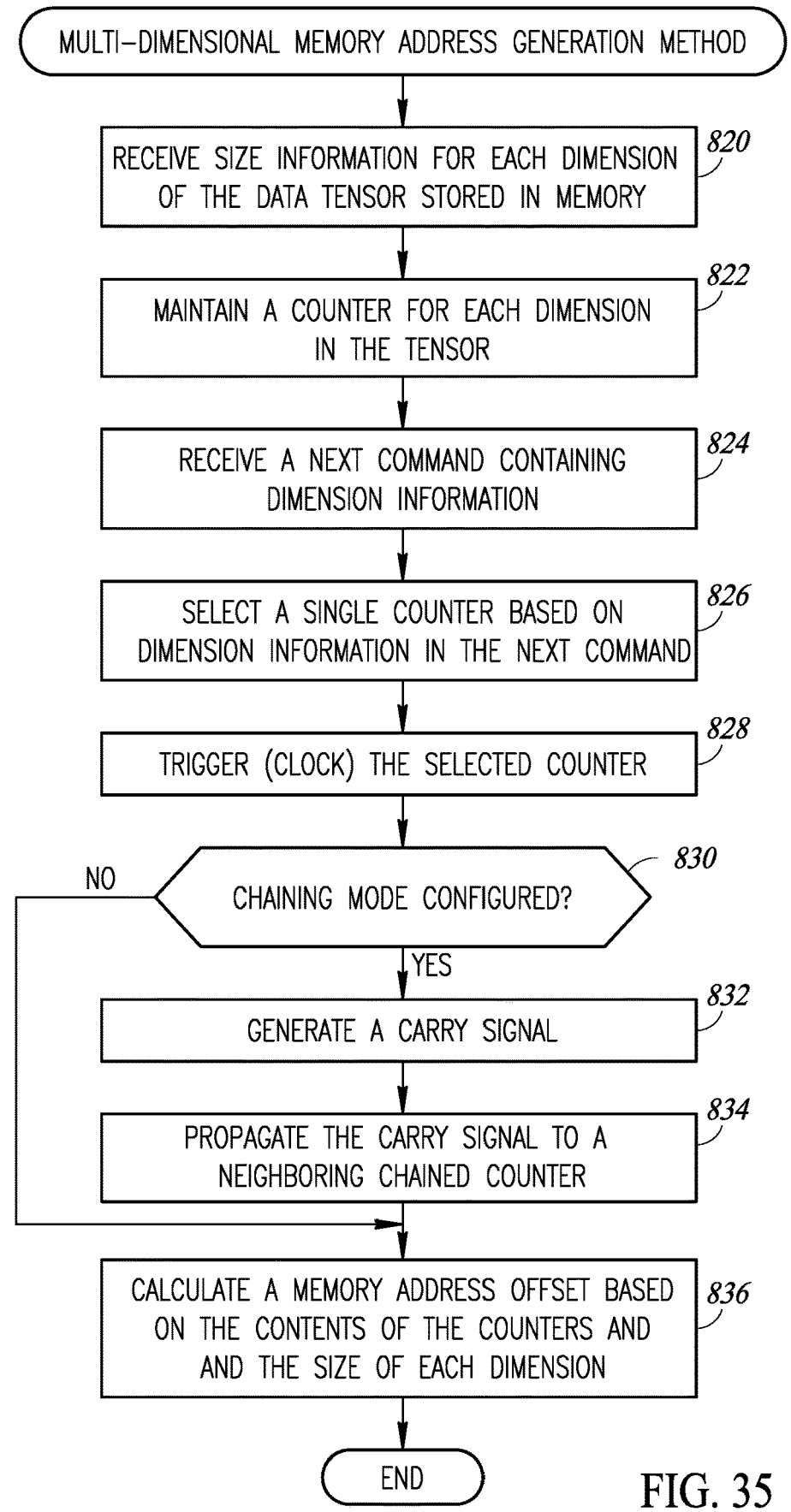
FIG. 35 is a flow diagram illustrating an example multi-dimensional memory access circuit generator method of the present invention.

A flow diagram illustrating an example multi-dimensional memory access circuit generator method of the present invention is shown in FIG. 35. Initially, the circuit receives the size of each dimension $S_j$ of data stored in memory as well as an up/down configuration setting (step 820). The counters are also set to operate in either independernt or chain mode (step 821). A counter is assigned and a count maintained for each dimension (step 822). An external NEXT trigger (command or count) signal is received containing dimension information (step 824). Based on the NEXT signal, a single counter is selected (step 826). The selected counter is clocked (step 828).

If the counters are configured to independent mode (step 830), the method continues with step 836. If the counters are configured to chain mode, the clocked counter generates a 'carry' signal if it has reached its maximum value (step 832). In one embodiment, the carry signal is conditionally generated (i.e. active) if the count has elapsed. The majority of the time the carry signal is inactive and only becomes active when the count value has reached the dimension size. The carry signal is propagated to the chained neighboring counter causing it to either increment or decrement (step 834). The memory address is calculated based on the value or all the counters in the tensor and the sizes of each dimension (step 836).

Several access schemes are illustrated herein including for one, two and three dimensions. It is noted, however, that the memory access circuit can be used for any number of dimensions and is not limited to the example disclosed herewith.

Figures 36, 39:
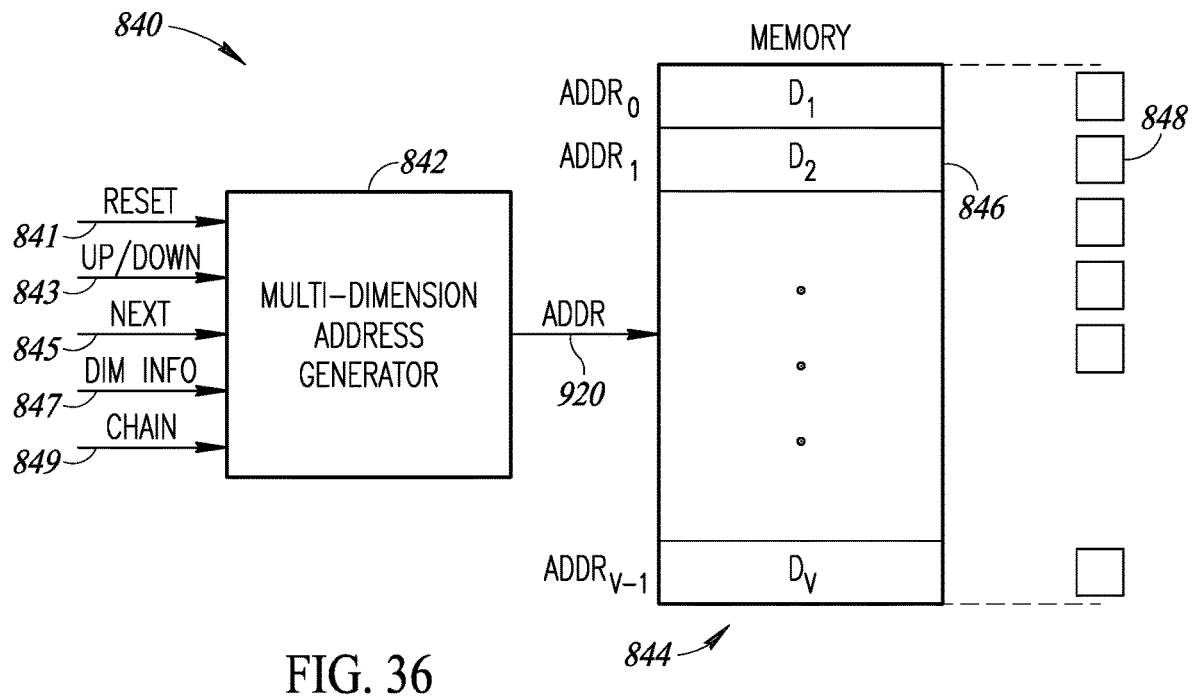
FIG. 36 is a diagram illustrating an example multi-dimension memory access circuit for accessing data stored in one dimension.
FIG. 39 is a diagram illustrating an example 2-dimensional memory array.

A diagram illustrating an example multi-dimension memory access circuit for accessing data stored in one dimension is shown in FIG. 36. The memory access scheme, generally referenced 840, comprises a multi-dimension memory access circuit 842 and a memory 844. In one embodiment, the memory access circuit receives a RESET signal 841, UP/DOWN signal 843, NEXT signal 845, dimension information 847, and chain signal 849. The memory 844 comprises a plurlaikty of V (i.e. $S_1$) individual memory lcoations 846, denoted $D_1$ through $D_V$, that are accessed via address lines $ADDR_0$ through $ADDR_{V-1}$. In this example, the data array stored in memory is linear with only a single dimension wherein consecutive addresses reflect the original vector arrangement. This is represented by the linear column of squares 848, with each square representing a single memory location.

In operation, the memory access circuit 842 is configured a priori via several of the input signals. The UP/DOWN signal indicates whether sequential access to the memory increases or decreases after each access, i.e. whether the preceding or subsequent location is accessed in the memory. The dimension information is used to configure the memory access circuit with the number of dimensions Z of the data that is stored in the memory as well as the size S of each particular dimension. The address offset 920 output of the circuit 842 is used to generate the physical addressing to the memory 844.

Figure 37:
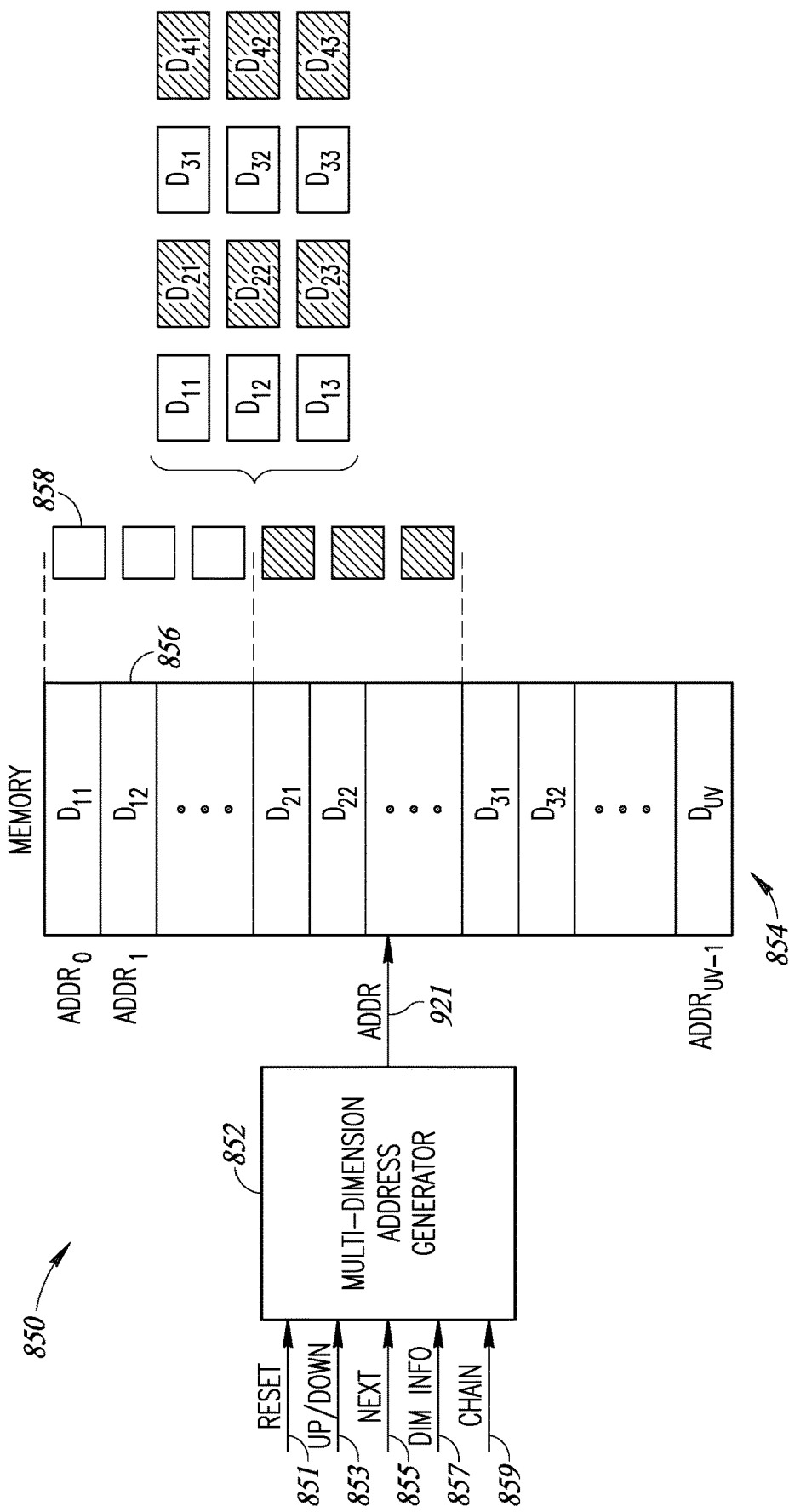
FIG. 37 is a diagram illustrating an example multi-dimension memory access circuit for accessing 2-dimensional data.

A diagram illustrating an example multi-dimension memory access circuit for accessing 2-dimensional data is shown in FIG. 37. The memory access scheme, generally referenced 850, comprises a multi-dimension memory access circuit 852 and a memory 854. In one embodiment, the memory access circuit receives a RESET signal 851, UP/DOWN signal 853, NEXT signal 855, dimension information 857, and chain signal 859. The memory 854 comprises a plurlaikty of U·V (i.e. $S_1 \cdot S_2$) individual memory lcoations 856, denoted $D_{11}$ through $D_{UV}$ that are accessed via address lines $ADDR_0$ through $ADDR_{UV-1}$, where the first digit of the D subscript represents the column and the second digit represents the row. In this example, the data stored in memory has two dimensions but is laid out in a consecutive manner in memory. This is represented by the column of squares 858, with each square representing a single memory location, whereby squares of one dimension are blank while squares of the second dimension are cross hatched.

In operation, the memory access circuit 852 is configured a priori via several of the input signals. The UP/DOWN signal indicates whether sequential access to the memory increases or decreases after each access, i.e. whether the preceding or subsequent location is accessed in the memory. The dimension information is used to configure the memory access circuit with the number of dimensions Z of the data that is stored in the memory as well as the size S of each particular dimension. The address offset 921 output of the circuit 852 is used to generate the physical addressing to the memory 854.

Figure 38:
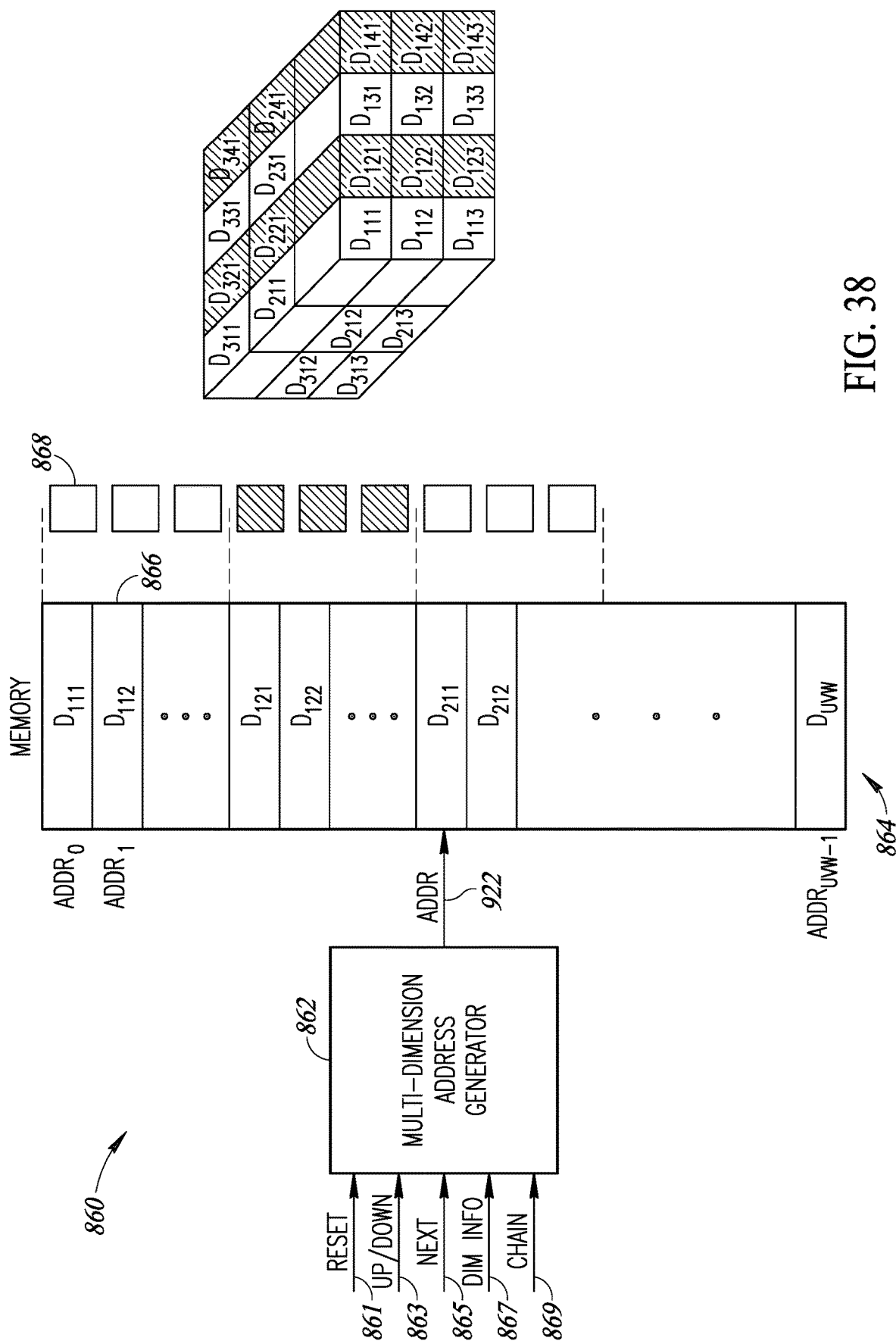
FIG. 38 is a diagram illustrating an example multi-dimension memory access circuit for accessing 3-dimensional data.

A diagram illustrating an example multi-dimension memory access circuit for accessing 2-dimensional data is shown in FIG. 38. The memory access scheme, generally referenced 860, comprises a multi-dimension memory access circuit 862 and a memory 864. In one embodiment, the memory access circuit receives a RESET signal 861, UP/DOWN signal 863, NEXT signal 865, dimension information 867, and chain signal 869. The memory 864 comprises a plurlaikty of U·V·W (i.e. $S_1 \cdot S_2 \cdot S_3$) individual memory lcoations 866, denoted $D_{111}$ through $D_{UVW-1}$, that are accessed via address lines $ADDR_0$ through $ADDR_{UVW-1}$. In this example, the data stored in memory has two dimensions but is laid out in a consecutive manner in memory. This is represented by the column of squares 868, with each square representing a single memory location, whereby squares of one dimension are blank while squares of the second dimension are cross hatched.

In operation, the memory access circuit 862 is configured a priori via several of the input signals. The UP/DOWN signal indicates whether sequential access to the memory increases or decreases after each access, i.e. whether the preceding or subsequent location is accessed in the memory. The dimension information is used to configure the memory access circuit with the number of dimensions Z of the data that is stored in the memory as well as the size S of each particular dimension. The address offset 922 output of the circuit 862 is used to generate the physical addressing to the memory 864.

A diagram illustrating an example 2-dimensional memory array is shown in FIG. 39. As an example, consider a 2-dimensional tensor arrangement (e.g., three rows by four columns). In memory 910 the data is laid out in a consecutive manner at address 0 through 11 storing data elements 912, namely $D_{11}$ through $D_{43}$. The multi-dimension memory access circuit functions to generate addressing for the entire array using only the NEXT input command to advance through memory. To be capable of addressing a desired location in the 3×4 matrix, the counters are configured to have two dimensions (i.e. Z=2, $S_1$=3, $S_2$=4).

In one example, the entire array is to be accessed. Assuming the counters are configured to be in chain mode, the first NEXT command is provided to select the first data $D_{00}$ element in the array. Memory addresses starting from 0 and extending to 11 are generated by receiving successive NEXT commands. When the value of counter 1 goes from 2 to 3, a carry from counter 1 to counter 2 is generated. This causes counter 2 to increment even though the NEXT input command is directed to counter 1.

In another example, consider access to $D_{32}$ of the matrix, where the first digit of the subscript represents the column and the second digit represents the row. Assuming the counters are at position $D_{32}$ in the matrix, the address generator will compute an output address using the following expression (assuming SCALE=1).

$$addr = \left(\sum_{i=2}^{Z}\left(\prod_{j=1}^{i-1} S_j\right)(C_i - 1) + C_1 - 1\right) \quad (7)$$

$$= \left(\sum_{i=2}^{2}\left(\prod_{j=1}^{1} S_j\right)(C_i - 1) + 2 - 1\right)$$

$$= (3*(3-1)+2)-1$$

$$= 7$$

The address offset of 7 is added to a base address to generate the appropriate physical address to the memory. Note that tensors having different dimensions are handled in a similar fashion as described supra. Thus, the present invention provides an efficient mechanism for accessing multi-dimensional data stored in a memory.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of scanning tensor data stored in a memory, the method comprising:
   providing a counter for each dimension of the tensor data stored in the memory, each dimension having a corresponding size;
   selecting one of said dimensions for memory access in accordance with an external trigger signal;
   triggering one of said counters corresponding to said selected dimension; and
   generating a memory access address in accordance with the contents of each counter and the size of each dimension.

2. The method according to claim 1, wherein each counter counts either up or down in accordance with an up/down control signal configured a priori.

3. The method according to claim 1, further comprising:
   chaining a first counter to a respective neighboring second counter;
   generating a carry signal upon said first counter reaching a maximum value; and
   triggering said second counter of a different dimension in response to said trigger signal.

4. The method according to claim 1, wherein said memory access address is generated in accordance with the following equation $$addr = \left[\sum_{i=2}^{Z}\left(\prod_{j=1}^{i-1} S_j\right)(C_i - 1) + C_1\right] - 1$$

where addr denotes said memory access address, Z represents the number of dimensions of the tensor data stored in memory, $S_j$ represents the size of dimension j, and $C_i$ represents the value of counter i.

5. A method of accessing multi-dimensional data stored in a memory, the method comprising:
   providing a plurality of counters, each counter corresponding to a different dimension of the data stored in the memory, each dimension having a size;
   receiving a multidimensional next signal conveying target dimension information;
   decoding said multidimensional next signal to generate a trigger signal therefrom as well as a signal selecting one of said plurality of counters to receive said trigger signal in accordance with said target dimension information;
   applying said trigger signal to said selected counter; and
   generating an address offset to the memory in accordance with the contents of said plurality of counters and the respective sizes of each dimension of data stored in the memory.

6. The method according to claim 5, wherein each counter counts either up or down in accordance with an external up/down control signal configured a priori.

7. The method according to claim 5, further comprising:
chaining a first counter to a respective neighboring second counter;
generating a carry signal upon said first counter reaching a maximum value; and
triggering said second counter of a different dimension in response to said trigger signal.

8. The method according to claim 5, wherein said memory access address is generated in accordance with the following equation $$addr = \left[\sum_{i=2}^{Z}\left(\prod_{j=1}^{i-1} S_j\right)(C_i - 1) + C_1\right] - 1$$

where addr denotes said memory access address, Z represents the number of dimensions of the tensor data stored in memory, $S_j$ represents the size of dimension j, and $C_i$ represents the value of counter i.

9. A circuit for accessing multidimensional data stored in a memory, comprising:
a plurality of counters, each counter corresponding to a different dimension of the tensor data stored in the memory, each dimension having a corresponding size;
a decoder circuit operative to generate a trigger for a selected one of said counters in accordance with a next signal input thereto, wherein said next signal indicates one of said dimensions for memory access; and
an address generator circuit operative to generate a memory access address offset in accordance with the contents of each counter and each dimension size.

10. The circuit according to claim 9, wherein each counter comprises direction circuitry operative to count either up or down in accordance with an external up/down control signal configured a priori.

11. The circuit according to claim 9, further comprising chain circuitry, wherein:
a first counter is coupled to a neighboring second counter;
said first counter is operative to generate a carry signal upon reaching a maximum value; and
said second counter being triggered in response to said carry signal.

12. The circuit according to claim 9, wherein said decoder circuit comprises an n to $2^n$ decoder circuit.

13. The circuit according to claim 9, wherein said address generator circuit is operative to generate said memory access address in accordance with the following equation $$addr = \left[\sum_{i=2}^{Z}\left(\prod_{j=1}^{i-1} S_j\right)(C_i - 1) + C_1\right] - 1$$

where addr denotes said memory access address, Z represents the number of dimensions of the tensor data stored in memory, $S_j$ represents the size of dimension j, and $C_i$ represents the value of counter i.

14. A circuit for scanning multi-dimensional data stored in a memory, comprising:
a plurality of counters, each counter corresponding to a different dimension of the data stored in the memory;
a decoder circuit operative to receive a multidimensional next signal conveying target dimension information, said decoder circuit operative to generate a trigger signal directed to one of said plurality of counters in accordance with said target dimension information; and
an address generator circuit coupled to said plurality of counters and operative to generate an address to the memory in accordance with the contents of said plurality of counters and the respective sizes of each dimension of data stored in the memory.

15. The circuit according to claim 14, wherein each counter comprises direction circuitry operative to count either up or down in accordance with an external up/down control signal configured a priori.

16. The circuit according to claim 14, further comprising chain circuitry, wherein:
a first counter is coupled to a neighboring second counter;
said first counter is operative to generate a carry signal upon reaching a maximum value; and
said second counter being triggered in response to said carry signal.

17. The circuit according to claim 14, wherein said decoder circuit comprises an n to $2^n$ decoder circuit.

18. The circuit according to claim 14, wherein said address generator circuit is operative to generate said memory access address in accordance with the following equation $$addr = \left[\sum_{i=2}^{Z}\left(\prod_{j=1}^{i-1} S_j\right)(C_i - 1) + C_1\right] - 1$$

where addr denotes said memory access address, Z represents the number of dimensions of the tensor data stored in memory, $S_j$ represents the size of dimension j, and $C_i$ represents the value of counter i.

* * * * *